United States Patent
Maimon et al.

(10) Patent No.: US 11,978,815 B2
(45) Date of Patent: May 7, 2024

(54) FLEXIBLE PHOTOVOLTAIC CELL, AND METHODS AND SYSTEMS OF PRODUCING IT

(71) Applicant: SOLARPAINT LTD., Kibbutz Nahsholim (IL)

(72) Inventors: Eran Maimon, Kibbutz Nahsholim (IL); Ramon Joseph Albalak, Haifa (IL); Oded Rozenberg, Kibbutz Nahsholim (IL); Esther Westreich, Neve Yarak (IL)

(73) Assignee: SOLARPAINT LTD., Yokneam Illit (IL)

( * ) Notice: Subject to any disclaimer, the term of this patent is extended or adjusted under 35 U.S.C. 154(b) by 89 days.

(21) Appl. No.: 17/353,867

(22) Filed: Jun. 22, 2021

(65) Prior Publication Data

US 2021/0313478 A1    Oct. 7, 2021

Related U.S. Application Data

(63) Continuation-in-part of application No. PCT/IL2019/051416, filed on Mar. 24, 2019, and a
(Continued)

(51) Int. Cl.
*H01L 31/0445* (2014.01)
*H01L 31/0224* (2006.01)
*H01L 31/18* (2006.01)

(52) U.S. Cl.
CPC .. *H01L 31/0445* (2014.12); *H01L 31/022458* (2013.01); *H01L 31/186* (2013.01)

(58) Field of Classification Search
CPC ......... H01L 31/0445; H01L 31/022458; H01L 31/186; H01L 31/022425;
(Continued)

(56) References Cited

U.S. PATENT DOCUMENTS

| 4,038,104 A | 7/1977 | Tsutomu |
| 4,053,327 A | 10/1977 | Meulenberg, Jr. |

(Continued)

FOREIGN PATENT DOCUMENTS

| CN | 101747545 A | 6/2010 |
| CN | 103268892 A | 8/2013 |

(Continued)

OTHER PUBLICATIONS

Machine Translation of WO 2013/038539 A1 Printed on Apr. 14, 2023 from "Google Patents" at: https://patents.google.com/patent/WO2013038539A1/en.
(Continued)

*Primary Examiner* — Michael Lebentritt
(74) *Attorney, Agent, or Firm* — AlphaPatent Associates Ltd.; Daniel J. Swirsky

(57) ABSTRACT

A flexible photovoltaic (PV) cell having enhanced properties of mechanical impact absorption, includes: a semiconductor wafer that is freestanding and carrier-less; having a thickness, and having a first surface, and a having second surface that is opposite to that first surface; a set of non-transcending gaps within the semiconductor wafer. Each non-transcending gap penetrates from the first surface towards the second surface but reaches to a depth of between 80 to 99 percent of the thickness of the semiconductor wafer, and does not reach said second surface. Each non-transcending gap does not entirely penetrate through an entirety of the thickness of the semiconductor wafer. The semiconductor wafer maintains at least 1 percent of the thickness of the semiconductor wafer as an intact and non-penetrated thin layer of semiconductor wafer that remains intact and non-penetrated by the non-transcending gaps. The intact and non-penetrated thin layer of semiconductor wafer absorbs and dissipates mechanical forces.

18 Claims, 27 Drawing Sheets

Related U.S. Application Data continuation-in-part of application No. 16/362,665, filed on Mar. 24, 2019, now Pat. No. 11,081,606, said application No. PCT/IL2019/051416 is a continuation-in-part of application No. 16/362,665, filed on Mar. 24, 2019, now Pat. No. 11,081,606.

(60) Provisional application No. 62/785,282, filed on Dec. 27, 2018.

(58) Field of Classification Search
CPC ......... H01L 31/035281; H01L 31/0504; H01L 31/0543; H01L 31/1804; H01L 31/18; Y02E 10/52; Y02E 10/547; Y02P 70/50
See application file for complete search history.

(56) References Cited

U.S. PATENT DOCUMENTS

| | | | |
|---|---|---|---|
| RE30,541 E | | 3/1981 | Larson |
| 4,352,948 A | * | 10/1982 | Kaplow .......... H01L 31/035281 136/246 |
| 5,800,631 A | * | 9/1998 | Yamada ............ H01L 31/02013 156/289 |
| 6,127,622 A | | 10/2000 | Yamada |
| 6,695,903 B1 | | 2/2004 | Kübelbeck |
| 7,022,910 B2 | | 4/2006 | Gaudiana |
| 8,440,906 B2 | | 5/2013 | Alivisatos |
| 8,664,519 B2 | | 3/2014 | De Ceuster |
| 9,263,615 B2 | * | 2/2016 | Hwang ............... H01L 31/0521 |
| 9,349,888 B2 | | 5/2016 | Konstantatos |
| 9,887,087 B1 | | 2/2018 | Fuller |
| 9,893,677 B1 | | 2/2018 | Liu |
| 9,991,407 B1 | | 6/2018 | Dutta |
| 11,081,606 B2 | | 8/2021 | Maimon |
| 2004/0187911 A1 | | 9/2004 | Gaudiana |
| 2005/0172996 A1 | | 8/2005 | Hacke |
| 2006/0043372 A1 | | 3/2006 | Qiu |
| 2006/0097361 A1 | | 5/2006 | Tanaka |
| 2007/0199588 A1 | | 8/2007 | Rubin |
| 2007/0251570 A1 | | 11/2007 | Eckert |
| 2007/0283999 A1 | * | 12/2007 | Yekutiely ............... H01L 31/042 136/259 |
| 2008/0047601 A1 | | 2/2008 | Nag |
| 2008/0092945 A1 | | 4/2008 | Munteanu |
| 2008/0276983 A1 | | 11/2008 | Drake |
| 2008/0302408 A1 | | 12/2008 | Bressler |
| 2009/0056791 A1 | | 3/2009 | Pfenninger |
| 2009/0111206 A1 | | 4/2009 | Luch |
| 2009/0217973 A1 | | 9/2009 | Alivisatos |
| 2009/0255467 A1 | | 10/2009 | Britt |
| 2010/0031997 A1 | | 2/2010 | Basol |
| 2010/0051085 A1 | | 3/2010 | Weidman |
| 2010/0229923 A1 | | 9/2010 | Frolov |
| 2010/0229931 A1 | | 9/2010 | Reddy |
| 2010/0266856 A1 | | 10/2010 | White |
| 2010/0294331 A1 | | 11/2010 | Carnation |
| 2010/0313955 A1 | | 12/2010 | Buelow, II |
| 2011/0024935 A1 | | 2/2011 | Ito |
| 2011/0100451 A1 | | 5/2011 | Krause |
| 2011/0155217 A1 | | 6/2011 | Yang |
| 2011/0183540 A1 | | 7/2011 | Keenihan |
| 2011/0186112 A1 | | 8/2011 | Aernouts |
| 2011/0214721 A1 | | 9/2011 | Mughal |
| 2011/0239450 A1 | | 10/2011 | Basol |
| 2011/0247859 A1 | | 10/2011 | Zagdoun |
| 2011/0277813 A1 | | 11/2011 | Rogers |
| 2011/0303262 A1 | | 12/2011 | Wolter |
| 2011/0308604 A1 | | 12/2011 | Gaudiana |
| 2012/0061247 A1 | | 3/2012 | Ahmed |
| 2012/0151856 A1 | | 6/2012 | Azoulay |
| 2012/0240995 A1 | | 9/2012 | Coakley |
| 2012/0312358 A1 | | 12/2012 | Yamashita |
| 2013/0025647 A1 | | 1/2013 | Bouten |
| 2013/0037109 A1 | | 2/2013 | Park |
| 2013/0240009 A1 | | 9/2013 | Zhang |
| 2013/0263918 A1 | | 10/2013 | Konstantatos |
| 2014/0099750 A1 | | 4/2014 | Britt |
| 2014/0167677 A1 | | 6/2014 | Voelkner |
| 2014/0230878 A1 | | 8/2014 | Schulte-Huxel |
| 2014/0283898 A1 | | 9/2014 | Pilat |
| 2014/0352777 A1 | | 12/2014 | Hachtmann |
| 2015/0040976 A1 | | 2/2015 | Agarkar |
| 2015/0053265 A1 | | 2/2015 | Gaume |
| 2015/0068592 A1 | | 3/2015 | Kommera |
| 2015/0068594 A1 | | 3/2015 | Nishiyama |
| 2015/0179848 A1 | | 6/2015 | Korman |
| 2015/0280028 A1 | | 10/2015 | Harley |
| 2016/0035911 A1 | | 2/2016 | Barruel |
| 2016/0059537 A1 | | 3/2016 | Ito |
| 2016/0093757 A1 | | 3/2016 | Pass |
| 2016/0247959 A1 | | 8/2016 | Wiedeman |
| 2016/0284909 A1 | | 9/2016 | Harley |
| 2016/0308155 A1 | | 10/2016 | Maimon |
| 2016/0351343 A1 | | 12/2016 | Lindström |
| 2017/0084769 A1 | * | 3/2017 | Lee ...................... H01L 31/1892 |
| 2017/0236953 A1 | * | 8/2017 | Dutta .................. H01L 31/0547 136/256 |
| 2017/0250299 A1 | | 8/2017 | Arrizabalaga Canellada |
| 2017/0279002 A1 | | 9/2017 | Julian |
| 2017/0330993 A1 | | 11/2017 | Sewell |
| 2018/0034408 A1 | | 2/2018 | Julian |
| 2018/0151303 A1 | | 5/2018 | Maimon |
| 2018/0286993 A1 | | 10/2018 | Maimon |
| 2019/0081592 A1 | | 3/2019 | Oldridge |
| 2019/0319148 A1 | | 10/2019 | Zhu |
| 2020/0212238 A1 | | 7/2020 | Maimon |
| 2021/0083618 A1 | | 3/2021 | Lalane |
| 2021/0313478 A1 | | 10/2021 | Maimon |
| 2022/0278245 A1 | | 9/2022 | Baudrit |
| 2022/0311373 A1 | | 9/2022 | Hillel |
| 2023/0006082 A1 | | 1/2023 | Maimon |
| 2023/0261126 A1 | * | 8/2023 | Maimon .................. H01L 31/18 136/249 |

FOREIGN PATENT DOCUMENTS

| | | | |
|---|---|---|---|
| CN | 106877795 A | | 6/2017 |
| CN | 109659382 A | | 4/2019 |
| DE | 2723620 | * | 12/1977 |
| EP | 2479802 A1 | | 7/2012 |
| EP | 2790196 A1 | | 10/2014 |
| EP | 2804232 A1 | | 11/2014 |
| EP | 3078067 B1 | | 2/2020 |
| EP | 3712964 A1 | | 9/2020 |
| EP | 3308413 B1 | | 11/2021 |
| JP | 4187681 B2 | * | 11/2008 ............... G02B 6/43 |
| WO | 2004/086462 A2 | | 10/2004 |
| WO | 2010/025269 A1 | | 3/2010 |
| WO | 2013/038539 A1 | | 3/2013 |
| WO | 2013/111160 A1 | | 8/2013 |
| WO | 2013/130448 A1 | | 9/2013 |
| WO | 2015/083175 A2 | | 6/2015 |
| WO | 2016/199118 A1 | | 12/2016 |
| WO | 2017/056082 A1 | | 4/2017 |
| WO | 2017/093540 A1 | | 6/2017 |
| WO | 2017/186120 A2 | | 11/2017 |
| WO | 2018/022655 A1 | | 2/2018 |
| WO | 2018/104943 A1 | | 6/2018 |
| WO | 2019/077604 A1 | | 4/2019 |
| WO | 2019/116375 A1 | | 6/2019 |
| WO | 2020/136653 A1 | | 7/2020 |
| WO | 2021/171298 A1 | | 9/2021 |
| WO | 2022/074651 A1 | | 4/2022 |
| WO | 2022/091088 A1 | | 5/2022 |
| WO | 2022/208498 A1 | | 10/2022 |
| WO | 2023/021515 A1 | | 2/2023 |
| WO | 2023/031916 A1 | | 3/2023 |
| WO | 2023/031919 A1 | | 3/2023 |

(56) References Cited

FOREIGN PATENT DOCUMENTS

| | | |
|---|---|---|
| WO | 2023/042205 A1 | 3/2023 |
| WO | 2023/073714 A1 | 5/2023 |

OTHER PUBLICATIONS

Machine Translation of CN 103268892 A Printed on Apr. 14, 2023 from "Google Patents" at: https://patents.google.com/patent/CN103268892A/en.

David Martineau, "Dye solar cells for real—The assembly guide for making your own solar cells", dated Apr. 3, 2012; Retrieved from the Internet on Apr. 14, 2023 from: www.solaronix.com/documents/dye_solar_cells_for_real.pdf.

Solarnix Materials, "Innovative solutions for solar professionals", Retrieved from the Internet on Apr. 14, 2023 from: https://www.solaronix.com/documents/solaronix_materials.pdf.

Minwoo Nam et al., "Efficiency enhancement in organic solar cells by configuring hybrid interfaces with narrow bandgap PbSSe nanocrystals", Organic Electronics 13 (2022), pp. 1546-1552.

Jayasundera Bandara et al., "Solid-state dye-sensitized solar cell with p-type NiO as a hole collector", Solar Energy Materials & Solar Cells 85 (2005), pp. 385-390.

Hui-Seon Kim et al., "High Efficiency Solid-State Sensitized Solar Cell-Based on Submicrometer Rutile $TiO_2$ Nanorod and $CH_3$—$NH_3$—$PbI_3$ Perovskite Sensitizer", Nano Letters (2013), vol. 13, pp. 2412-2417, dated May 14, 2013.

Kazuharu Suzuki et al., "Application of Carbon Nanotubes to Counter Electrodes of Dye-sensitized Solar Cells", Chemistry Letters, Chemical Society of Japan, vol. 32, Issue 1, pp. 28-29, Jan. 2003.

Wouter Woestenborghs et al., "Analysis of a transparent organic photoconductive sensor", Organic Electronics 13 (2012), pp. 2250-2256.

Ara Cho et al., "Carbon layer reduction via a hybrid ink of binary nanoparticles in non-vacuum-processed $CuInSe_2$ thin films", Solar Energy Materials & Solar Cells, 2013, vol. 110, pp. 126-132.

Matthew J. Carnie et al., "A one-step low temperature processing route for organolead halide perovskite solar cells", Chemical Communications, 2013, vol. 49, issue 72.

Pablo P. Boix et al., "Perovskite Solar Cells: Beyond Methylammonium Lead Iodide", Journal of Physical Chemistry Letters, 2015, vol. 6, issue 5, pp. 898-907.

Machine Translation of WO 2017/093540 A1 Printed on Apr. 14, 2023 from "Google Patents" at: https://patents.google.com/patent/WO2017093540A1/en.

Machine Translation of WO 2017/186120 A2 Printed on Apr. 14, 2023 from "Google Patents" at: https://patents.google.com/patent/WO2017186120A2/en.

Machine Translation of EP 2790196 A1 Printed from "Google Patents" on Apr. 14, 2023 at: https://patents.google.com/patent/EP2790196A1/en.

Machine Translation of CN 109659382 A Printed from "Google Patents" on Apr. 14, 2023 at: https://patents.google.com/patent/CN109659382A/en.

Machine Translation of CN 106877795 A Printed from "Google Patents" on Apr. 14, 2023 at: https://patents.google.com/patent/CN106877795A/en.

Machine Translation of CN 101747545 A Printed from "Google Patents" on Apr. 14, 2023 at: https://patents.google.com/patent/CN101747545A/en.

Dajing Chen et al., "Liquid-phase tuning of porous PVDF-TrFE film on flexible substrate for energy harvesting", Applied Physics Letters, vol. 110, pp. 153902 to 153902-5; Apr. 2017.

Andrew Lippman et al., "Solar Micro-Mining on the Bitcoin Blockchain", dated Mar. 9, 2016; printed from: https://viral.media.mit.edu/pub/solarcoin/release/1.

Pasquale Giungato et al., "Current Trends in Sustainability of Bitcoins and Related Blockchain Technology", Sustainability 2017, vol. 9, 2214. Published on Nov. 30, 2017. Available at: https://www.mdpi.com/2071-1050/9/12/2214.

Inigo Goiri et al., "GreenSlot: Scheduling Energy Consumption in Green Datacenters", SC '11: Proceedings of 2011 International Conference for High Performance Computing, Networking, Storage and Analysis; Nov. 2011.

Hyeon-Gyun Im et al., "Hybrid crystalline-ITO / metal nanowire mesh transparent electrodes and their application for highly flexible perovskite solar cells", NPG Asia Materials (2016), vol. 8, e282; dated Jun. 2016.

Kong Lio et al., "Wrinkled substrate and Indium Tin Oxide-free transparent electrode making organic solar cells thinner in active layer", Journal of Power Sources, vol. 331, Nov. 2016, pp. 43-49.

Van-Tien Bui et al., "Transferable thin films with sponge-like porous structure via improved phase separation", Polymer, vol. 101, pp. 184-191, Sep. 28, 2016.

International search report in PCT/IL2023/050068, dated Jun. 1, 2023.

Written Opinion of the International Searching Authority in PCT/IL2023/050068, dated Jun. 1, 2023.

Letter from the Korean Intellectual Property Office (KIPO) in Korean patent application No. 10-2021-7023899; dated May 16, 2023.

English translation of letter from the Korean Intellectual Property Office (KIPO) in Korean patent application No. 10-2021-7023899; dated May 16, 2023.

Written Opinion of the International Searching Authority in PCT/IL2014/051069, mailed on Jun. 15, 2015.

Written Opinion of the International Searching Authority in PCT/IL2015/050588, mailed on Feb. 22, 2016.

Written Opinion of the International Searching Authority in PCT/IL2017/051322, mailed on Mar. 14, 2018.

Written Opinion of the International Searching Authority in PCT/IL2018/051108, mailed on Jan. 28, 2019.

Written Opinion of the International Searching Authority in PCT/IL2018/051362, mailed on Feb. 21, 2019.

Written Opinion of the International Searching Authority in PCT/IL2019/051416, mailed on May 5, 2020.

Written Opinion of the International Searching Authority in PCT/IL2021/051269, mailed on Jan. 12, 2022.

Written Opinion of the International Searching Authority in PCT/IL2021/051202, mailed on Apr. 14, 2022.

Written Opinion of the International Searching Authority in PCT/IL2022/050030, mailed on Jul. 10, 2022.

Written Opinion of the International Searching Authority in PCT/IL2022/050339, mailed on Jul. 24, 2022.

Written Opinion of the International Searching Authority in PCT/IL2022/050899, mailed on Nov. 20, 2022.

Written Opinion of the International Searching Authority in PCT/IL2022/050934, mailed on Dec. 7, 2022.

Written Opinion of the International Searching Authority in PCT/IL2022/050998, mailed on Jan. 4, 2023.

Written Opinion of the International Searching Authority in PCT/IL2016/050576, mailed on Oct. 11, 2016.

Written Opinion of the International Searching Authority in PCT/IL2021/050217, mailed on Jun. 22, 2021.

Written Opinion of the International Searching Authority in PCT/IL2022/050941, mailed on Feb. 2, 2023.

International Search Report in PCT/IL2014/051069, mailed on Jun. 15, 2015.

International Search Report in PCT/IL2015/050588, mailed on Feb. 23, 2016.

International Search Report in PCT/IL2017/051322, mailed on Mar. 14, 2018.

International Search Report in PCT/IL2018/051108, mailed on Jan. 28, 2019.

International Search Report in PCT/IL2018/051362, mailed on Feb. 21, 2019.

International Search Report in PCT/IL2019/051416, mailed on May 5, 2020.

International Search Report in PCT/IL2021/051269, mailed on Jan. 10, 2022.

International Search Report in PCT/IL2021/051202, mailed on Apr. 13, 2022.

(56) References Cited

OTHER PUBLICATIONS

International Search Report in PCT/IL2022/050030, mailed on Jul. 10, 2022.
International Search Report in PCT/IL2022/050339, mailed on Jul. 24, 2022.
International Search Report in PCT/IL2022/050899, mailed on Nov. 20, 2022.
International Search Report in PCT/IL2022/050934, mailed on Dec. 7, 2022.
International Search Report in PCT/IL2022/050998, mailed on Jan. 4, 2023.
International Search Report in PCT/IL2016/050576, mailed on Oct. 11, 2016.
International Search Report in PCT/IL2021/050217, mailed on Jun. 22, 2021.
International Search Report in PCT/IL2022/050941, mailed on Feb. 2, 2023.
First Office Action in patent application CN 201980092220.2 Dated: Feb. 16, 2022; Accompanied by Machine Translation produced by "Google Translate".
Second Office Action in patent application CN 201980092220.2 Dated: Aug. 31, 2022; Accompanied by Machine Translation produced by "Google Translate".
Third Office Action in patent application CN 201980092220.2 Dated: Mar. 26, 2023; Accompanied by Machine Translation produced by "Google Translate".

* cited by examiner

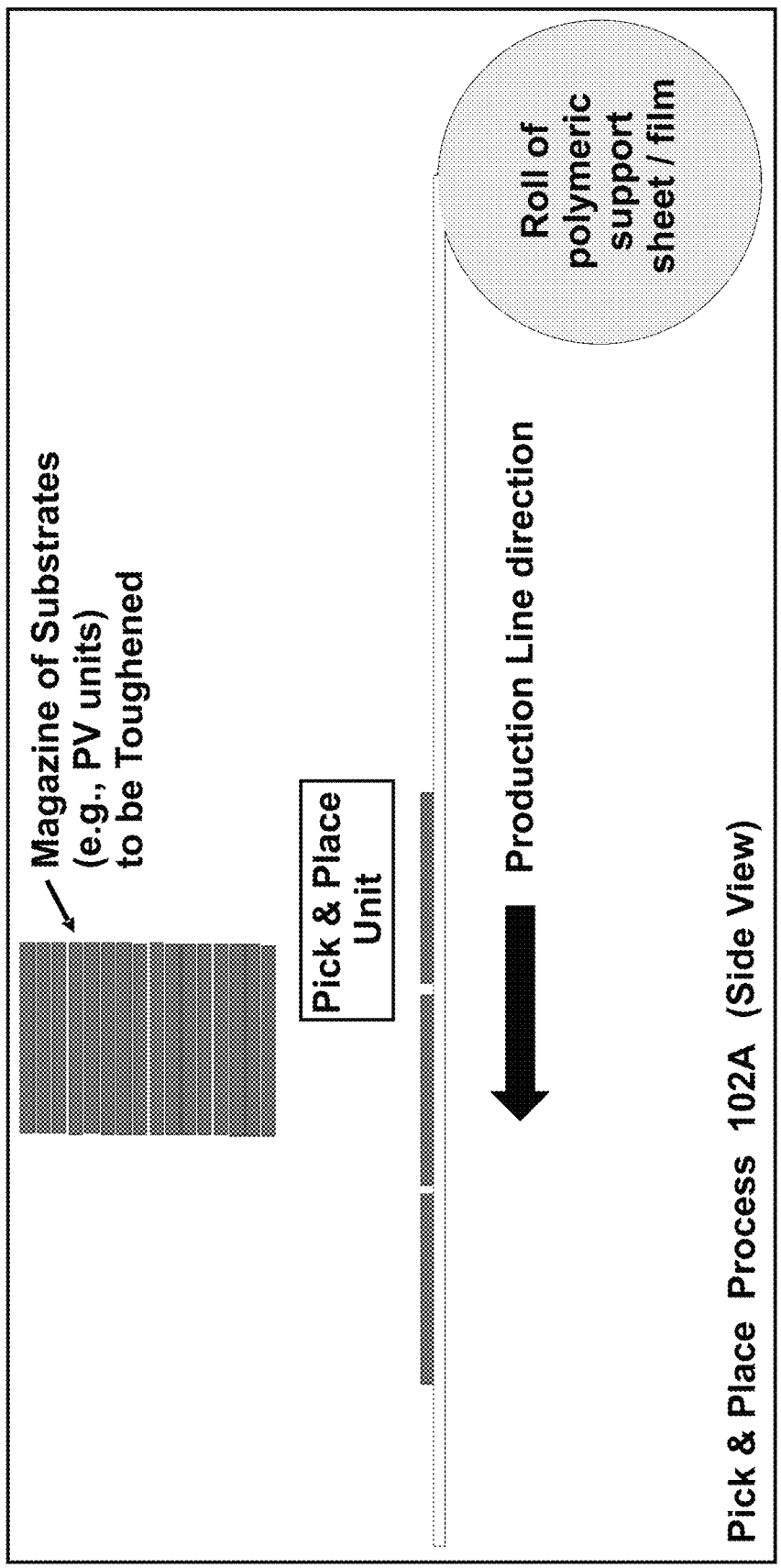

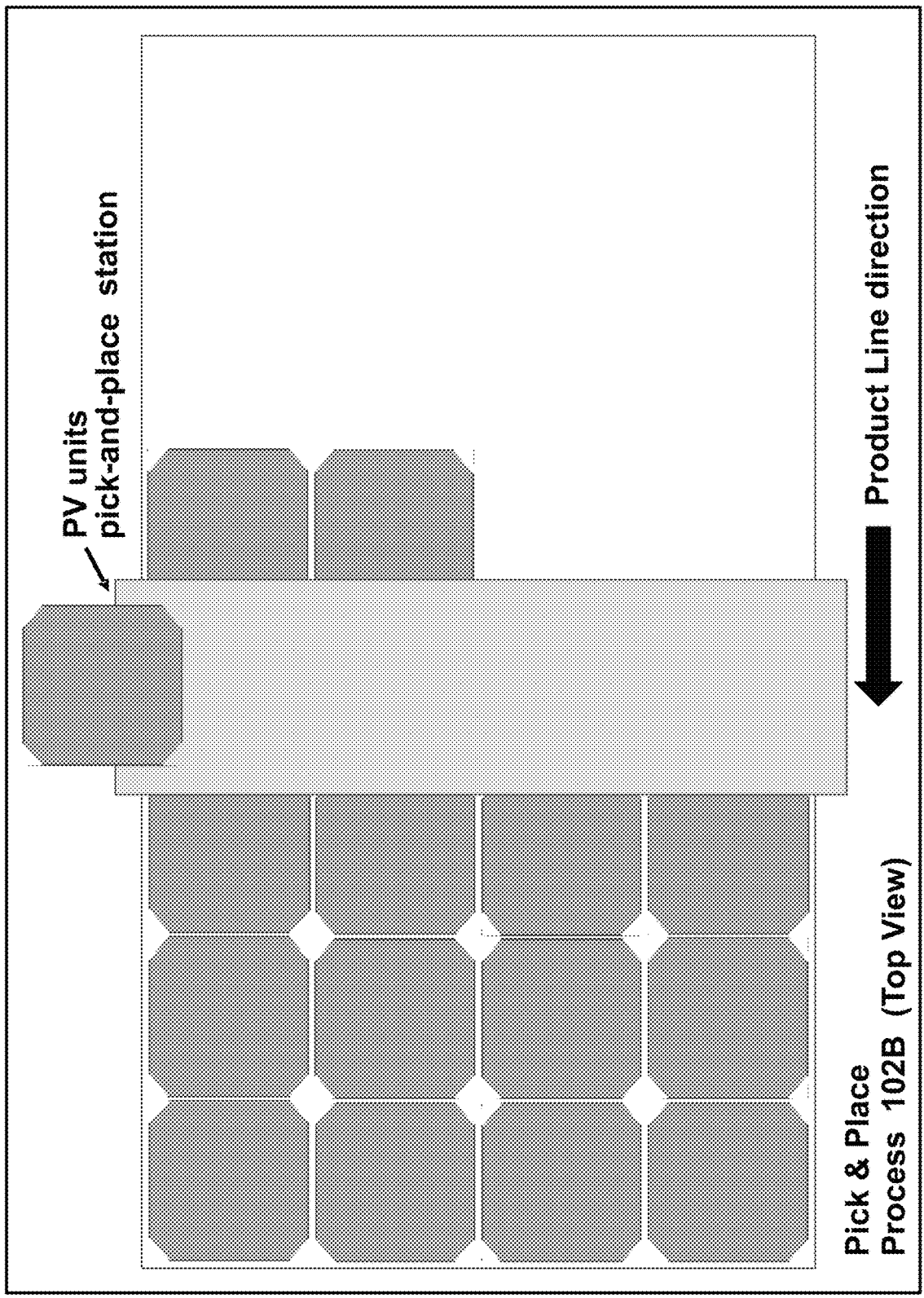

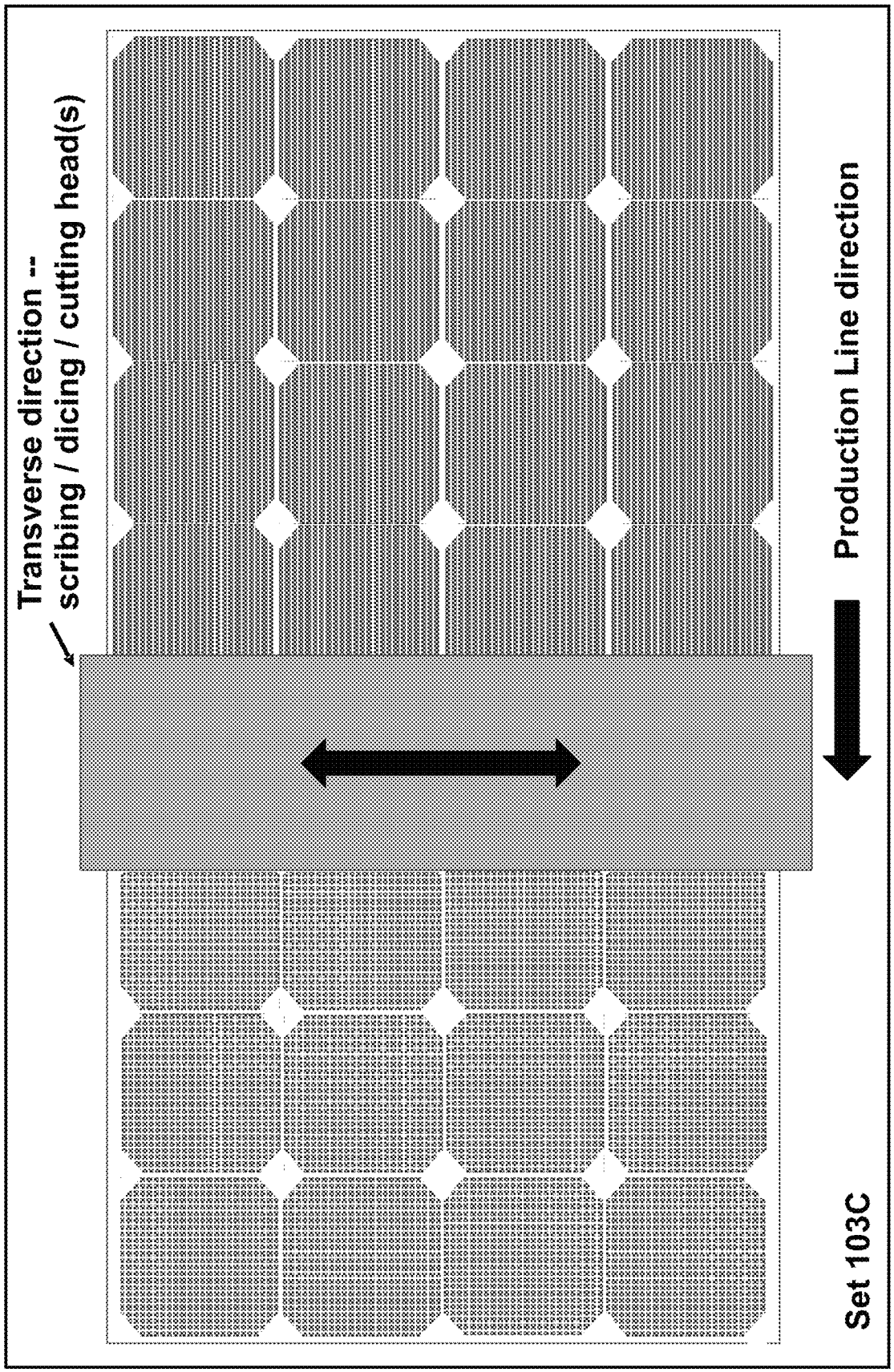

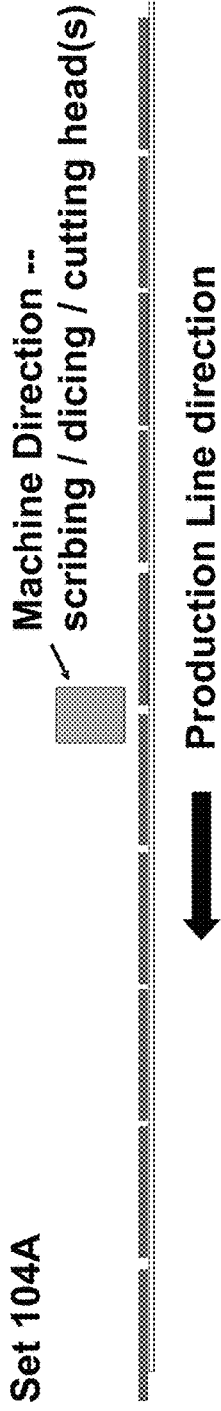
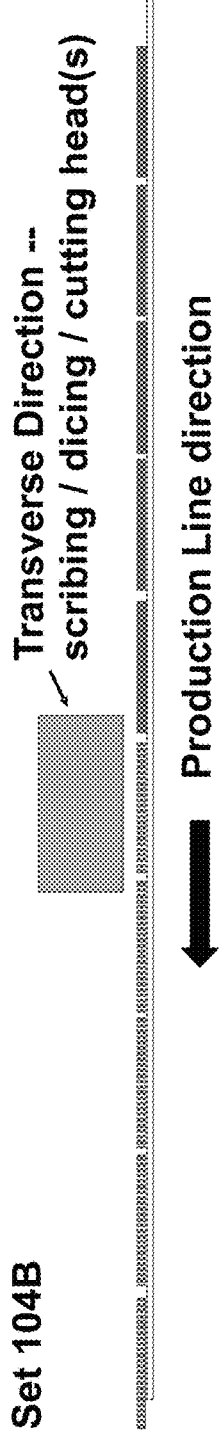
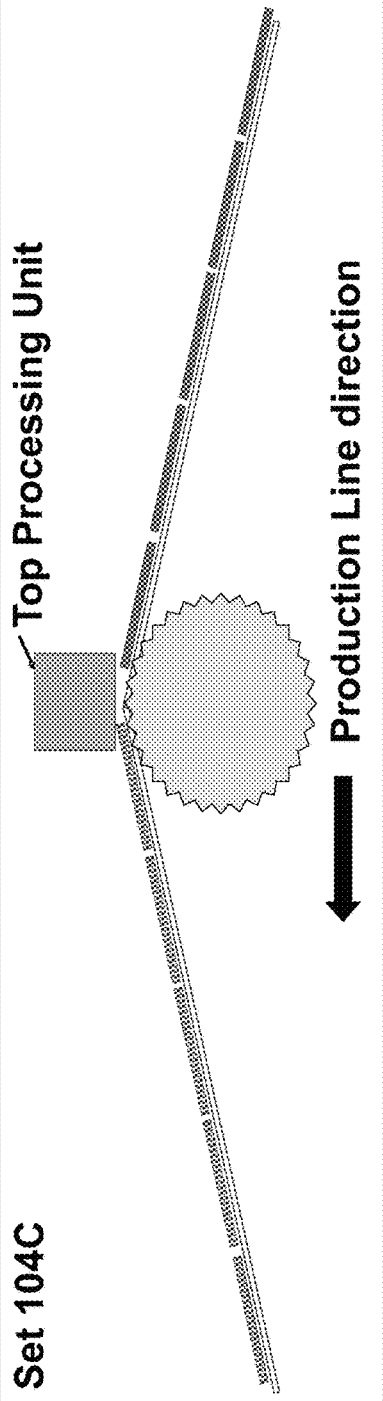
Fig. 4A
Fig. 4B
Fig. 4C

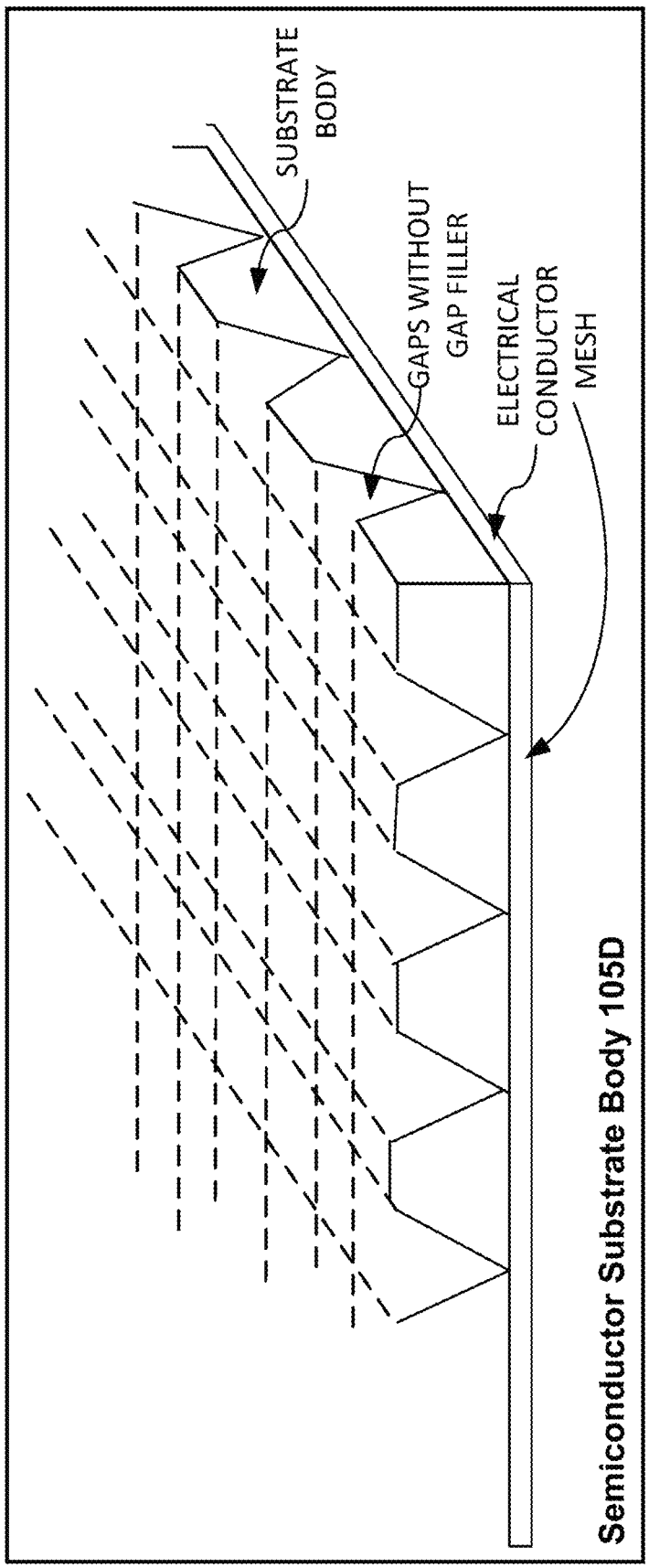

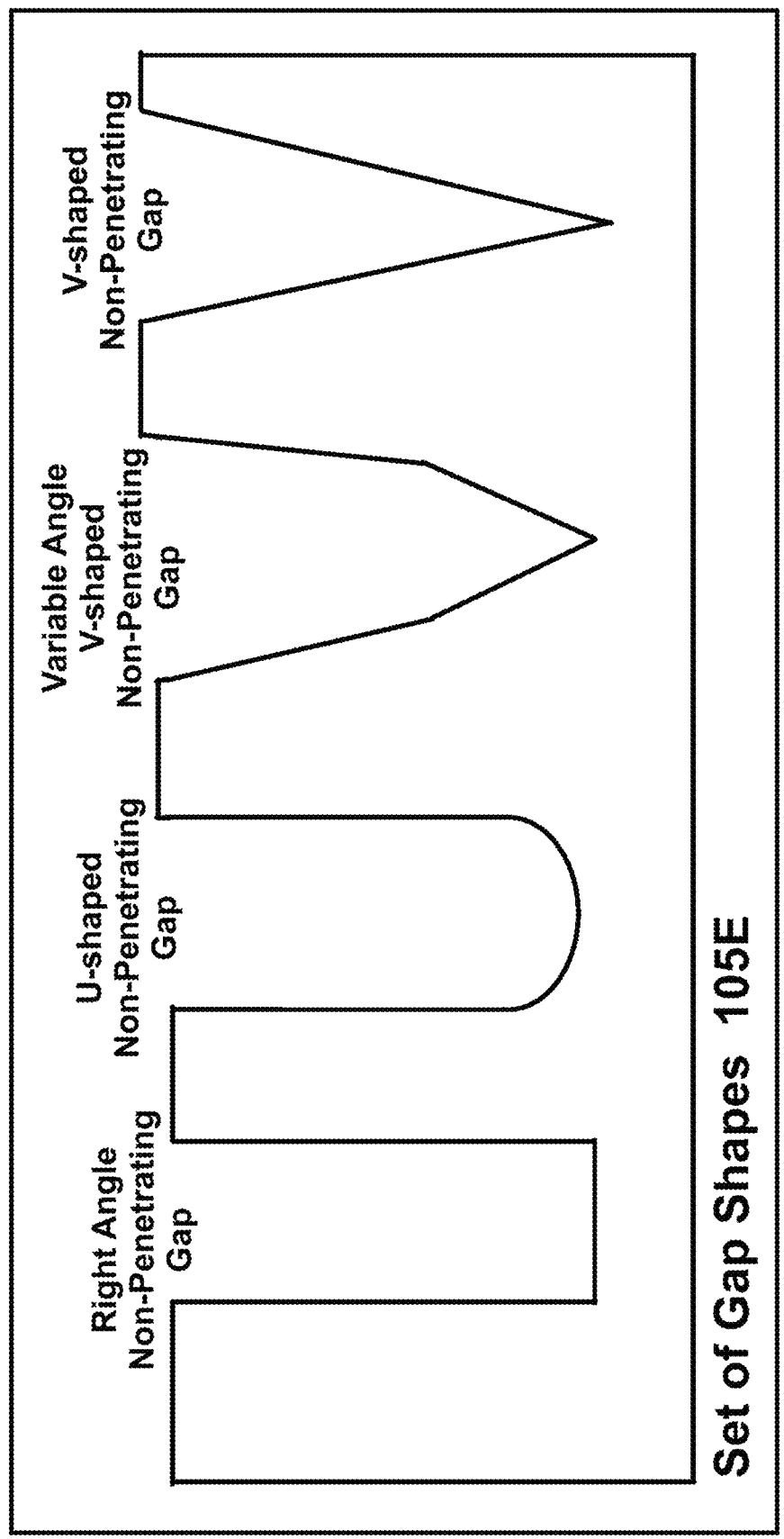

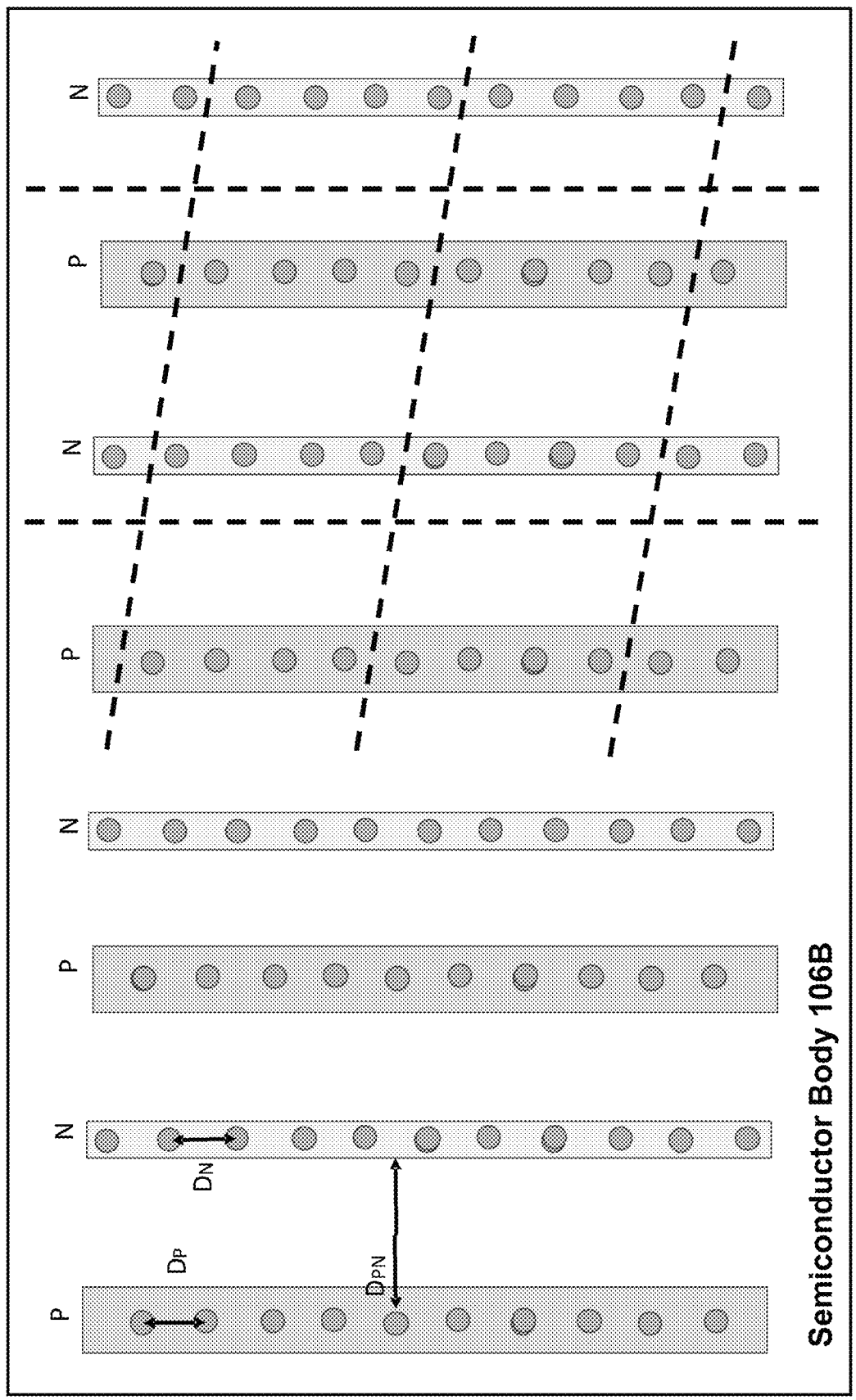

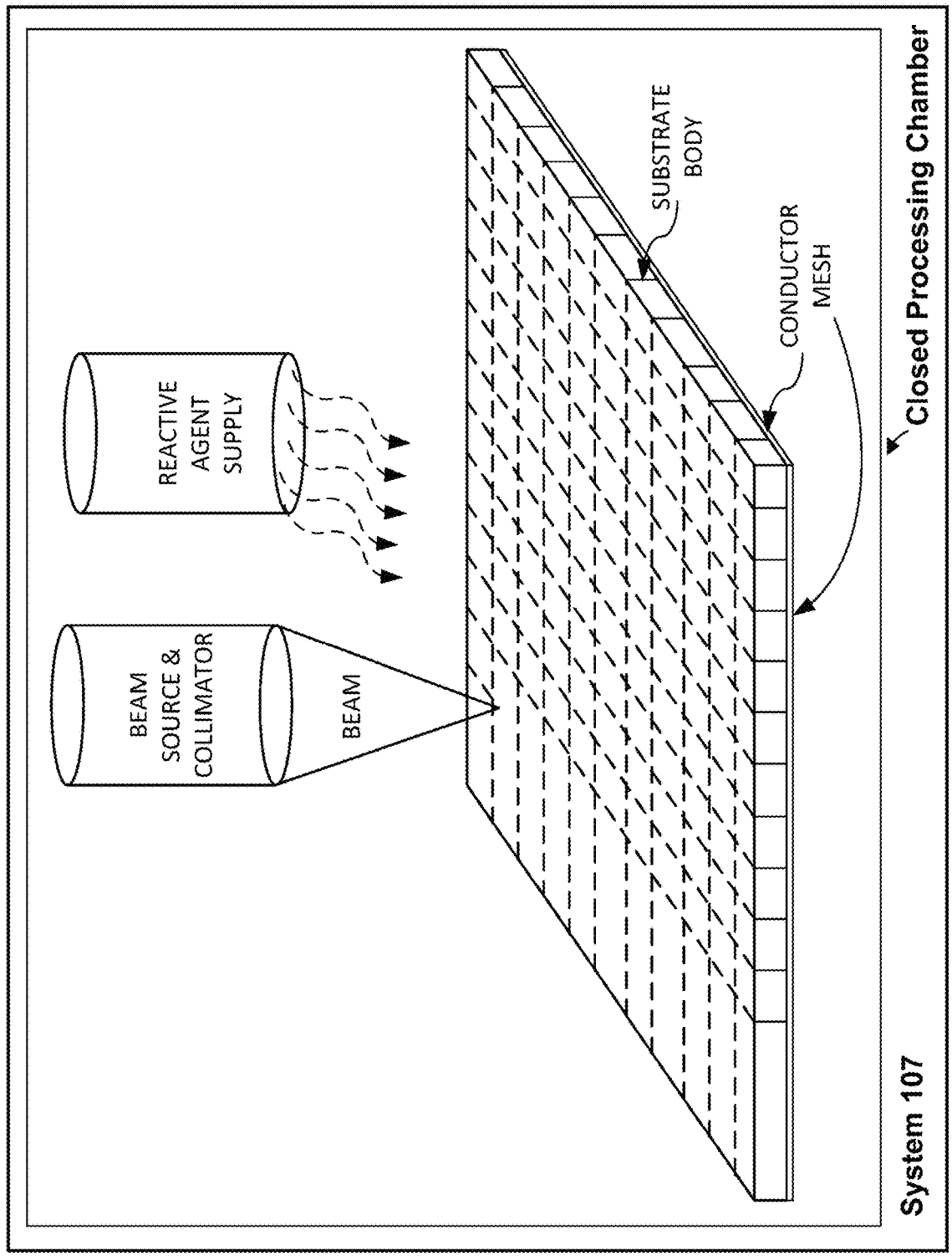

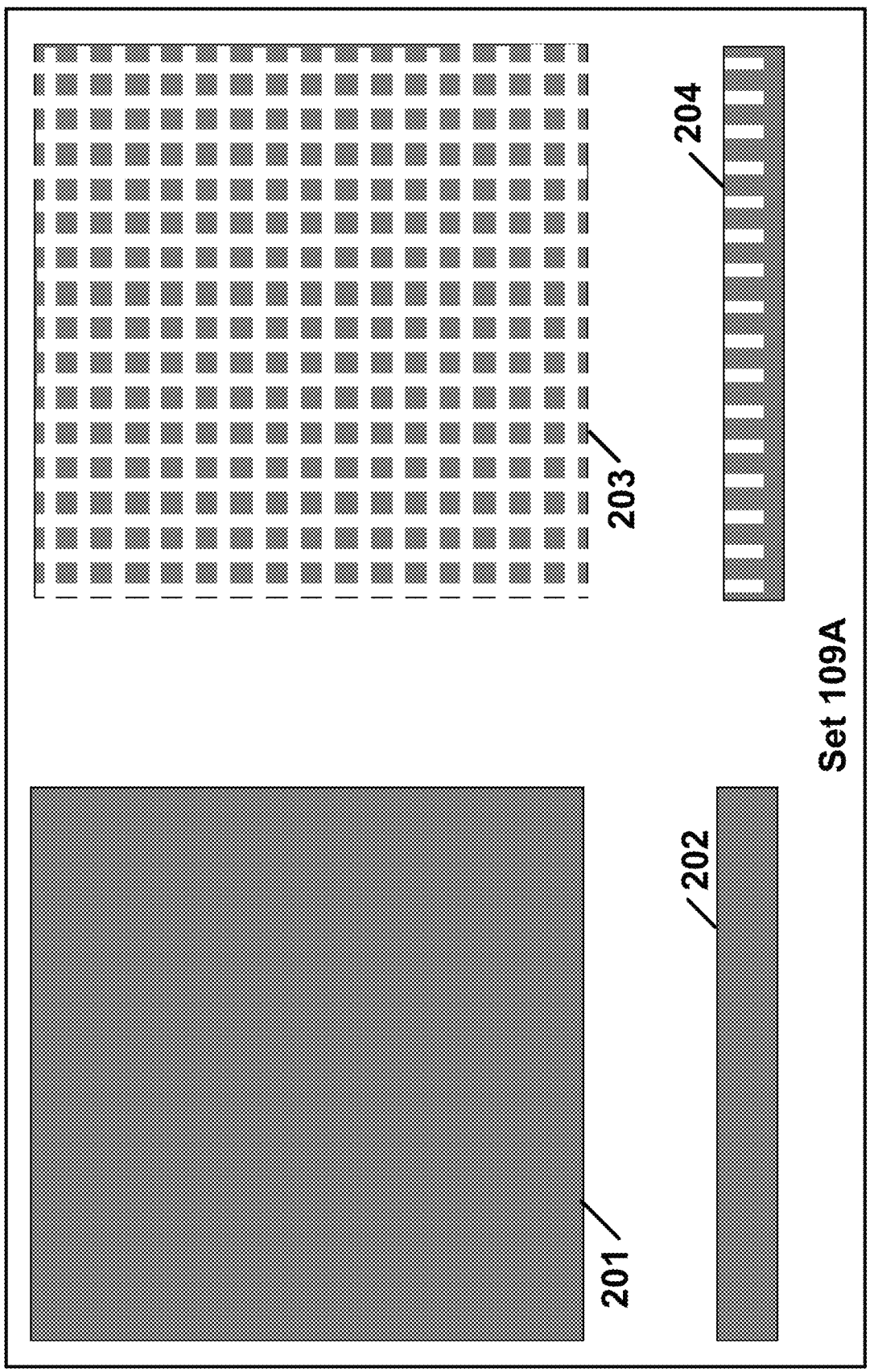

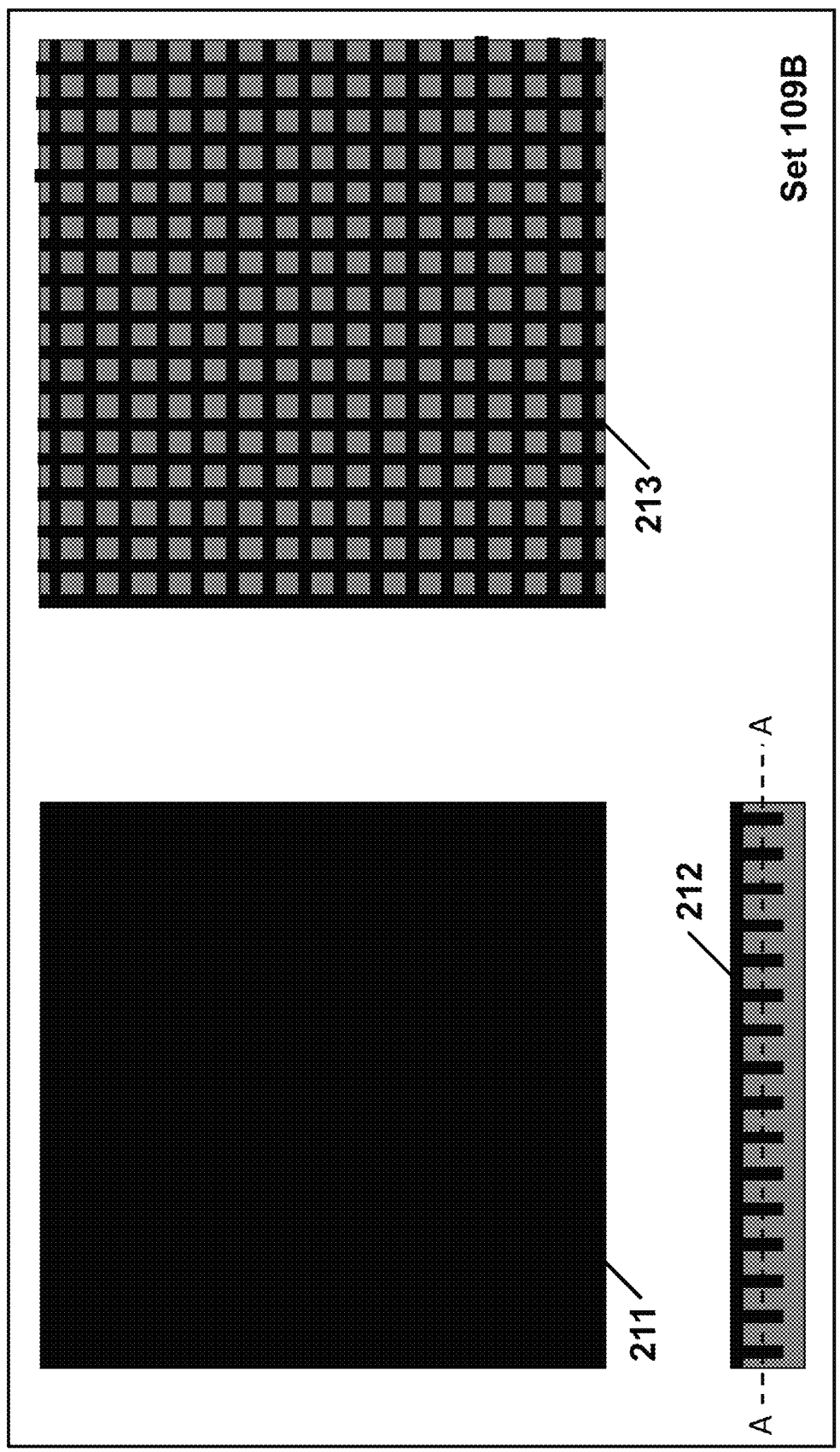

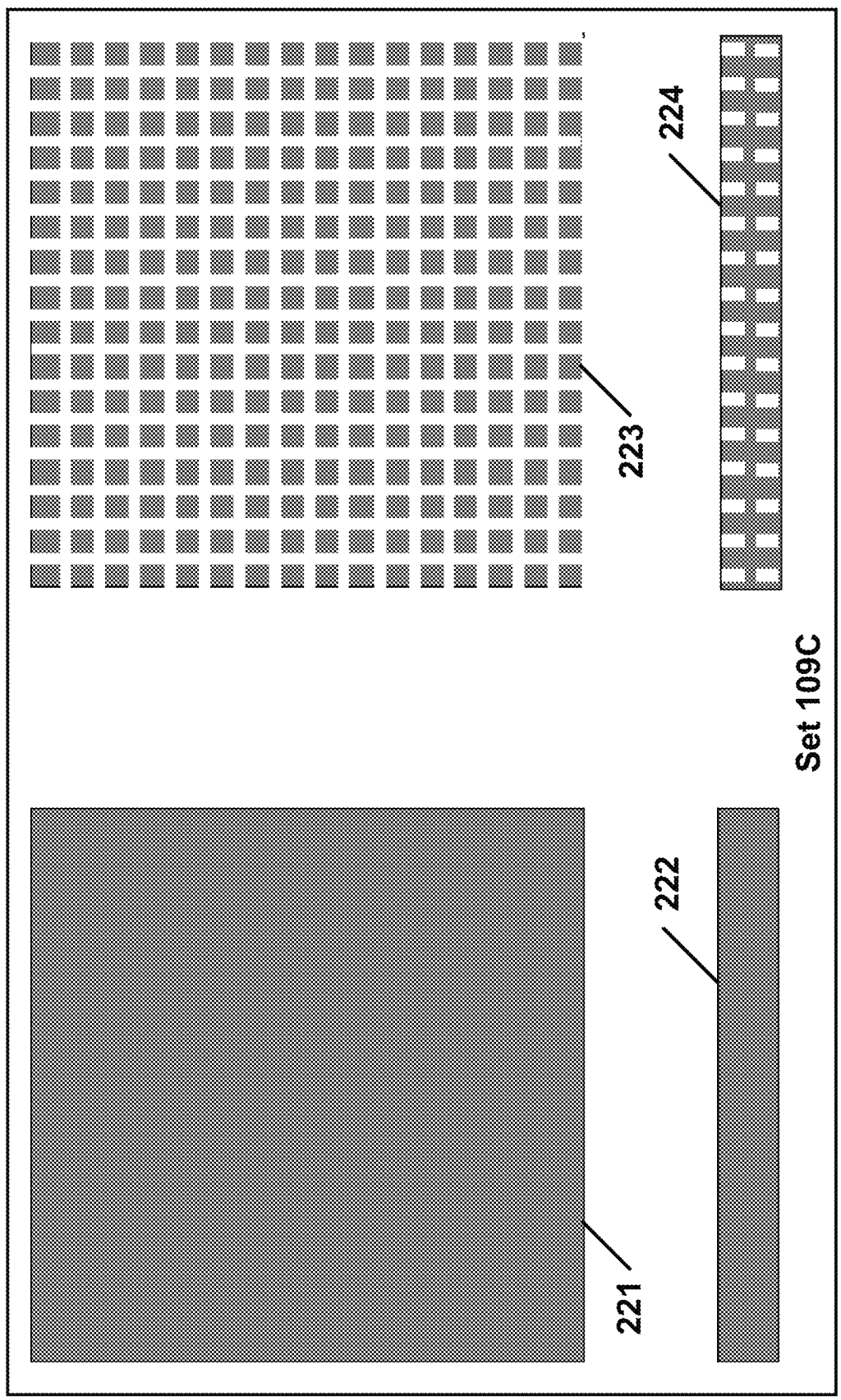

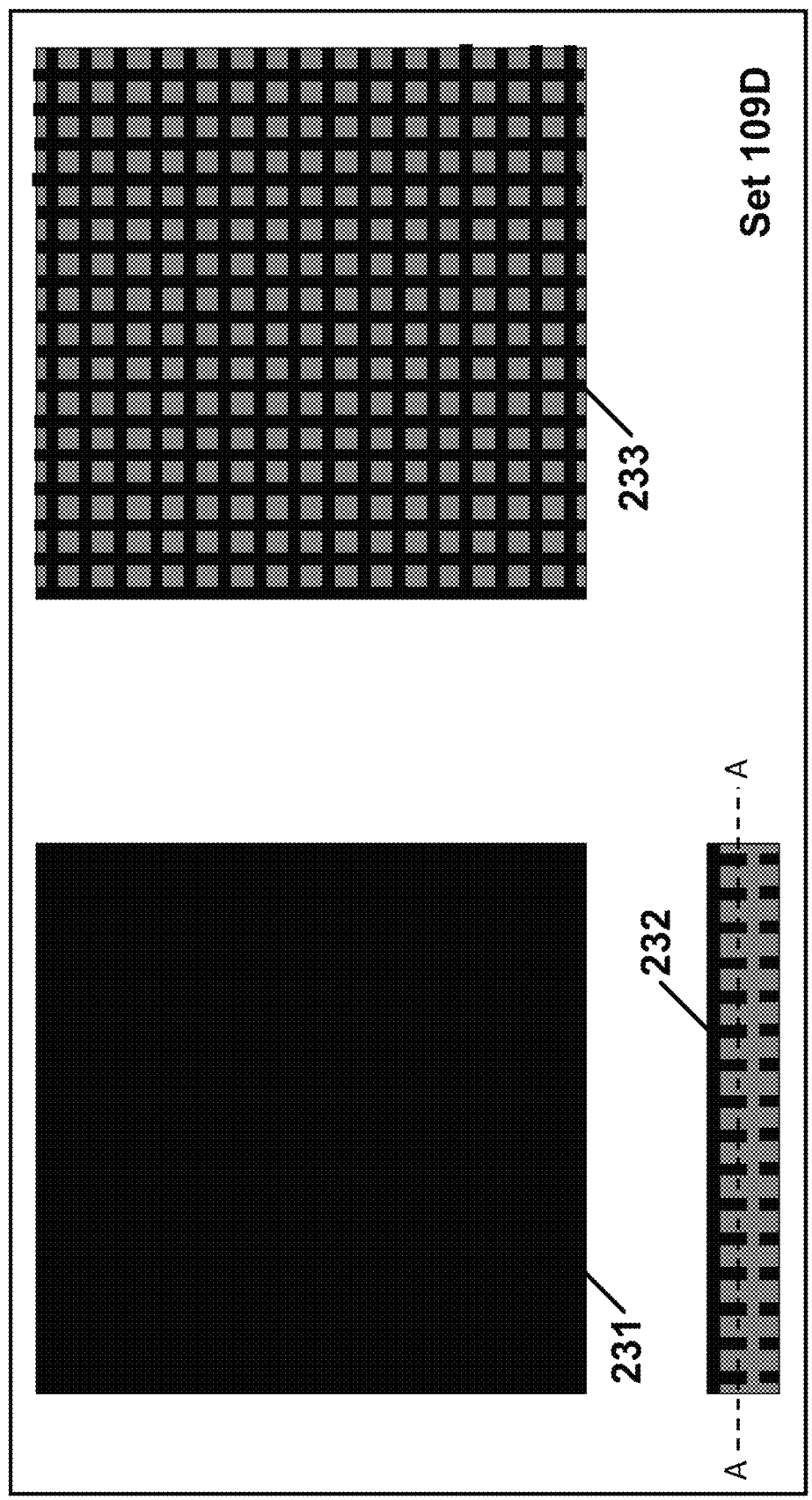

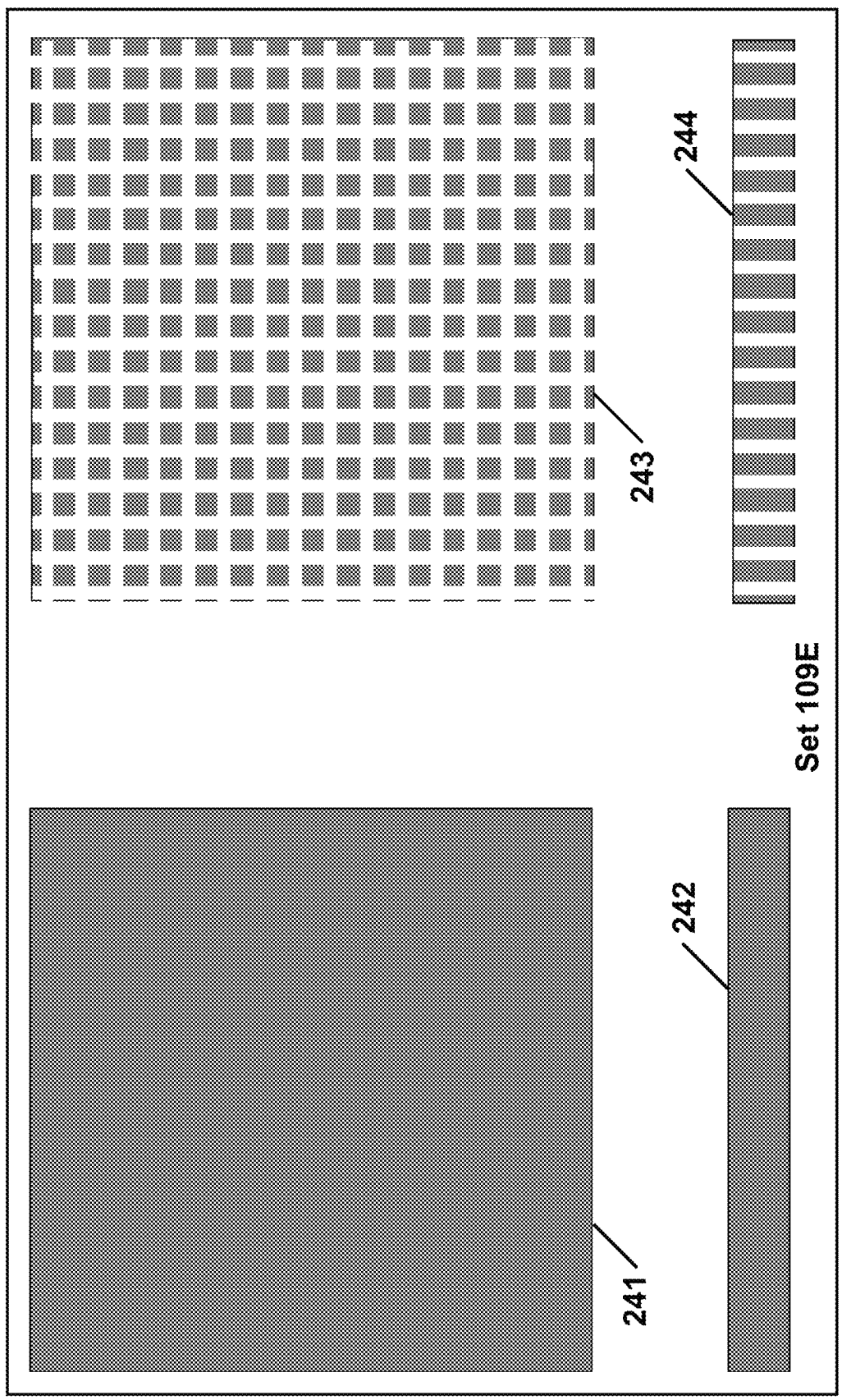

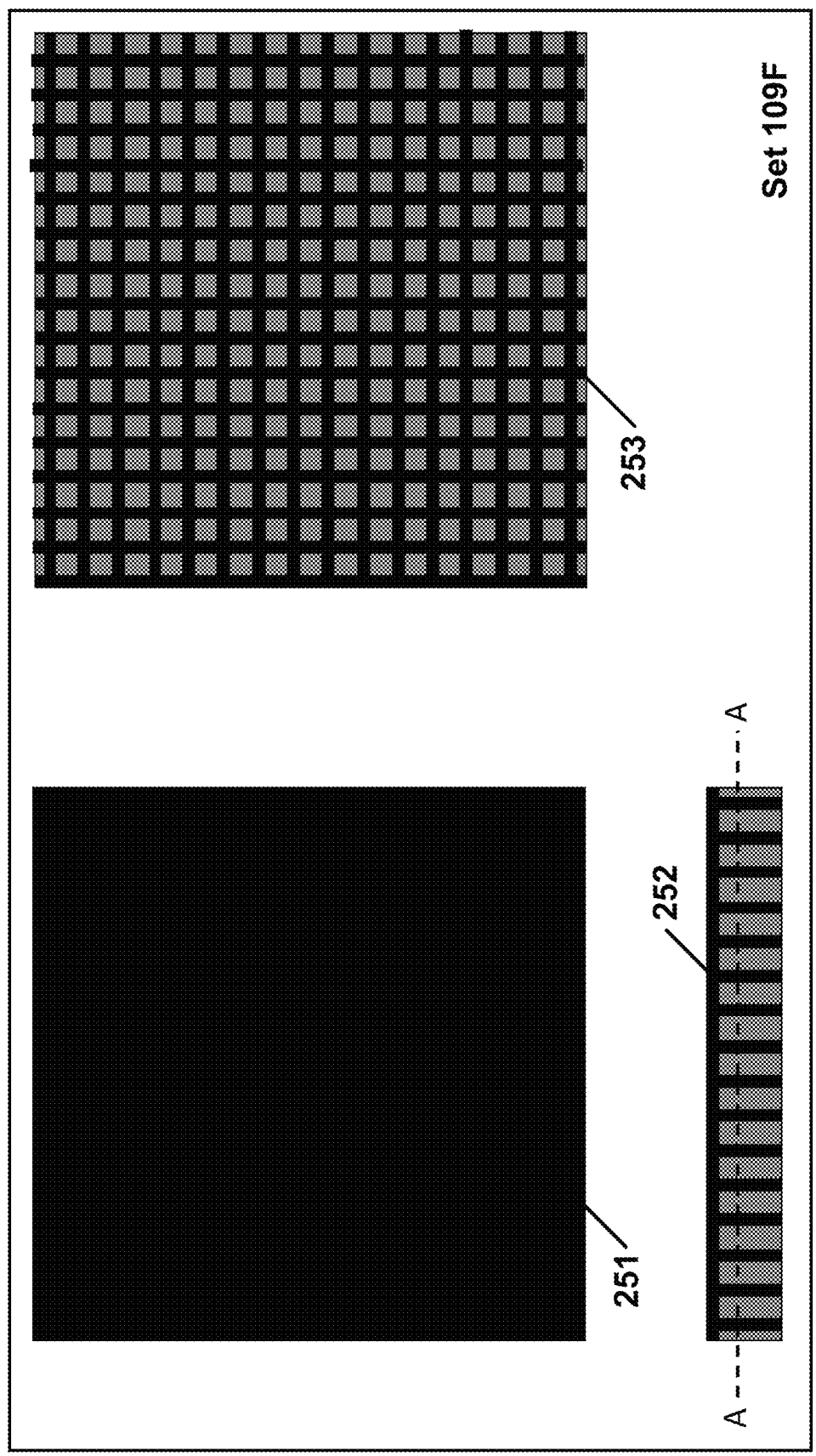

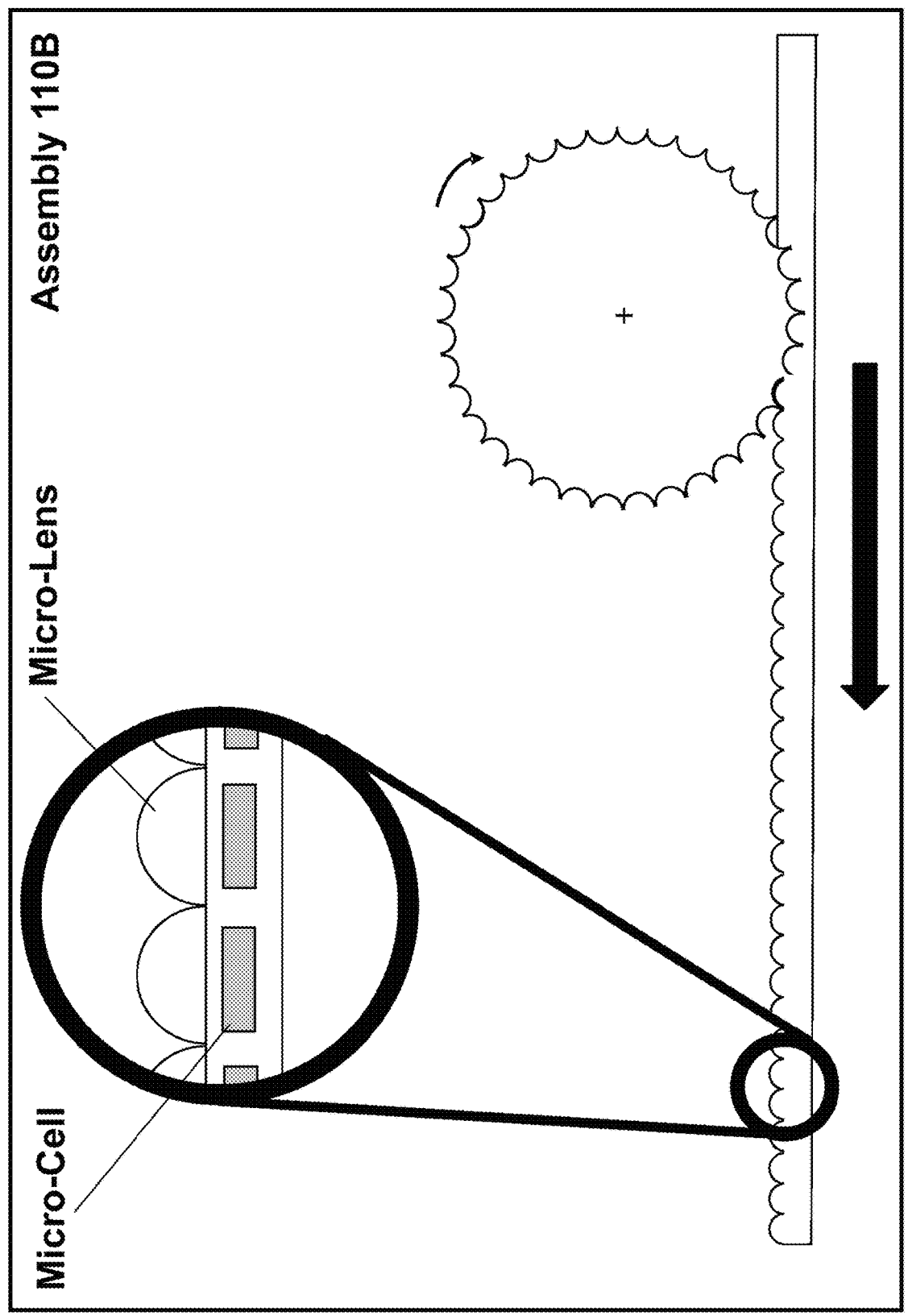

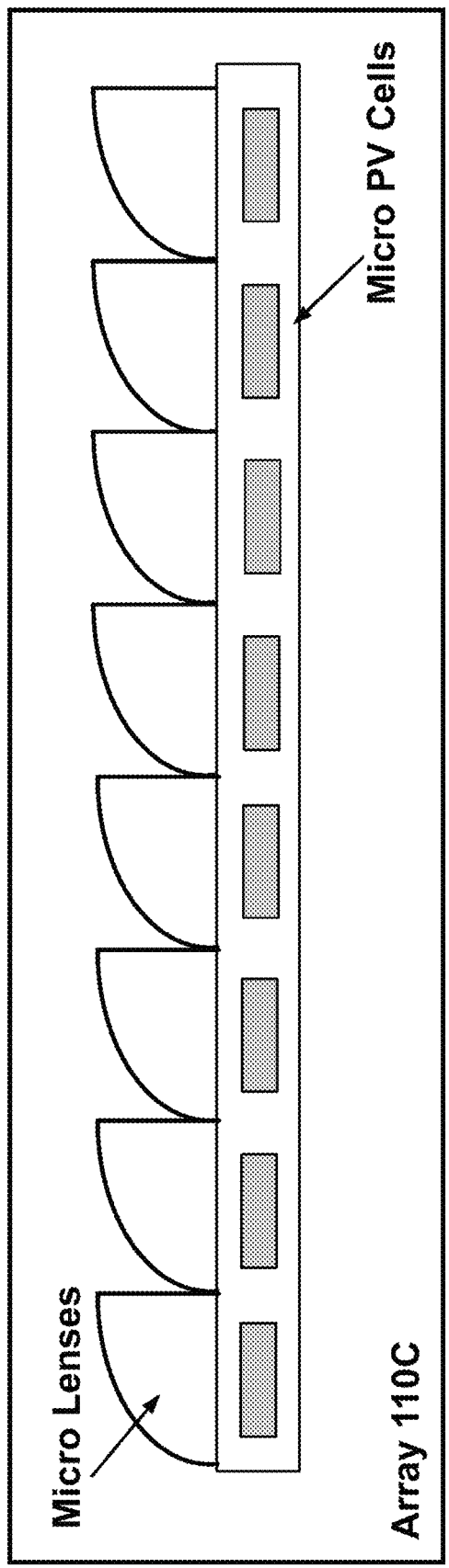

FLEXIBLE PHOTOVOLTAIC CELL, AND METHODS AND SYSTEMS OF PRODUCING IT

CROSS-REFERENCE TO RELATED APPLICATIONS

This patent application is a Continuation-in-Part (CIP) of U.S. Ser. No. 16/362,665, filed on Mar. 24, 2019, which is hereby incorporated by reference in its entirety; which claims priority and benefit from U.S. 62/785,282, filed on Dec. 27, 2018, which is hereby incorporated by reference in its entirety.

This patent application is also a Continuation-in-Part (CIP) of PCT international application number PCT/IL2019/051416, having an international filing date of Dec. 26, 2019, published as international publication number WO 2020/136653 A1, which is hereby incorporated by reference in its entirety; which claims priority and benefit (I) from U.S. Ser. No. 16/362,665, filed on Mar. 24, 2019, which is hereby incorporated by reference in its entirety, and (II) from U.S. 62/785,282, filed on Dec. 27, 2018, which is hereby incorporated by reference in its entirety.

FIELD

The present invention relates to semiconductors, and particularly to photovoltaic (PV) cells and modules as well as methods of producing them.

BACKGROUND

The photovoltaic (PV) effect is the creation of voltage and electric current in a material upon exposure to light. It is a physical and chemical phenomenon.

The PV effect has been used in order to generate electricity from sunlight. For example, PV solar panels absorb sunlight or light energy or photons, and generate current electricity through the photovoltaic effect.

SUMMARY

In some embodiments of the present invention, an apparatus includes a segmented PhotoVoltaic (PV) cell array, having a plurality of micro PV cells. The PV cell array includes one of: (I) a single wafer that is segmented via craters, (II) a portion of a single wafer that is segmented via craters, (III) a set inter-connected wafers that are segmented via craters. The wafer is one of: (i) a composite metallized wafer having an underlying metallization layer, wherein each crater penetrates an entirety of the non-metalized layers of the wafer but does not penetrate the underlying metallization layer; (ii) a semiconductor wafer, wherein each crater penetrates into not more than 99 percent of an entire depth of the semiconductor wafer. Each crater creates a physical recess separation between two neighboring micro PV cells, which are still inter-connected to each other but only across some and not all of their height. The micro PV cells are connected to each other, mechanically and electrically.

BRIEF DESCRIPTION OF THE DRAWINGS

FIG. 2A is a sideview illustration of a pick & place process, by which semiconductor substrates (the figure refers to PV wafers as a specific example) are placed on a support sheet, as part of a demonstrative embodiment of the invention.

FIG. 2B is a top view illustration of a pick & place process, by which semiconductor substrates (the figure refers to PV wafers as a specific example) are placed on a support sheet, as part of a demonstrative embodiment of the invention.

FIGS. 3A to 3C include a series of top view illustrations of a set of semiconductor substrates, positioned on a supporting sheet, and being separated or singulated by a process of physical scribing, grooving or dicing (cutting), performed by an automated cutter at a cutting station, in accordance with some embodiments of the present invention.

FIGS. 4A to 4C include a series of sideview illustrations of a set of semiconductor substrates, positioned on a supporting sheet and being fully singulated in accordance with a multi-step singulation embodiment of the present invention; wherein a combination of partial physical scribing or dicing (cutting) in two dimensions and physical deformation is used to fully singulate the substrates in a pre-defined pattern.

FIG. 5D is a perspective view of the semiconductor substrate body, which has been separated, grooved and/or singulated in accordance with some embodiments of the present invention; which includes an electrical conductor mesh, assembly or arrangement under the gaps or craters formed by the singulation, in accordance with some embodiments of the present invention.

FIG. 5E is a side cross-section view of several optional semiconductor body gap formation geometries, which may be produced and/or used in accordance with some embodiments of the present invention.

FIGS. 6A and 6B are bottom views of a semiconductor body, according to a PV device embodiment of the present invention, wherein interdigitated positive and negative electrodes protrude out of the bottom of the substrate body; and wherein different separation/cutting patterns are used depending on a placement and arrangements of negative electrodes relative to corresponding positive electrodes.

FIG. 7 is a functional level illustration of beam-based semiconductor separation, in accordance with some embodiments of the present invention; wherein a reactive substance is provided during beam separation, wherein the reactive substance may react with portions of the semiconductor body exposed to the separator beam as the reactive substance may be excited by the beam.

FIGS. 9A through 9F include three set of top and side illustrations of a semiconductor substrate/wafer body, wherein each set illustrates a transition of semiconductor substrate/wafer body from an untoughened configuration into each of three separate toughened configurations, in accordance with some embodiments of the present invention; note that gaps and/or wafer bodies and sections are not drawn to scale.

FIG. 10B is a sideview illustration of a clear polymer embossing assembly to provide micro or mini lenses on a top sheet covering a toughened PV cell, in accordance with some embodiments of the present invention.

FIG. 10C is a sideview illustration of an array of micro PV cells that is toughened, encapsulated and covered with a micro-lens embossed top sheet, in accordance with some embodiments of the present invention; demonstrating an embodiment where a-symmetric concentric micro-lenses may be used in correspondence to angle of solar radiation.

Figure 1A:
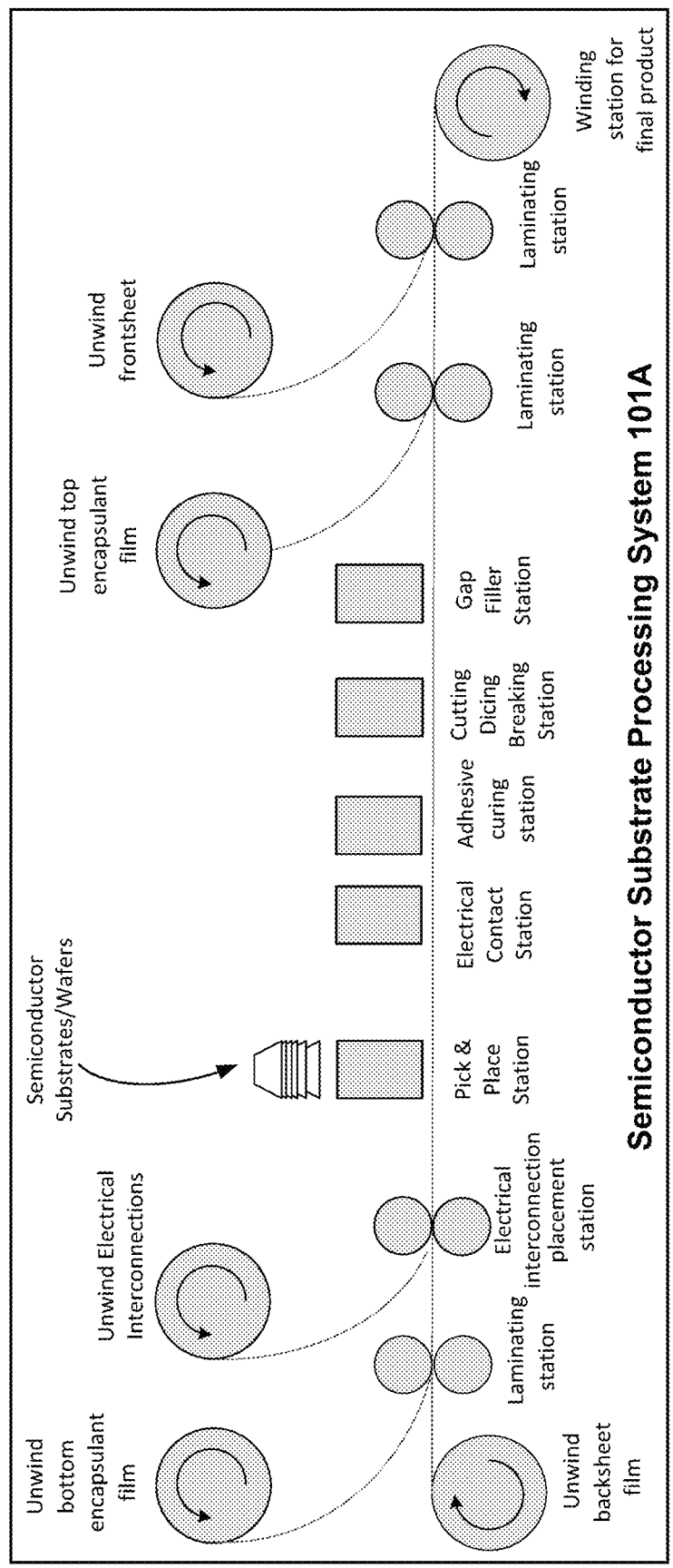
FIG. 1A is a functional level symbolic illustration of an example of a system for toughening a semiconductor substrate or wafer (wafer and substrate interchangeably used herein), in accordance with some embodiments of the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF SOME DEMONSTRATIVE EMBODIMENTS

Semiconductor devices are constructed on semiconductor substrates by processing the substrate body's material in various ways, including etching, impurity doping, reactive coating and surface deposition. Various devices such as transistors, integrated circuits, processors and Photovoltaic (PV) cells may be produced on a semiconductor substrate, which substrate may comprise all or a portion of the semiconductor wafer from which the substrate originated.

Semiconductor wafers and substrates, the terms herein after to be used interchangeably, are generally made from brittle crystal-type materials such a Silicon, Gallium Arsenide, etc. Accordingly, devices made from these materials are generally susceptible to breaking when under stress or upon experiencing a physical impact. These shortcomings necessitate substantial packaging and protection and susceptible to breakage during handling fabrication and transport. This is even more pronounced in full wafer scale applications such as PV where the semiconductor substrate is usually 5"-6" wide. Accordingly, there is a need in the semiconductor field for toughened and/or flexible semiconductor wafers, with enhanced physical toughness characteristics and for methods of producing same. There is a need in the PV production field for toughened and/or flexible semiconductor PV substrates and devices with enhanced physical toughness characteristics and for methods of producing same.

A solar cell, or photovoltaic (PV) cell, is an electrical device that converts the energy of light or photons directly into electricity by the photovoltaic effect, a physical and chemical phenomenon. The most commonly used solar cells are configured as a large-area p-n junction made from silicon. Other possible solar cell types are thin film like CdTe or CIGS, organic solar cells, dye sensitized solar cells, perovskite solar cells, quantum dot solar cells etc. Solar cell operate according to the following principles: (1) Photons in sunlight hit the solar panel and are absorbed by semiconducting materials, such as silicon; (2) Electrons are excited by the photons from their current molecular/atomic orbital in the semiconducting material; (3) Once excited an electron can either dissipate the energy as heat and return to its orbital or travel through the cell until it reaches an electrode; (4) Current flows through the material to cancel the potential and this electricity is captured. The chemical bonds of the cell material are vital for this process to work, and usually silicon is used in two regions, one region being doped with boron, the other phosphorus. These regions have different chemical electric charges and subsequently both drive and direct the current of electrons towards a relevant electrode.

An array of solar cells converts solar energy into a usable amount of direct current (DC) electricity. Individual solar cell devices can be combined to form modules, otherwise known as solar panels. In some cases, an inverter can convert DC current/power from a panel into alternating current (AC).

Demand for renewable energy and in particular solar energy is constantly rising due to a global initiative to provide alternatives for fossil fuels. The use of solar energy is becoming one of the most promising alternatives for a renewable energy source, with supply growing about 30% per year. The future of solar is promising to provide an abundance of available electrical energy at cost competitive with those for fossil fuels.

As current silicon solar modules, panels, are heavy and rigid, their use is limited in applications where weight, shape or accessibility are constraints. Additionally, today's PV modules are also expensive to transport and install. Flexible solar panels of arbitrary length on a roll would solve many of these issues. However, the current state of the art solutions for providing flexible PV panels are still under development and industrial scale production of such sheets is extremely expensive. Additionally, today's flexible panel solutions are not durable. Regardless of cost, most of the flexible PV panels available today are not sufficiently flexible for rolling.

There is therefore a need for low cost and improved flexible solar electricity producing surfaces. There is also a need for flexible PV modules with improved durability.

The term "gap" as used herein may include, for example, a cavity or tunnel or crater, or groove or elongated groove, or recessed cavities among islands or among island-like protrusions, or basins or elongated basins, or other type of spatial separation or recess or groove or pocket or crater between objects or walls; without necessarily causing such objects to be entirely discrete or separate from each other. For example, a "gap" may be a crater or a cavity between two neighboring micro PV cells, which may still be interconnected to each other mechanically and/or electrically. The terms "gap" and "crater", as used herein, may be interchangeable. The term "crater" as used herein, may include any suitable pocket or recess, which may not necessarily be rounded or circular; and may include a basin, an elongated basin, an elongated pocket, an elongated recess, a crater or pocket or recess that is shaped as an upside-down trapezoidal prism or as an upside-down elongated trapezoidal prism (e.g., upside-down because its larger panel is facing upwardly, and its smaller panel is facing downwardly), an upside-down prism or polyhedron having a side-panel that is generally V-shaped or U-shaped or triangular, an upside-down elongated pyramid, a series or a set or a batch of the above-mentioned craters or recesses or pockets or basins, or the like; and such crater or groove or pocket or basin may have flat surfaces, or planar surfaces, or non-planar surfaces, or curved surfaces, or irregular surfaces, or slanted surfaces, or a combination of two or more such (or other) types of surfaces and/or side-walls.

The present invention includes methods, devices and materials for producing toughened semiconductor substrates. Semiconductor substrates and semiconductor devices produced from such substrates may exhibit toughened physical characteristics making, them more suitable for use in mechanically challenging or stressful applications and environment. Semiconductor substrates and semiconductor devices produced from such substrates may exhibit toughened thermal characteristics, making them more suitable for use in environmentally challenging applications. Semiconductor substrates and semiconductor devices produced from such substrates may exhibit sufficiently toughened characteristics to permit packaging in non-rigid and light weight encapsulant(s). Semiconductor substrates and semiconductor devices produced from such substrates may exhibit sufficient flexibility on a scale suitable to permit for rolling up during shipment and/or for non-destructive deformation during deployment over uneven surfaces.

Embodiments of the present invention may include a toughened semiconductor substrate comprising a substrate body composed of semiconductor material and having top, bottom and side surfaces. The semiconductor body may have at least one intentionally placed gap therein, wherein the intentionally placed gap may be placed by separating segments of the body, either from the top, the bottom or both (e.g. cracking, breaking, etc.), or by removing material from the body, either from the top, the bottom or both (e.g., sawing, etching, cutting, laser cutting, dicing, milling, etc.). An intentionally placed gap according to embodiments of the invention may be is at least 0.01 mm deep. An intentionally placed gap according to embodiments of the invention may have a varying depth and/or a varying width. Said gap may act as a crack, micro-crack, and/or nano-crack propagation inhibitor.

According to embodiments, at least some semiconductor body gaps may include a gap filler within said at least one intentionally placed gap. The gap filler may be at least partially composed of a material possessing mechanical force or shock absorption, compressibility and/or stretchability and/or flexibility and/or toughening properties. Accordingly, some gap filler material may also be referred to as toughening agents. The gap filler may be at least partially composed of a material possessing thermal absorption and/or thermal dissipation properties. The gap filler may be at least partially composed of a material possessing electrically insulative properties. According to some embodiments, a gap filler may be reactively grown within a respective gap, while according to other embodiments, a gap filler may be deposited within a respective gap. A gap filler may form a coating over sidewalls of a respective gap. A gap filler may form a coating over shoulders of sidewalls of a respective gap and may form a continuous layer at the level of said shoulders.

Gap filler according to some embodiment may be composed of at least one material selected from the group consisting of: (a) a polymer; (b) a resin, (c) amorphous silicon; (d) glass; (e) a metal; (f) carbon; (g) oxygen; (h) a monomer; (i) a second semiconductor; (j) an oligomer; (k) a reactive system (e.g. monomer and photo-initiator); (l) EVA; (m) PVDF; (n) Silicone; and (o) a combination of 2 or more of the above. Gap filler may be homogeneous, or may be a heterogeneous system comprised of at least one matrix material (e.g. a polymer) and at least one additive (e.g. discrete domains of a second, softer polymer)

According to embodiments of the present invention, a gap filler may be reactively produced inside of a respective gap. According to a first example, a reactive chemical such as oxygen or ammonia may be introduced during laser cutting or chemical etching of the gap, and a reaction between the reactive chemical and material of the gap sidewalls may form a coating on the sidewalls. The coating may be of varying thickness, and in some cases may expand to push the sidewalls apart. According to other examples, a reactive mixture of chemicals may be introduced into an already placed/produced gap, and the reactive mixture may be allowed to react within the gap, thereby filling the gap with a product of the reaction, which in some cases may physically push the gap sidewalls apart.

According to further embodiments, a gap filler may include a set of materials deposited as discrete layers within or across said gap. Different layers of the deposited discrete layers may have different properties and serve different toughening functions in accordance with the present invention.

Gap filler material may include Polymer/oligomer/monomer systems for mechanical toughening—EVA, HIPS (high-impact polystyrene), thermoplastic elastomers (TPEs), block copolymers of polystyrene-polybutadiene and/or polystyrene-polyisoprene (diblock, triblock, multiblock and random copolymers), polybutadiene neoprene, EPDM and other rubbers/elastomers and flexible materials Gap filler material for heat and electrical conductivity may include or contain carbon fibers, metallic powders, nano-particles, nano-fibers, filings and/or fibers, including but not limited to iron, copper, silver, aluminum and/or mixtures and/or alloys of the above distributed in a polymeric, ceramic or other matrix as well as conductive polymers, CNTs, Graphene.

Gap filler which provide reactive mixtures that swell upon reaction include such mixtures as a poly-isocyanate and a polyol with or without the presence of water to produce a foamed polyurethane. Alternative blowing agents such as azodicarbonamide may also be incorporated in order to create foam resulting in expansion of the material within the gaps and an increase in volume that will increase the width of the gaps.

According to embodiments, at least part of the gap filler material may be an anisotropic material. According to an exemplary embodiment, anisotropic particles of fibers may be affixed in a specific direction relative to the top or bottom surface of the body matrix as well as conductive polymers, CNTs, or Graphene, suspended within a binding material such as a polymer. Anisotropic particles, such as micro-fibers may be aligned, in one direction or another relative to a top or bottom surface or a different specific plane in the substrate, prior to curing of the filler material by using a magnetic or an electric field. Such a mixture may serve to toughen the substrate physically and thermally. Particles, isotropic or anisotropic in nature, may be present either below or above the percolation threshold.

Gap filler material which is anisotropic can lend anisotropic characteristics to the semiconductor substrate/wafer. The filler material may contain anisotropic particles (e.g. microfibers) that me be aligned or oriented using an external force field, such as a magnetic or electrical field. If these anisotropic particles are embedded in a filler matrix which can be "set" (such as a polymer, monomer or oligomer that can be crosslinked), these properties will remain with a permanent preferred orientation even after turning off the external aligning force field.

According to embodiments, the semiconductor body may be composed of at least one semiconductor material selected from the group consisting of: silicon, silicon dioxide, aluminum oxide, sapphire, germanium, gallium arsenide (GaAs), CdTe, organic/inorganic perovskite based materials, CIGS (CuGaInS/Se) and indium phosphide (InP). The semiconductor body may be configured to provide a semiconductor device selected from the group consisting of: a Photo Voltaic Cell, a Light Emitting Diode, a Transistor, a Power Transistor, an Integrated Circuit, a Very Large Scale Integration, and a Microelectromechanical systems (MEMS).

According to embodiments of the present invention, the intentionally placed gap may be produced by removing material from the substrate body, either physically, chemically, with a laser or otherwise. The intentionally placed gap may extend across at least the top surface of the substrate body in a single line or in a pattern composed of an array of lines or other shapes. The intentionally placed gap may actually extend across each of the top surface and the bottom surface of the substrate body, thereby forming separate and different gap patterns both on the top surface and on the bottom surface of the substrate. The singulating pattern or map on the top of the wafer may or may not coincide with the singulating pattern/map on the bottom of the wafer. Gap filler may be introduced into some or all of the gaps, on either side. In the case of singulating from both sides a continuous layer of the semiconductor substrate or wafer, some material may remain through a middle layer of the wafer (not necessarily at the location of half the thickness). According to further embodiments, gap patterns on different sides of the substrate may be filled with different gap filler material. While according to even further embodiments, some or all of a gap pattern on either or both surfaces may be left empty.

The material used to fill the gaps on the bottom of the wafer may be the same material used to fill the gaps on the top of the substrate/wafer, or may be a different material. The material introduced into a gap may partially fill the gap vertically (i.e. fill the bottom of the gap), may fill the gap completely (i.e. flush with the top surface adjacent to the gap), or may overflow and partially or fully cover the top surface adjacent to the gap.

According to embodiments of the present invention, the intentionally placed gap may be produced by removing material from said substrate body all the way completely through the semiconductor body from top surface to bottom surface. The intentionally placed gap, completely passing from top to bottom surface, may extend across the top or bottom surface of said substrate body in a single line or in a pattern composed of an array of lines or other shapes. According to such embodiment, the semiconductor substrate may be completely singulated or split into pieces. According to such fully singulated embodiments, the gap filler material and/or an external films placed over the top surface, over the bottom surface or over both surfaces may serve to maintain the substrate's physical integrity. According to further embodiments, one or more electrical conductors connecting terminals on the singulated substrate pieces to one another may serve to maintain an electrical functionality of the semiconductor substrate.

Embodiments of the present invention may include photovoltaic (PV) cells, arrays of PV cells and methods of producing same. Further embodiments of the present invention may include PV cells and arrays of PV cells with enhanced toughness and/or durability and/or flexibility, and methods of producing same. According to embodiments of the present invention, a PV cell with enhanced toughness and/or durability and/or flexibility may be produced by separating, partially or completely, segments of material within a semiconductor substrate or wafer with which the PV cell is produced, before or after producing the PV cell from the semiconductor substrate and introducing a toughening agent or material, such as a flexible polymer, resin or other flexible impurity, between the separated wafer or substrate segments (the terms "wafer" and "substrate" are used interchangeably herein or above). The toughening material may be a composite material, deposited as a single layer or in multiple layers within the gaps. According to multi-layer gap filler embodiments, different layers may exhibit different properties and may perform different functions within the enhanced wafer. Some gap filler materials may provide enhanced heat conduction functionality, for example, by including and/or introducing heat conduction additives into the wafer gaps. Any of the gap filler materials previously mentioned is applicable to the PV cell embodiment. Any substrate body material previously mentioned is applicable to the PV cell embodiment.

According to some embodiments, material of a wafer or substrate (terms used interchangeably) may be separate by means of fracturing, where little to no material is removed or otherwise lost from the wafer. According to other embodiments, segments of a PV cell wafer may be separated by cutting, scribing, etching, dicing and/or any other method known today or to be devised in the future, where some of the wafer material is removed. Removal of wafer material may be complete, from a top surface through to a bottom surface of the wafer, or it may be partial, leaving some wafer material behind at the top or bottom of the wafer. Separation of wafer segments, complete or partial, with or without material removal, may be performed from one end of the wafer to the other end, and/or may be performed multiple times in order to form a pattern of separations. According to further embodiments, a separation pattern may be selected to correspond to a specific orientation with respect to a crystal lattice of the wafer being separated.

According to embodiments of the present invention, irrespective of whether substrate or wafer segment gaps in between wafer segments of a PV cell wafer are complete or partial, with or without material removal, a flexible material may be deposited in the gaps. Deposition may optionally include melting, physical spreading, vapor deposition, solvent assisted deposition, chemical bath deposition (CBD), printing, or other suitable method(s) for depositing material onto a semiconductor wafer. Deposition of the material in the gap may be conducted simultaneously with another process in which the filler material also plays a role; for example, a filler material may also act as an adhesive to a top sheet or layer laminated to the semiconductor wafer. For example, some embodiments may use EVA as filler material which simultaneously acts as an adhesive layer to a topsheet of ETFE. In this example, EVA may be incorporated in film form, which at given temperature and pressure liquifies, penetrates the gaps, and simultaneously forms an encapsulating film covering the semiconductor wafer and also functioning as an adhesive to the top sheet above. The gap filing material may be composed of a flexible (compressible and stretchable) polymer as previously elaborated. The gap filing material may exhibit good mechanical shock absorption and/or dissipation characteristics. In some embodiments, the gap filling material may be deposited as part of a top or bottom lamination process of the respective PV cell wafer.

According to embodiments of the present invention, a PV cell may be mechanically toughened by segmenting its semiconductor body, composed of semiconductor substrate/wafer, into micro PV cells. The micro PV cells may be formed by segmenting the PV cells body completely in a repeating pattern which forms the micro PV cells. The repeating pattern may be composed of one or more sets of cutting/scribing lines, that form discrete functional areas. Each of the micro PV cells may be electrically connected to other micro PV cells, forming an array of micro PV cells; the collection or array of micro PV cells, working together, may perform substantially the same function as the original (non-segmented) PV cell. Deposition of the gap filler material between sidewalls of the micro PV cell may produce a toughened PV cell with similar electrical characteristics not substantially different from those of the original PV cell prior to material separation, but having considerably better toughness characteristics and flexibility characteristics when compared to the original PV cell. The addition of the toughening material may increase, decrease or have no effect on performance of the original PV cell.

According to embodiments of the present invention, there may be provided one or more micro PV cells with dimensions (e.g. lengths, widths and thicknesses) in the millimeter range. The one or more micro PV cells may be provided with a width ranging between a fraction of a millimeter and several centimeters. A top and bottom surface of a micro PV cells may be provided in various shapes including: triangle, circle, square, rectangle, hexagon and any otherwise suitable polygon. According to embodiments of the present invention, a micro PV cell may be provided with dimensions and geometry (i.e. length, shape, width and angles) selected to allow a maximum bending moment of at least 500% or at least 600% that of the semiconductor substrate before toughening.

Embodiments of the present invention may include various PV array applications which are: (1) weight sensitive, (2) involve "high" or repetitive mechanical loading, and/or (3) may require the use of irregularly shaped surfaces with contours as the mechanical support for the PV array. According to some embodiments, the micro PV cells may be laminated and used as a sail. According to further embodiments, the array may be affixed to the side of a building or temporary structure (e.g. tent). The array may be placed on a walkway or roadway. According to some embodiments, the micro PV cells may be spread at a low density across a wide area of transparent material, such as glass or plexiglass to provide a relatively transparent building or car envelope which also produces electricity. According to further embodiments, arrays of micro PV cells may be orientated in a vertical direction and placed behind structured prisms, pyramid arrays or lenticular lenses to provide electricity from sunshine arriving from above and presenting/projecting a billboard image to observers passing by below.

According to further embodiments, at least one sidewall or side-surface of a micro PV cell according to the embodiments may be produced with a non-right, sloped angle relative to the active surface of the micro PV cell. A sidewall or side-surface of a micro PV cell according to embodiments of the present invention may include one or more coatings of material different from the material of the rest of the cell. According to embodiments, the coating may be part of a passivation layer on the sidewall. According to further embodiments, the sidewall coating may be part of an electrical insulation layer on the sidewall. According to yet further embodiments, the coating layer(s) may have additional functionalities and may be part of any another type of layer, such as for example an anti-reflection layer, etc. According to some embodiments, the coating layer(s) may be formed in-situ, for example during dicing or cutting of the sidewall. The coating may be intentionally deposited or may be otherwise formed, for example from a reaction which occurs during cutting (e.g. lase cutting) of the sidewalls in the presence of reactive gases. The presence of reactive gasses or other gap filler agents/materials intended to infuse and react within or around the gap during laser cutting may be intentional according to some embodiments.

Micro PV cells according to embodiments of the present invention may be arranged into interconnected arrays of micro PV cells. Arrays according to embodiments of the presentation may be one, two or three dimensional. According to some one and two-dimensional embodiments of the present invention, adjacent micro PV cells within an array of micro PV cells may be spaced at some distance apart from one another, for example between 0.01 and 2.0 millimeters apart. Space in between sidewalls of adjacent cells may be left empty or may be filled with a gap filler material, which material may be a flexible and/or a compressible material. The gap filler material may have additional properties and may perform additional functions, such as for example providing electrical insulation and/or providing mechanical shock protection to the micro PV cells. According to further embodiments, the gap filler material filling the gaps between adjacent micro PV cells may include an additive to trigger passivation of exposed silicon sidewalls.

Adjacent micro PV cells may be electrically connected to one another via flexible electrical conductors, which may carry both positive and negative charge from the cells, either in parallel or in series configurations. Adjacent micro PV cells may share at least one common electrically conductive connector, such as for example a positive terminal. Bottom surfaces of each of two or more adjacent micro PV cells, such as for example the respective cell's respective P-type semiconductor regions, may connect to the same electrical connector. According to further embodiments, a shared electrical conductor may be integral or may otherwise include a P-type semiconductor layer with which each of two adjacent cells may form a separate PN junction.

Large numbers of micro PV cells forming an array may be interconnected by a network of positive and negative conductors. Some arrays of micro PV cells according to embodiments of the present invention may include hundreds, thousands and even millions or billions of micro PV cells arranged along a common surface in either one or two dimensions for example when fabricated on a roll of hundreds to thousands of meters length. Some embodiments may include micro PV cells arranged in three dimensional arrays, with multiple layers of two-dimensional arrays placed or stacked on top of each other, where gaps between micro PV cells in the upper layers of the 3D array may allow for light to pass through and onto PV cells in the lower regions. This 3D array configuration may be referred to as stacked arrays.

According to further embodiments, different groups of micro PV cells within an array of micro PV cells may be interconnected according to different arrangements, wherein some groups of cells may be interconnected to adjacent cells in parallel while other groups may be interconnected to adjacent cells in series. According to further embodiments, a micro PV cell may be interconnected with one adjacent cell in parallel and at the same time interconnected with another adjacent cell in series. Such multi-method interconnects within an array may provide for a combination of voltage boosting, due to serial interconnections, and current aggregation, due to parallel interconnections. Selection of a conductor mesh configuration, out of many possible combinations, during micro PV cell array fabrication may be performed in accordance with rules intended to customize array electrical output parameters, such as output voltage and output current for a given power level. One specific application of such array output engineering, by conductor mesh selection, is boosting voltage to current ratios for a given power in order to minimize resistive loses during transmission of the PV generated electricity.

According to some embodiments, an array of micro PV cells may be produced by physically splitting or separating a larger PV wafer or cell into smaller adjacent micro PV cells. The processing or mechanical splitting a PV Cell can also be referred to as singulation and may be performed by various processes including: (a) mechanical sawing or dicing (normally with a machine called a dicing saw); (b) scribing and breaking; (c) laser cutting (e.g. using CW laser or pulsed lasers in the UV, VIS or IR ranges); (d) E-Beam cutting; (e) Ion Beam Cutting; (f) wet etching; (g) dry etching; (h) ultrasonic cutter; (i) milling and (j) Thermal Laser Separation (TLS). Any process for singulation of semiconductor material, known today or to be devised in the future, may be applicable to present invention.

Some or all of the methods of PV cell singulation, according to embodiments of the present invention, may be automated to ensure precision and accuracy to producing micro PV cells with intended dimensions. Accordingly, dicing saw and/or laser spot width or mask geometry may be selected to correspond to an intended gap size and shapes between the micro PV cells. Cutting angles may also be selected to correspond to intended slopes and/or shapes of micro PV cell active surfaces and sidewalls. The micro PV cell created by a mechanical dicer saw may be any shape comprised of straight lines, but are typically rectangular or square-shaped but can also be other polygons. In some cases, when lasers or other methods are used, the micro PV cells can be produced in the form of many other shapes. A full-cut laser dicer may produce an array of micro PV cells in a variety of shapes, not just those formed of straight lines.

According to some embodiments, singulation or cutting or dicing of a PV cell or wafer into an array of micro PV cells may be performed from a top surface of the wafer or PV cell to be parsed into an array of micro PV cells. According to further embodiments, singulation or cutting may be performed from a from a bottom surface of the wafer or PV cell to be parsed into an array of micro PV cells. The terms singulation, cutting, dicing, and the like, as used in this application, may be used interchangeably unless there is a specific reference to specific methods and/or its inherent features. According to yet further embodiments, singulation or cutting may be performed from both top and bottom of the wafer or PV cell; in this case the cutting map or pattern on the top and bottom sides of the wafer may be the same or different. The singulation map or pattern of a PV wafer may be designed in correspondence to constraints such as the location of electrical conductors and contact points of a system to which the singulated PV wafer is to be attached.

Additional embodiments of the present invention may include an encapsulation of an array of interconnected micro PV cells within a material or set of materials. According to embodiments, a first set of materials placed in contact with a bottom surface of a micro PV cell array may join with and adhere to a second set of materials placed above a top surface of the PV cell array. Either the top or bottom set of materials may also include or act as a gap filler for spaces in between adjacent cells. The materials placed above the top of the array, where the photo-active surface is located, are selected to be sufficiently strong, flexible and sufficiently transparent to the relevant wavelengths in solar radiation in order to produce a strong, durable, flexible, conversion efficient and easily installable PV sheet or product. The materials placed below the bottom surface of the micro PV cell array are selected for strength, durability, flexibility and compatibility with the array material and with the top encapsulation material. At least one of the set of materials, either above or below the PV cells array may be composed of a stretchable and/or compressible to allow the total stack to curve to a desired radius. The layers above the PV cell array need to protect the PV micro cells against corrosion, and mechanical shock (such has hail impact, heavy loads e.g. trucks etc.) and to insulate even for series connected cells with high voltage against the ground (e.g. 600 VDC, 1000 VDC, 1500 VDC) in dry and wet conditions. The bottom layers may protect the PV micro cells against corrosion, and mechanical shock (such has hail impact, heavy loads e.g. trucks etc.) and to insulate even for series connected cells with high voltage against the ground (e.g. 600 VDC, 1000 VDC, 1500 VDC) in dry and wet conditions.

The process of encapsulating a micro PV cell array may also be referred to as lamination (usually when this process also includes adhesion of the PV Cell Array to a material usually in sheet or roll form). Lamination of a micro PV array according to embodiments of the present invention may include placement below the micro PV array: (a) bottom encapsulant film, and (b) a back-sheet film, in that respective order. Lamination of a micro PV array according to embodiments of the present invention may also include placement above the micro PV array a top encapsulant film and then a front-sheet film. Both encapsulant films may be composed of highly adhesive and malleable material, optionally adhesive and malleable when heated. Both the top and bottom sheets may be composed of durable materials. The top sheet and top encapsulant may both have low photon attenuation properties for photons with wavelengths within a band of wavelengths at which the micro PV array operates (i.e. converts photons into electricity). In addition to the typical structure described here consisting of a backsheet, a bottom encapsulant, a PV Cell Array, a top encapsulant and a topsheet, the structure would also typically contain elements for electrically connecting the PV Cells to each other, for connecting PV Cell Arrays to each other, and for electrical connections to an external load, thus allowing utilization of the electrical power produced by the PV cells.

According to embodiments of the present invention, the top and/or bottom sheets may be elastic. Either the top sheet or the bottom sheet, or both sheets may be flexible. Either the top sheet or the bottom sheet, or both sheets may be compressible. Elasticity of either top, bottom or both sheets may provide for rollability of the laminated micro PV arrays. Elasticity of either top, bottom or both sheets may provide for placement on the laminated micro PV arrays on top irregular or contoured surfaces.

A top sheet, according to further embodiments, may include optical concentrators positioned over areas where the micro PV cells are located. Each optical concentrator may cover one or more rows of Micro PV cells. Each optical concentrator may cover one or more columns of Micro PV cells. Each optical concentrator may cover one or more clusters of Micro PV cells. Or, each optical concentrator may be a micro-concentrator and may cover only one micro PV cell. Optical concentrators may be affixed to the top sheet, either before, during or after the lamination process. Optical concentrators may be embossed on the top sheet, either before, during or after the lamination process. According to some embodiments, optical concentrators are embossed or pressed onto a top sheet by a heated roller with protrusions in the shape of the optical connector, optionally during the lamination process. According to other embodiments, optical concentrators are formed onto a top sheet by micro-machining, laser ablation, patterned chemical etching or other processes.

According to some embodiments, singulation and lamination can be performed as part of a continuous process. According to further embodiments, forming of the optical concentrators may also be performed during the lamination process. According to alternative embodiments, different phases of producing an array of micro PV cells may be separated into discrete processes.

According to further embodiments, an electrical conductor mesh may be provided in form of a conductive backsheet, between the supportive backsheet and toughened PV cell array (arrays of micro PV cell arrays). This conductive backsheet may provide for electrically connecting cells with soldering, conductive adhesive, Surface Mount Technology (SMT) epoxy or adhesive or bonding materials, circuits, bus bars, electronics inside module such as Maximum Power Point Tracking (MPPT) tracking ICs; and method of producing same, e.g., using laser ablation, conductive stickers, soldering, Surface Mount Technology (SMT) processes, or the like.

According to some specific Photovoltaic focused embodiments, there may be provided methods of processing rigid (typically crystalline/polycrystalline cell of thickness above 10 um and preferably above 50 um) solar cells, of various configurations, in order to toughen and render more flexible the processed cell. The processed cells may then be used to produce flexible solar films and rolls of solar films based on a combination of these now flexible solar cells with encapsulating materials. The method can include producing long continuous films with modular electrical connections throughout in a roll format.

In order to render a rigid/semi rigid solar cell into a flexible one, a pseudo-singulation by grooving/dicing/cutting/breaking/cleaving (hereafter called "grooving") stage may be performed on a PV cell. Provided that the current collectors of both polarities remain intact and allow electricity flow out of the cell, the grooving may be done in steps similar or larger than adjacent current collectors of opposite sign during this stage, a minimal reduction in overall efficiency is expected. Grooving may preferably be done in electrically shaded sections of the solar cell to the maximum possible way in order to preserve maximum efficiency.

The distance between grooves determines the maximum radius of curvature of the film. In one preferred embodiment the distance between grooves is equal to the distance between adjacent conductors. In another embodiment the distance is between 100 um and 10 cm and preferably between 0.5 mm and 5 mm.

The kerf left by the grooving process may be minimal and may allow for the rolling of the film only in one direction in order not to apply stress and break the top of the solar cell when bending it inward. The kerf maybe of a defined width of between 0 and 300% of the height of the solar cell, to allow any desired radius of curvature when bending towards the top of the solar cell. To clarify terms: the top of the cell is the side which interacts with solar radiation.

The grooving may be performed perpendicular to the machine direction to allow rolling of the film in a small radius, parallel to the machine direction to allow flexibility in the width direction, or both to allow flexibility in all directions. The grooving can be made in diagonals, hexagons or any other pattern to render the flexibility needed by the product. Grooving may be conducted in one direction, in two directions or in more than two directions. Grooving may be conducted with an equal or with a different index in the different directions. The grooving index in any given direction may be constant or may vary.

In some embodiments, the grooving may be done by a mechanical saw or by a gang or group or batch of mechanical saws (e.g., a dicing saw). Alternatively, in another embodiment, grooving may be conducted by means of a "water jet" (high speed concentrated jet of liquid with or without abrasive particles in the liquid).

In another embodiments, the film may enter a curved space with bumps or other indentations or protrusions that induces breakage in the desired locations as depicted in drawing 4C in one direction and may be induced to break in the other direction by entering a roller system with bumps at the correct index. The PV units may be pre-weakened in specific desired locations either mechanically or by means of a laser, for example. In certain embodiments, the wafer would be stressed or grooved in direction(s) corresponding to the crystal lattice of the semiconductor material thus inducing "clean" breakage along crystal planes.

In yet another embodiment the grooving may be done by laser. Preferably, the laser is capable of rastering through the pattern in alignment with the speed of the machine (web) with enough power to perform grooving deep enough and fast enough. In another embodiment the laser beam is split by a e.g. a DOE to perform parallel grooving of between 2 to 1000 beamlets or more. The laser may be rastered and/or split optically or mechanically e.g. by an SLM or by any other beam shaper and/or a mechanical head. In further embodiments more than one laser head may be used in order to increase throughput, i.e. perform a higher number of grooves of specified depth, width, shape, angle and index in a given amount of time.

In one embodiment, a process for producing a product as described herein, is exemplified in which individual photovoltaic cells are first attached to a continuous flexible support sheet in an e.g. "pick and place" or dispenser manner and electrically connected to each other, either directly or by means of separate connecting elements. In one variation, the support film or sheet would already have electrical connecting elements preplaced on it in the correct locations to electrically connect adjacent photovoltaic elements/solar cells. This process would typically be a continuous process fed by a roll of support material with an automated station for placing the individual photovoltaic units and a station for performing the electrical contacts. The support sheet with the electrically connected photovoltaic elements is then moved to a pseudo-singulation (e.g. scribing, dicing, grooving etc.) station which would typically, but not necessarily, be located directly after the electrical contact station. The pseudo-singulation station is equipped with a mechanical (e.g. dicing saw) or laser unit, or both, or other means such as a water-jet or controlled breaking with capabilities to pseudo-singulate in at least one direction. The pseudo-singulation unit may be in a "gang configuration" enabling multiple scribes and/or cuts in a single pass of the machine head. Relative movement between the scribing/cutting head(s) and the photovoltaic elements in the machine direction may be accomplished by continuous movement of the support sheet. The machine head may be capable of conducting all scribes and cuts in a single pass or may have the capability to move in the transverse direction to reposition itself at a location required to perform additional scribes and/or cuts in the machine direction. The production line may be equipped with more than one cutting/scribing head for use in the machine direction. Scribing and/or dicing in other directions (including the transverse direction, perpendicular to the machine direction) may be performed by an additional head or additional heads with movement capability in the transverse direction. The dicing and/or scribing may be performed in a step and repeat semi-continuous manner where the support sheet with the photovoltaic elements would remain stationary in the transverse direction scribing/cutting area while the transverse direction scribing/cutting is conducted. Upon completion of transverse direction scribing/cutting of a given area, the support sheet with the photovoltaic units would move in the machine direction bringing into the transverse direction scribing/cutting area an additional portion of the material for transverse direction scribing/cutting. This order is just an example, and a certain direction grooving may be performed, before, after or simultaneously with grooving in a different given direction(s). Scribing and/or dicing in other directions (typically the transverse direction, perpendicular to the machine direction) may also be performed by an additional head or additional heads with movement capability in both the machine direction and the transverse direction, in which case the dicing and/or scribing would be performed in a continuous manner, with the machine head for dicing and/or scribing in the transverse direction would follow the movement of the support sheet with the photovoltaic units, and perform the scribing and/or dicing while moving in the machine direction. Upon completing certain area, the machine head would reposition itself upstream in the machine direction in order to perform the next set of transvers scribes and/or dicing cuts. Upon completion of dicing and/or scribing, the support sheet with the scribed and/or diced photovoltaic units is flexible enough to be rolled up and moved to a different line for subsequent processing or may undergo further processes downstream on the same line. The kerfs' width may be wide enough to provide partial transparency to the solar film and allow some (0.1% to 99.9% and preferably 5% to 90%) of the optical radiation to pass through it.

In some embodiments, the connector units between adjacent photovoltaic units or PV cells may be spring-like and may allow for stretching or shrinking or contraction or expansion of the product; a frontsheet and/or a backsheet may be utilized, having sufficient elasticity (or rigidity, or rigidness, or flexibility) to enable such stretching or contraction or expansion. Stretching may be enabled in one or more particular direction(s). Some embodiments may utilize PVDF (polyvinylidene fluoride, or polyvinylidene difluoride) layer or coating or film, as front-sheet or back-sheet or as a PV protector layer In a next processing step, the support sheet with the scribed and/or diced photovoltaic units may be laminated to a protective top sheet and/or bottom sheet. The lamination step may include encapsulation of the photovoltaic units with a protective material such as ethylene vinyl acetate (EVA). The protective top sheet needs to be transparent in order to maximize the intensity of solar radiation reaching the photovoltaic units and have good long-term resistance to environmental conditions. ETFE is one example of a material suitable for the protective top sheet. Transparent UV epoxy is another example and in one embodiment can be reinforced by fiberglass. A top durable transparent coating such as transparent synthetic "asphalt" may also be used to support heavy loads and protect the cells from breaking in e.g. solar roads applications. A glass filler may also be used in this application to enhance durability. In one embodiment fillers would be chosen with a refractive index similar to the matrix in which they are embedded. The top sheet may also be colored or tinted in order to suit certain applications. In this embodiment, narrow bandwidth reflection particles in a particular color may be embedded within the top sheet. In another example a holographic diffraction induced color may be generated through particles and geometries inside the sheet that induce color in certain directions and may in some cases also be transparent in other directions. In another embodiment the top sheet may include embedded lenses (e.g. micro-lenses) to concentrate the received radiation only upon the active area of the cells (i.e. excluding the kerfs formed when grooving and/or the area of the chamfered corners of the individual photovoltaic units/silicon wafers).

In another embodiment, relative movement between the scribing/cutting head and the photovoltaic elements in the machine direction may be accomplished by continuous movement of the support sheet. The machine head may be programmed to scribe and/or dice in a "Zig-Zag" pattern by combining mechanical movement of the head in the transverse direction and optical and/or mechanical manipulation of the laser beam in the machine direction. Combining consecutive lines of "Zig-Zag" scribing/dicing results in an array of scribes/cuts along both diagonals of the PV unit. Upon completion of dicing and/or scribing, the support sheet with the scribed and/or diced photovoltaic units is flexible enough to be rolled up and moved to a different line for subsequent processing or may undergo further processes downstream on the same line. In yet another embodiment relative movement between the scribing/cutting head and the photovoltaic elements in the machine direction may be accomplished by continuous movement of the support sheet. The machine head is programmed to scribe and/or dice in a hexagonal pattern by combining mechanical movement of the head in the transverse direction and optical and/or mechanical manipulation of the laser beam in the machine direction. Consecutive lines of partial hexagonal scribing/dicing trajectories result in an array of scribes/cuts that form a complete hexagonal ("bee hive") pattern across the PV cell in order to achieve better ration between cut and intact areas on the original cell to optimize performance. Upon completion of dicing and/or scribing, the support sheet with the scribed and/or diced photovoltaic units is flexible enough to be rolled up and moved to a different line for subsequent processing or may undergo further processes downstream on the same line. Patterning is not limited to the "Zig-Zag" or hexagonal grooving patterns described here and may include other geometrical trajectories and combinations thereof.

Various automated machines can be used to produce the flexible solar rolls based on treated rigid/semi rigid solar cells. In general, the machine can produce flexible solar films using any solar cell in which the both conductors are placed on the bottom of the cell such as, interdigitated back contact (IBC) solar cells, metal wrap through (MWT) solar cells, Emitter Wrap Through (EWT) solar cells, or other types of solar cells.

In one embodiment, monocrystalline, polycrystalline and/or any other type of silicon-based solar cells can be used.

In one embodiment the carrier sheet (e.g. backsheet and/or encapsulant sheet) may be stretchable and may be first metallized e.g. with (non-stretchable or stretchable) contact. A solar cell without the metallization is placed upon this metalized and patterned substrate in the correct placement and subsequently cut with minimal kerf and preferably no kerf (e.g. by breaking). A kerf is subsequently created by stretching the carrier sheet and thus moving the areas with active photovoltaic material away from each other.

In yet another embodiment an identification tag such as a RFID may be embedded in the product to allow for smart control and antitheft of the product. the adhesive of the film layers may be designed to prevent the opening of the cells without tearing apart and ruining the cells. Designing the antitheft electronics adjacent to the cell with adhesive designed to destroy it in case of tampering will prevent cutting and taking only part of the cell array.

In another embodiment the top sheet and/or encapsulant may be metallized in a fine line, stretchable or not, and subsequently electrically connected to the top of the solar cell, which in this case has one electrode on the bottom and the other at the front such as standard type silicon photovoltaic cell.

In one embodiment, the machine is a R2R (roll-to-roll) type system where at the end of the process the solar film is rolled onto a core to be packed and shipped. Packing and shipping may be in the form of "Jumbo rolls" (the full size of the incoming support roll) or in the form of smaller rolls which may be slit from the full-size roll in both the machine direction and/or the transverse direction. Packing and shipping of the end product is expected to be limited only by practical constraints of handling—weight, availability of raw materials in required widths, maximized efficiency of packing rolls in a shipping container, etc.

In some embodiments, the backside of the product would be coated with an adhesive (e.g. pressure sensitive adhesive, PSA) and laminated to a release layer to ensure that no contamination of the PSA occurs. The functionality of the adhesive is to facilitate easy attachment to a substrate (wall, car roof, etc.).

In one embodiment the machine may include a soldering station where individual cells are electrically connected in series and parallel in order to reach the desired current and voltage of the film/module. The soldering process may be done in several stages during the fabrication of the module. In one example bypass diodes, jumpers, smart logic, transistor, ideal diode circuits, cell-wise (or few cells) Maximum Power Point Tracking (MPPT) circuitry, and more may be used inline in the connection and soldering between cells to allow e.g. MPPT of cells in different orientation (due to flexibility), antitheft electronics, rapid shutdown logic, AC current inversion, as well as bus bars and communications. The connectors between cells and solder are designed to meet environmental conditions as well as expansion due to temperatures with low fatigue.

In order to allow production at higher speeds, the soldering stations may be distributed along the line and do not need to perform the electrical connection at the same time. In further embodiments, soldering may be replaced fully or partially by the use of electrically conductive adhesives.

In one embodiment the solar cells after grooving and soldering may be ready for encapsulation by encapsulants (e.g. polymer encapsulants, foil encapsulants, liquid encapsulants, vapor encapsulants or other types and combinations thereof), of the back sheet and front sheet at the next station of the machine.

In one embodiment the grooved cells may pass through a passivation stage to either passivate dangling bonds in the exposed silicon, protect it and/or create a field that pushes carriers away similar to the one on the top surface of e.g. IBC cell. This may be done by form of e.g. ALD, CVD, PVD, wet or other technique of e.g. SiO2, SiNx, AlOx, TiO2, among others.

In one embodiment the system does not need encapsulation at all, or at least in the sense of humidity, oxygen or other environmental corrosion agents due to the inherent stability of the components and expected life time that satisfy the requirements of a given application.

The encapsulation material(s) may include EVA, a fiber-glass-reinforced composite and/or fluorinated polymer e.g. ETFE or in another embodiment, a polyolefin or any other appropriate material. The encapsulation can be composed of one layer or more than one layer of different polymers, or other dielectric materials such as oxides, nitrides, etc. to render the encapsulation (electrical and chemical), flexibility and optical properties needed for the product, and meet necessary standards. e.g. withstand 1500V breakdown voltage, allow only low degradation of performance for tens of years, withstand mechanical impact such as hail etc.

One or both of the frontsheet and the backsheet can be transparent. Areas for connecting peripherals may be designed in the front and/or back sheets for contacting bus bars, auxiliary electronics etc. These may be fabricated as e.g. holes or as weak spots that allow a penetration of a connector designed to provide good electrical connection.

The busbars may be designed as metalizations e.g metal foil laminates between the front and backsheet/and/or encapsulant film and to provide a pocket like area for the connection of a penetrating and expanding electrical connection that may sit once attached between the two metalizations with a compressive stress e.g. spring or washer spring to its place and subsequently it may be sealed as well.

In one embodiment, the electrical connection to photovoltaic units and between adjacent photovoltaic units may be conducted at a later stage by a machine capable of penetrating either the frontsheet and/or the backsheet, performing the desired electrical connection, and retracting without leaving damage to the said sheet. The process may include a post-electrical connection "healing step" in which damage to the frontsheet or backsheet is repaired by an encapsulation material or by other means.

The flexible solar films may be designed to be cut at certain shapes and lengths as required by the application and not necessarily be in only one form factor as the state of the art. They may be cut to shape at the installation location.

The flexible solar film sizes may be scalable with sizes between 1 mm and 100 km, and preferably between 12 m at 24 km it the roll direction and between 1 mm and 10 m, and preferably between 12 cm and 4 m in the perpendicular direction.

The flexible solar film may be constructed in a modular fashion allowing for different combinations and connections of PV cells to create areas capable of generating a required voltage and current combination.

Embodiments of the present invention may include a toughened semiconductor substrate comprising a substrate body composed of at least some brittle semiconductor material having a thickness of above 0.01 mm. The semiconductor material may have top, bottom and side surfaces. At least one intentionally placed gap may be introduced into said substrate body, wherein said intentionally placed gap may be at least 10% of semiconductor material thickness deep and at least 10% of semiconductor thickness wide. The toughened substrate may include a gap filler within the at least one intentionally placed gap which may be composed of a softer/tougher material possessing compressible/stretchable and/or flexible mechanical properties. According to embodiments, the gap filler may convey or introduce mechanical impact or force absorption and/or toughening properties to the composite semiconductor substrate as well as rendering it flexible.

The toughened semiconductor substrate semiconductor body may be composed of at least one semiconductor material selected from the group consisting of: intrinsic semiconductors, Group IV semiconductors, III-V semiconductors, II-VI semiconductors, silicon, silicon dioxide, aluminum oxide, sapphire, germanium, gallium arsenide (GaAs), and indium phosphide (InP) germanium, C, SiC, GaN, GaP, InSb, InAs, GaSb semiconductor on glass, silicon on glass, glass, silica, alumina, quartz, gallium arsenide (GaAs), and indium phosphide (InP), CdTe, organic/inorganic perovskite based materials, CIGS (CuGaInS/Se) including doped versions of the aforementioned materials and mixtures thereof.

Composite substrate bodies may include epitaxcsial semiconductors on glass: CIGS (Cu In Ga S/Se) on glass AZO/ZnO/CIGS on glass, FTO/ZnO/CIGS on glass, ITO/ZnO/CIGS on glass, AZO/CdS/CIGS on glass, FTO/CdS/CIGS on glass, ITO/CdS/CIGS on glass, FTO/TiO2/CIGS, CdTe on glass, glass AZO/ZnO/CdTe on glass, FTO/ZnO/CdTe on glass, ITO/ZnO/CdTe on glass, AZO/CdS/CdTe on glass, FTO/CdS/CdTe on glass, ITO/CdS/CdTe on glass, FTO/TiO2/CdTe.

The semiconductor body may be configured to produce a semiconductor device selected from the group consisting of: a Photo Voltaic Cell, a Light Emitting Diode, a Transistor, a Power Transistor, an Integrated Circuit, a Very Large Scale Integration, a detector, a diode and a Microelectromechanical systems (MEMS).

According to embodiments, the gap filler may be composed of at least one material selected from the group consisting of: (a) a polymer; (b) a resin, (c) amorphous silicon; (d) glass; (e) a metal; (f) carbon; (g) oxygen; (h) a monomer; (i) a second semiconductor; (j) an oligomer; (k) a reactive system (e.g. monomer and photo-initiator); (l) EVA; (m) PVDF; (n) Silicone; (o) a fluoropolymer, (p) SiNx, (q) EPDM, (r) rubber, (s) PDMS, (t) PFE, (u) nitrogen, (v) titanium, (w) TaN, (x) AlN, (y) organic compound, (z) inorganic compound, (aa) nitrides, (ab) phosphides, (ac) carbides, (ad) selenides, (ae) halcogenides, (af) halides, and/or (oag) a combination of two or more of the above.

Gap filler comprised of an elastic or a plastic filler may include (a) a polymer, (b) a resin, (c) a monomer, (c) an oligomer, (e) PDMS, (f) EVA, (g) PFE, (h) a reactive system (e.g. monomer and photo-initiator, (i) PVDF, (j) Silicone, (k) EPDM and (l) rubber. Gap filler comprised of an passivating material may include: (a) SiNx, (b) SiO2, (c) AlN, (d) TaN, (e) nitrides, (f) phosphides, (g) carbides, (h) selenides, (i) halcogenides, (j) halides, (k) amorphous silicon. Gap filler comprised of composite material for chemical, thermal and mechanical durability may include at least one of the following materials: a) a metal, b) carbon, c) ceramic material. The gap filler may be comprised of any combination of the above listed options.

According to embodiments, the gap filler material may be reactively grown within a respective gap. The gap filler may be formed by reacting some gas or other substance with wall material of the gap sidewall. The gap filler may form a coating on said gap sidewall. The coating on said gap walls may be formed by the reaction of sidewall material with a specific ambient (e.g., gas) provided during the cutting/dicing process, for example during laser cutting.

According to embodiments, the gap filler may physically expand and may push gap walls apart. The gap filler may expand during reaction with material from the sidewalls. Alternatively, the gap filler may be introduced into the gap as a mixture of reactive materials which expand from reacting with themselves.

The toughened semiconductor substrate may include a gap filler mixture with anisotropic particles affixed in a specific direction relative to the top or bottom surface or any other specific plane in the substrate.

The toughened semiconductor substrate may include gap filler composed of materials deposited as discrete layers within or across a gap. The deposited material(s) may lay generally parallel to the top and bottom surfaces of the semiconductor substrate, or parallel to any other direction, including vertically to the top and bottom surfaces of the substrate. Different layers of the deposited discrete layers have different properties and serve different toughening functions.

According to embodiments, the toughened semiconductor substrate may include intentionally placed gap produced by removing material from the substrate body. The intentionally placed gap may extend across at least the top surface of said substrate body in a single line or in a pattern composed of an array of lines or other shapes. The array of lines may intersect at different points to create discrete areas of the top surface separated from adjacent similar discrete areas.

The toughened semiconductor substrate according to embodiments may include an intentionally placed gap which extends across each of the top surface and the bottom surface of said substrate body, thereby forming separate and different gap patterns within each of top surface and bottom surface. Gap filler material used for filling the gap patterns within each of top surface and/or bottom surface may be different, wherein one of the two gap patterns may be left unfilled.

The toughened semiconductor substrate according to embodiments may include intentionally placed gaps produced by removing material from the substrate body and which may pass completely through the semiconductor body from top surface to bottom surface. According to embodiments, the intentionally placed gap may be produced by expanding the distance between the semiconductor substrate parts from the sides of the gap.

The intentionally placed gap may be perpendicular to the top surface and to the bottom surface. The intentionally placed gap may be at an angle other than 90 degrees to the top surface and to the bottom surface. The intentionally placed may be a regular contour with flat walls. The intentionally placed gap may be of an irregular contour such a "V-shaped", "U-shaped", flat or other shape.

Embodiments of the present invention include all steps known today or to be devised in the future to provide the semiconductor features mentioned.

Embodiments of the present invention may include a mechanically toughened Photovoltaic (PV) cell comprising a semiconductor body composed of semiconductor material with a formfactor including a top surface, a bottom surface and at least one sidewall, at least one intentionally placed gap within said body; and gap filler deposited in the gap formed within the cell body. Gaps within said cell semiconductor body may extend in a pattern so as to partition or to segment said PV cell (or PV cell array, or PV micro-cell array) into two or more micro PV cells, each micro PV cell having a body, a top surface, a bottom surface and sidewalls.

According to embodiments, each micro PV cell may include at least two electrode contacts of said micro PV cell and each electrically connected to a different side of a P-N junction within its respective micro PV cell. According to embodiments, the electrode contacts may be laterally spaced apart on a bottom surface of the micro PV cell. The micro PV cell may include at least two electrode contacts on any surface of said micro PV cell and each electrically connected to a different side of a P-N junction within its respective micro PV cell.

The micro PV cell top surface may be a polygon selected from the group consisting of: (a) a square; (b) a rectangle; (c) a decagon; (d) a hexagon; (e) a heptagon; and an octagon. Each side of said polygon may have a length in the range of 0.1 mm to 5 mm. The micro PV cell bottom surface may have the same shape and substantially the side lengths as said top surface. According to embodiments, the bottom surface may have different side lengths from that of the top surface.

A thickness of said micro PV cell, from top surface to bottom surface, may be in the range between 0.01 mm and 5 mm. At least one micro PV cell sidewall may be at a slope to said top surface or may have a curved surface.

According to embodiment a micro PV cell sidewall may be coated with a material different from the material comprising said micro PV cell body. The sidewall may be coated with a passivation material. The sidewall may be coated with an electrically insulative material. The sidewall may be coated with an electrically insulative material. The sidewall may be coated with a compound produced when reacting the cell body material with a substance selected from the group consisting of: (a) oxygen, (b) ammonia, (c) nitrogen, (d) hydrogen, and (e) argon and (f) compounds of these materials and (g) mixtures thereof.

According to embodiments, each of the micro PV cell electrodes is connected to a separate flexible conductor which interconnect corresponding electrodes on separate micro PV cells. According to embodiments, a conductive mesh may include conductors which electrically connect corresponding electrodes on different toughened PV cells.

The toughened PV cell according to embodiments may include a clear or transparent polymer laminate, located above said top surface. The PV cell may include a clear (or transparent) top sheet and/or encapsulant. The top sheet may include optical concentrators located above micro PV cells. The optical concentrators may or may not cover all or part of the gap between micro PV cells. The optical concentrators may be embossed or otherwise added to said clear top sheet. Adding may include chemical etching, micro-machining, laser ablation or other means, during or after the laminate is affixed to the PV cell.

According to embodiments, the concentrators may be geometrically optimized to direct the sunlight from an optimized inclination angle to an active area of a respective micro PV cell. The concentrators may be geometrically optimized to direct light away from non-active part of respective micro PV cells.

Embodiments of the present invention may include mechanically toughened Photovoltaic (PV) cell array comprising a bendable and/or stretchable support sheet upon which two or more toughened PV cells may be arranged relative to one another. The array may include an electrical conductor mesh to electrically interconnect corresponding electrical output terminals of at least two toughened PV cells, and at least one of said toughened PV cells may be s formed of a semiconductor substrate with a formfactor including a top surface, a bottom surface and at least one sidewall, at least one intentionally placed gap within said body with gap filler deposited therein.

The array may be composed of toughened PV cells as described above. The electrical contacts may be attached to each toughened cell and may be placed upon the support sheet which includes interconnections between the toughened PV cells. The PV cells may include dot contacts dispersed through respective bottom surfaces and may include P and N contacts.

A toughened PV cell according to embodiments may include dot contacts dispersed through its bottom surface and may include p and n contacts that connect two or more dot contacts of the same polarity.

An array according to embodiments may include an electrical conductor mesh to electrically interconnect corresponding electrical output terminals of at least two toughened PV cells, whereas the array may also connect micro PV cells and/or group of micro PV cells and/or one or more toughened PV cell.

An array according to embodiments may provide a flexible PV module composed of a continuous flexible array which is rollable on a roll with a diameter of less than 50 cm. The flexible module may be composed of a continuous flexible array with a length of between 0.12 m to 24 km, and with a width of between 0.12 m to 12 m.

According to some embodiments, the specific weight of the PV module may be lower than 1, and it may float on water (or on other liquids). The array support sheet may be made from a closed cell foamed polymer. The closed cell foamed polymer may be made of a polymeric material including: polyolefin, PDMS, EPDM, silicone, polyurethane. The support sheet may be made out of fluoropolymer, PET, PVC, EPDM, ETFE, ECTFE, acrylic, PC, PVDF, PEF, POE, PP, PE, Al, silicone and combinations thereof. A top sheet of the array may be made out of transparent and/or colored and/or patterned and/or embossed fluoropolymer, PET, PVC, EPDM, ETFE, ECTFE, acrylic, PC, PVDF, PEF, POE, PP, PE, Al, silicone and combinations thereof, ETFE, PET, PVDF, PP, PE, EVA and FEP. In some embodiments, a PV module or an array of PV cells may be formed of, or may comprise, one or more layers that have a specific weight that is smaller than 1, in order to enable the entire module or product to float on water and/or to float on other liquids; for example, by utilizing one or more layers of sponge or foamed lightweight plastic or polystyrene or foamed polystyrene or Styrofoam, optionally with closed pores or coated pores. Such layer(s) may be glued or bonded or otherwise connected or mounted, under the lowest layer of the module or array, or beneath some portions or regions thereof, or at side-edges or side-panels thereof, or at other suitable locations.

Figure 1B:
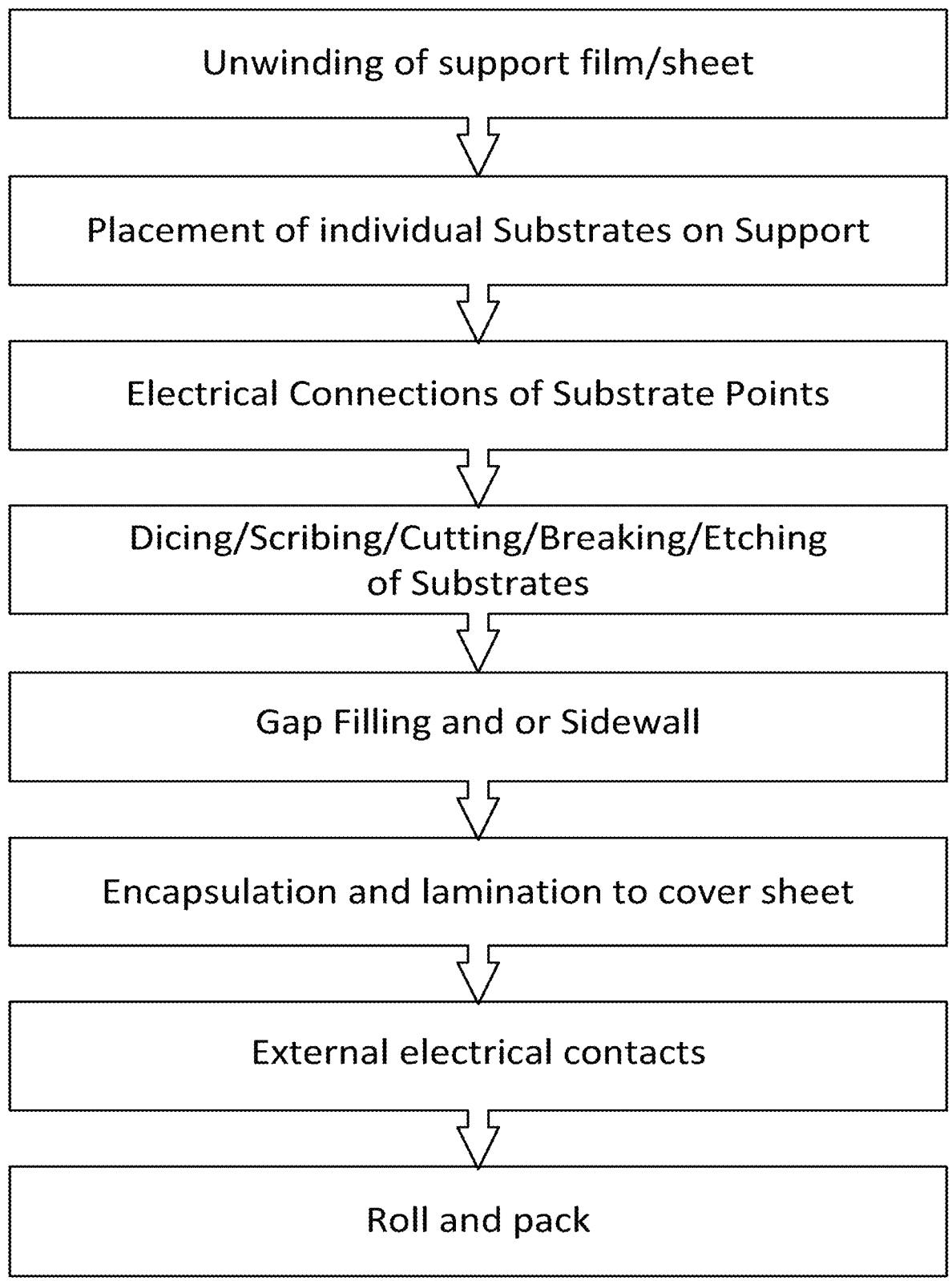
FIG. 1B is a flowchart including steps of a possible sequence of a method of toughening a semiconductor substrate, in accordance with some embodiments of the present invention.

Turning now to FIG. 1A, there is shown a functional level symbolic illustration of a system for toughening a semiconductor substrate or wafer (wafer and substrate interchangeably used in this application) in accordance with embodiments of the present invention. Operation of the system of FIG. 1A may be described in conjunction with steps enumerated in the flowchart of FIG. 1B, which is flowchart of a method of toughening a semiconductor substrate in accordance with embodiments of the present invention. The specific machines/stations and the specific sequence of steps used may vary without detracting from the innovation.

A bottom support sheet along with a bottom encapsulant are unrolled and combined to form a bottom support upon which electrical interconnects, such as a conductor mesh (inter-digitated or not), are unrolled and placed. Upon the composite film and electrical support structure a pick & place machine places one or more semiconductor substrates in any configuration applicable to the present invention. An electrical contact station makes contacts between relevant electrodes on the placed substrates and corresponding conductors on the mesh, after which the bottom encapsulant is cured at an adhesive curing station. A top surface of the electrically connected and adhesive affixed substrates are separated/singulated/grooved to form semiconductor substrate body gaps in accordance with embodiments using a cutting, dicing or breaking station. The substrate gaps, which can be clean through cuts, are then filled by a gap filler material in accordance with embodiments of the present invention, at a gap filling station. A clear top laminating film and a clear top sheet are then applied and pressed together on top of the substrates, after which the output product is rolled up at a rolling station.

Optional processes and devices in the context of the system of FIG. 1A are shown in the following figures. Turning now to FIG. 2A, there is shown a sideview illustration of a pick & place process 102A by which semiconductor substrates are placed on a support sheet as part of an exemplary embodiment of the present invention. FIG. 2B is a top view illustration of a pick & place process 102B by which semiconductor substrates are placed on a support sheet as part of an exemplary embodiment of the present invention.

Figure 3A:
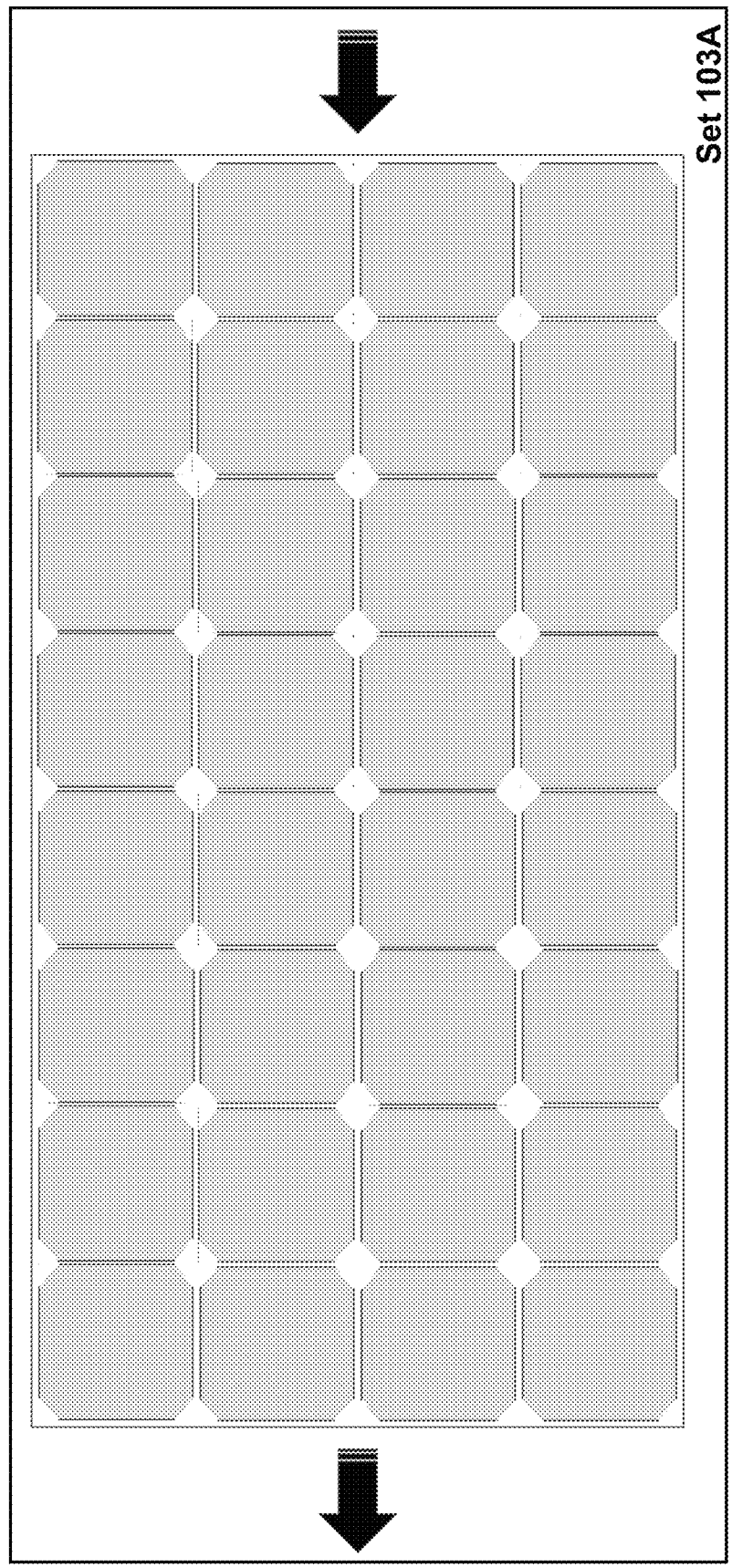
Figure 3B:
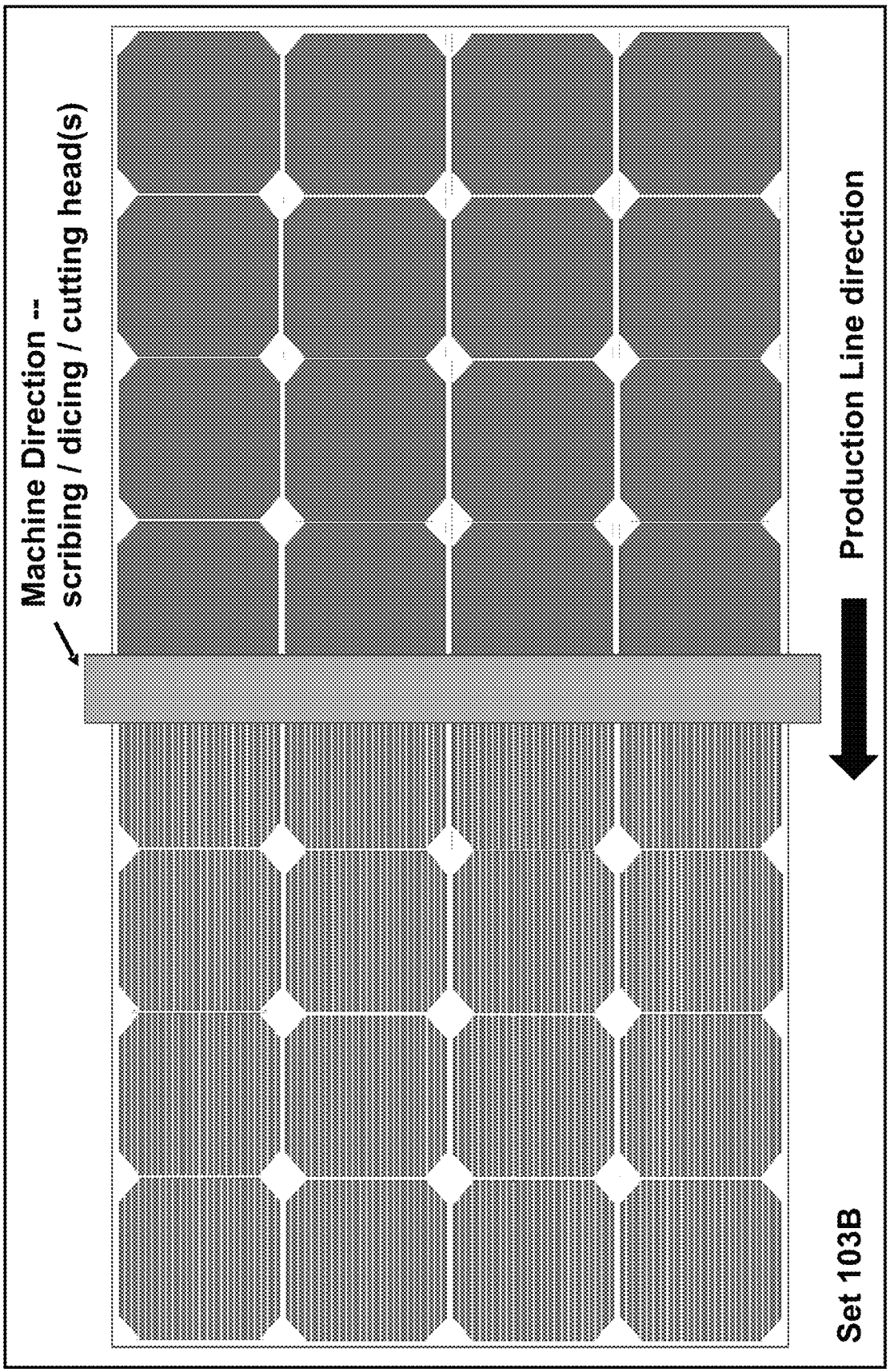
Figure 4F:
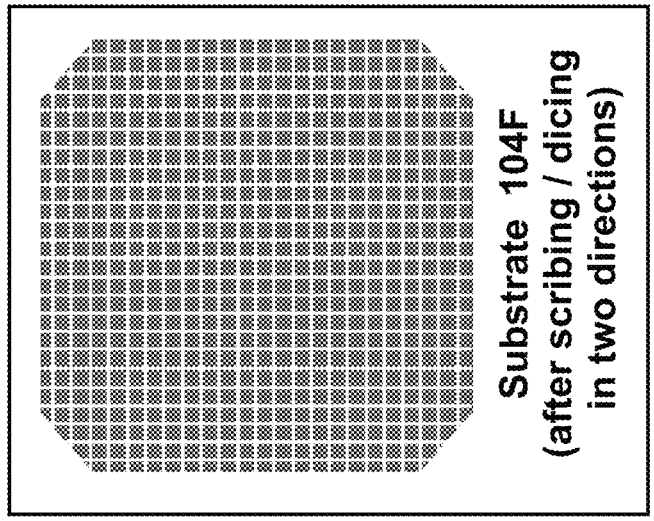
FIGS. 4D to 4F show a series of top views of a semiconductor substrate as it transitions through a separation/singulation/grooving process, in accordance with some embodiments of the present invention.
Figure 4E:
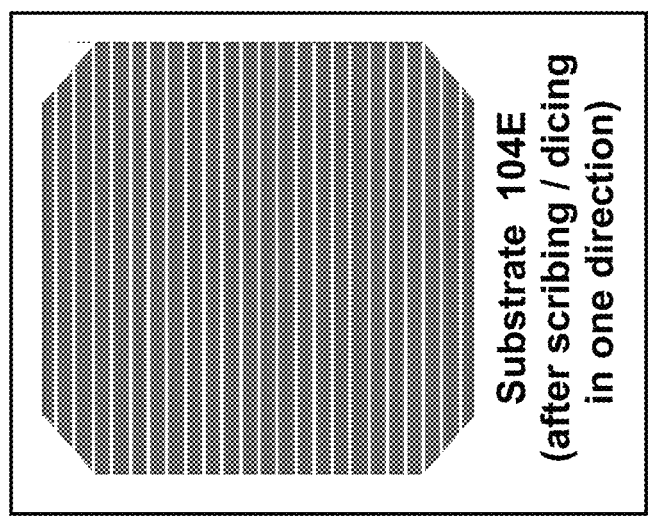
Figure 4D:
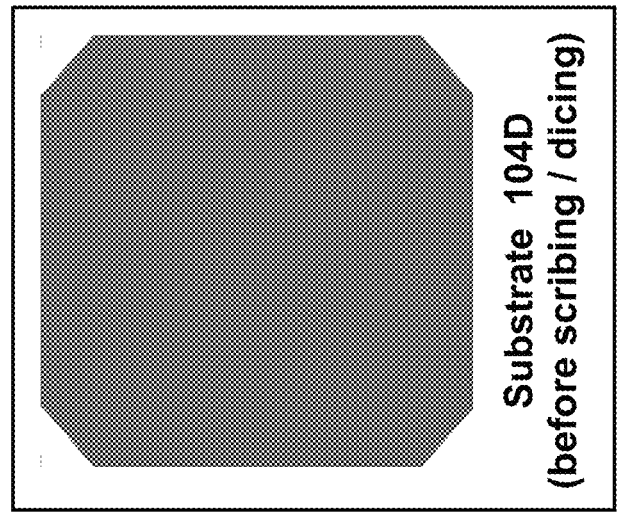

Turning now to FIGS. 3A to 3C, there are shown a series of top view illustrations of a set of semiconductor substrates (set 103A, set 103B, set 103C, respectively) positioned on a supporting sheet and being separated, grooved or singulated by a physical scribing or dicing (cutting) process performed by an automated cutter at a cutting station in accordance with embodiments of the present invention. FIGS. 4A to 4C include a series of sideview illustrations of a set of semiconductor substrates (set 104A, set 104B, set 104C, respectively) positioned on a supporting sheet and being fully singulated in accordance with a multi-step singulation embodiment of the present invention where a combination partial physical scribing or dicing (cutting) in two dimensions and physical deformation is used to fully singulate the substrates in a predefined pattern. FIGS. 4D to 4F show a series of top views of a semiconductor substrate (substrate 104D, substrate 104E, substrate 104F, respectively) as it transitions through a separation/singulation process in accordance with embodiments of the present invention.

Figure 5A:
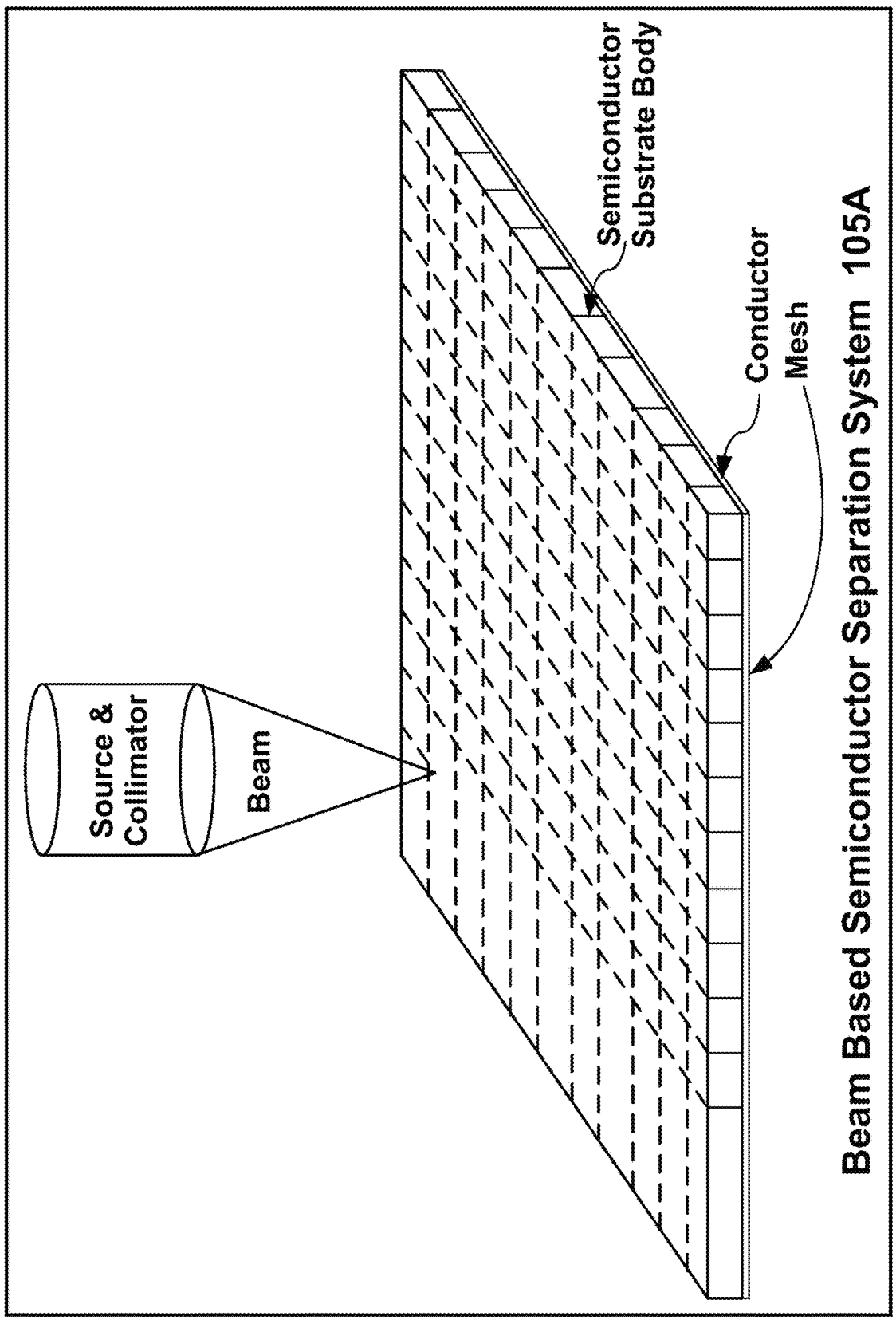
FIG. 5A is a functional level illustration of beam based semiconductor separation, in accordance with some embodiments of the present invention.
Figure 5B:
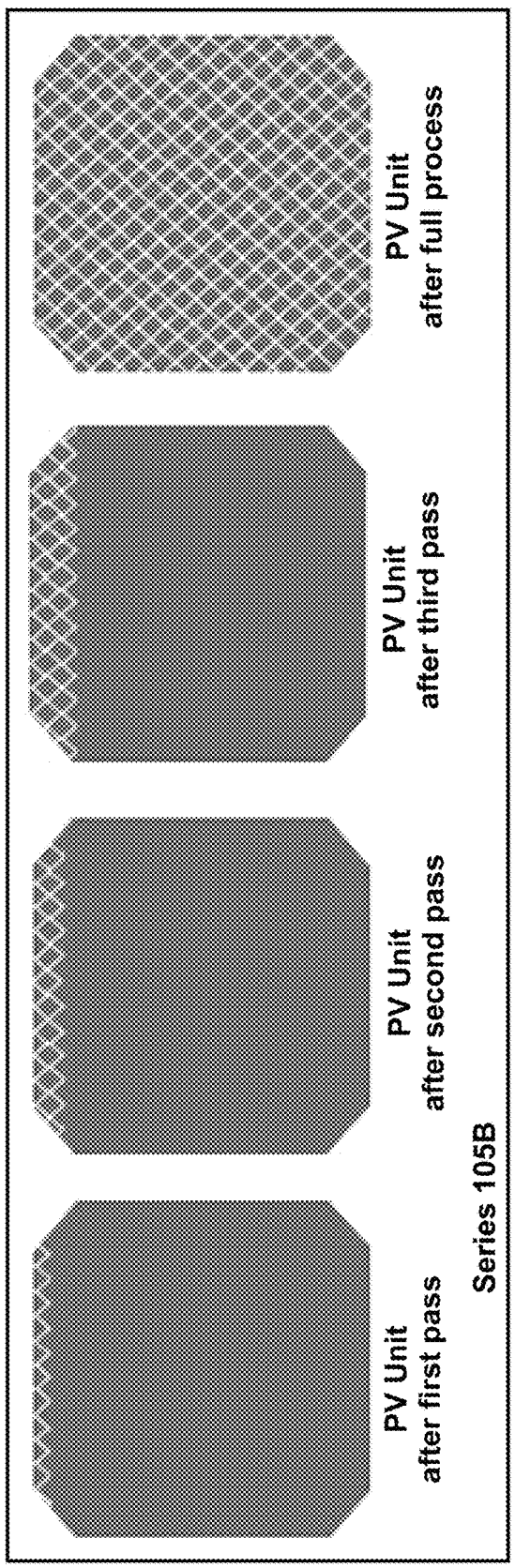
FIGS. 5B and 5C each show a series of top views of a semiconductor substrate, as it transitions through demonstrative separation/singulation/grooving processes, in accordance with some beam based embodiments of the invention.
Figure 5C:
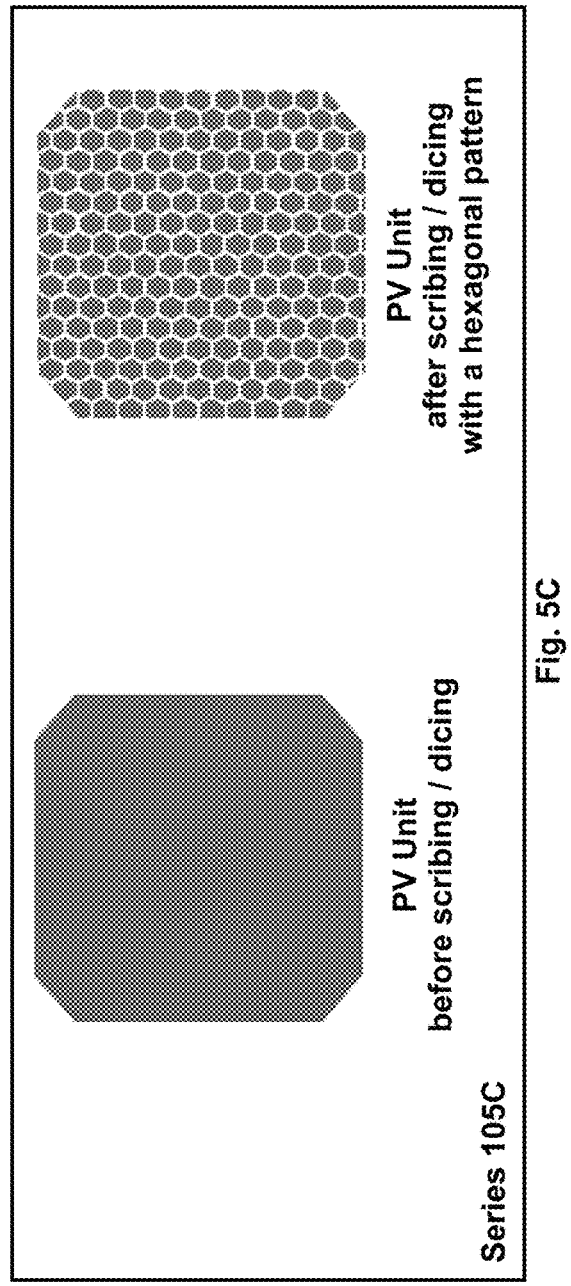

Turning now to FIG. 5A, there is shown a functional level illustration of a beam-based semiconductor separation system 105A in accordance with embodiments of the present invention. The beam can be a laser, an electron beam, a sonic beam, a water stream, a gas/jet stream and/or any other beam types known today or to be developed in the future. FIGS. 5B and 5C each show a series of top views of a semiconductor substrate (series 105B and series 105C, respectively) as it transitions through exemplary separation/singulation processes in accordance with beam-based embodiments of the present invention.

Turning now to FIG. 5D, there is shown a prospective view of a semiconductor substrate body 105D which has been separated, grooved or singulated in accordance with embodiments of the present invention and which includes an electrical conductor mesh under the gaps formed by the singulation in accordance with further embodiments of the present invention. FIG. 5E is a side cross-section view of several optional semiconductor body gap formation geometries which could be produced and/or used in accordance with embodiments of the present invention, shown as a set 105E of gap shapes. Note should be made that this figure demonstrates a specific example or embodiment in which the wafer is pre-attached to a conductor mesh. This is not necessarily always the case.

Figure 6A:
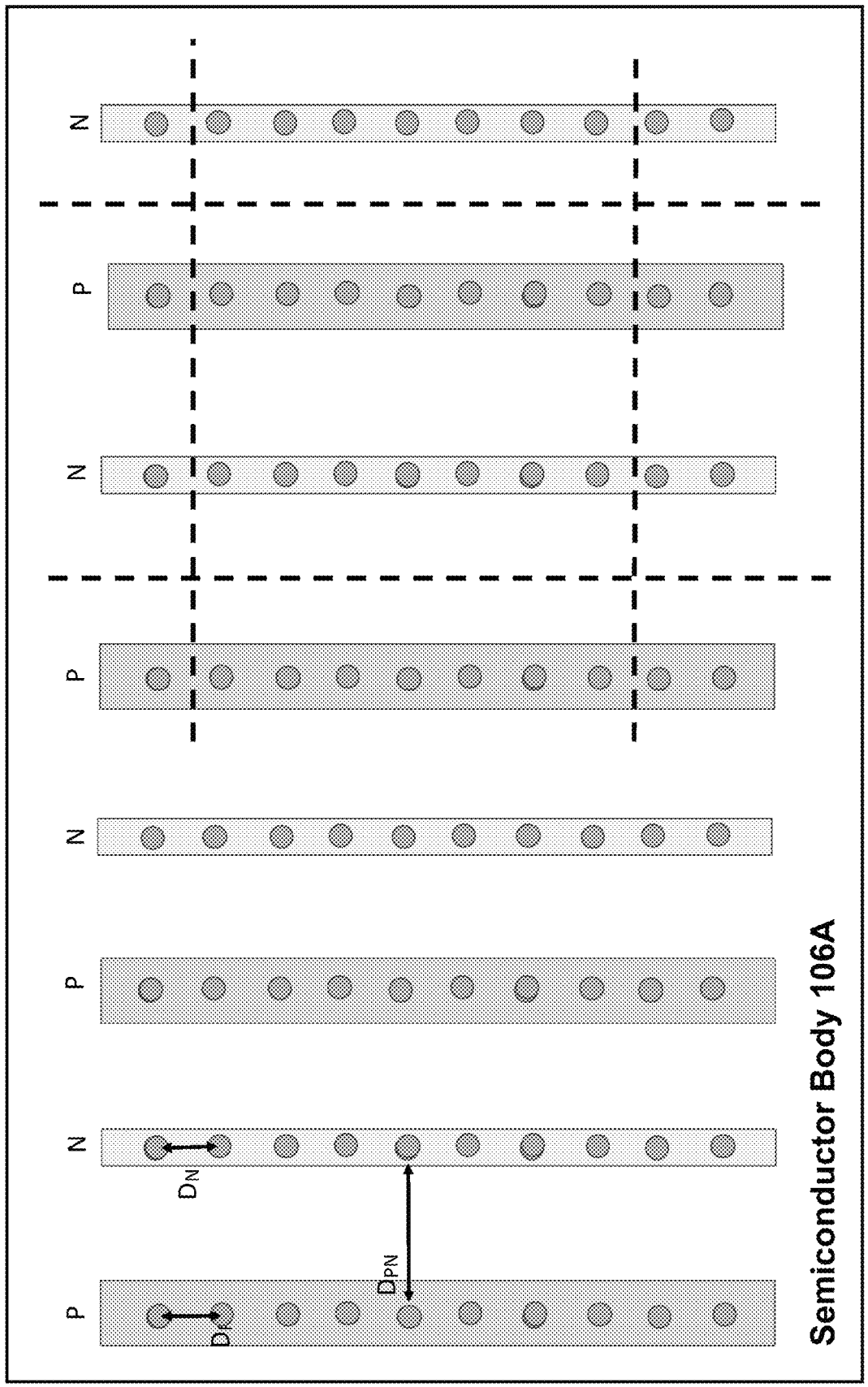

FIGS. 6A and 6B are bottom views of a semiconductor body (106A and 106B, respectively) according to PV device embodiments of the present invention where interdigitated positive and negative electrodes protrude out of the bottom of the substrate body, and wherein different separation/cutting patterns are used depending on a placement and arrangements of negative electrodes relative to corresponding positive electrodes. FIG. 6A shows that when opposite corresponding electrodes align, rectangular cuts are used to singulate the PV cell. FIG. 6B shows that when opposite corresponding electrodes do not align, diagonal cuts are used to singulate the PV cell.

Figure 8A:
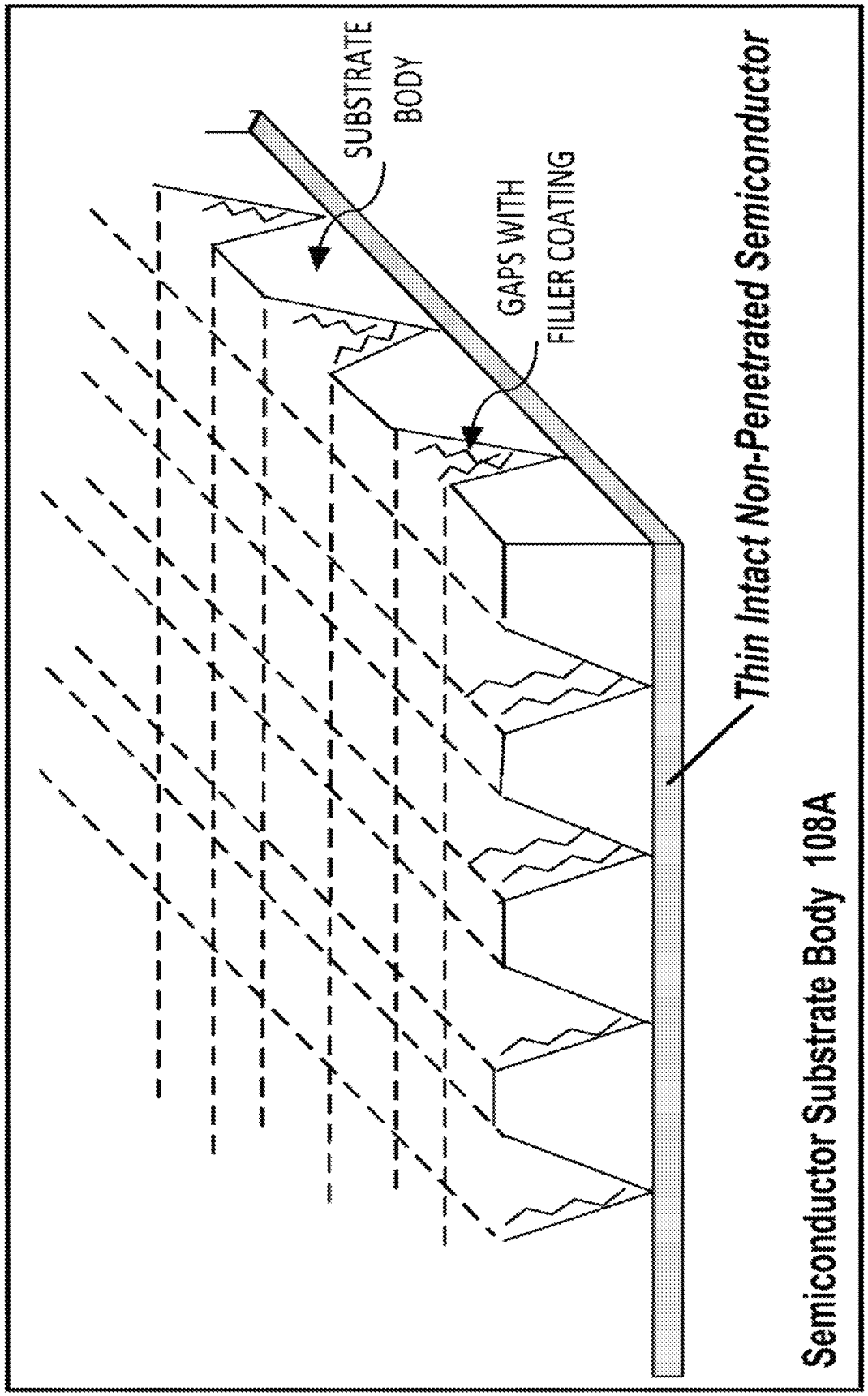
FIG. 8A is a perspective view of a semiconductor substrate body, singulated in accordance with some embodiments of the present invention, and including a gap filler (or a crater filler) in the form of a coating on the gap sidewalls which may coat just gap sidewalls or may fill up to 100% of the gap volume.
Figure 8B:
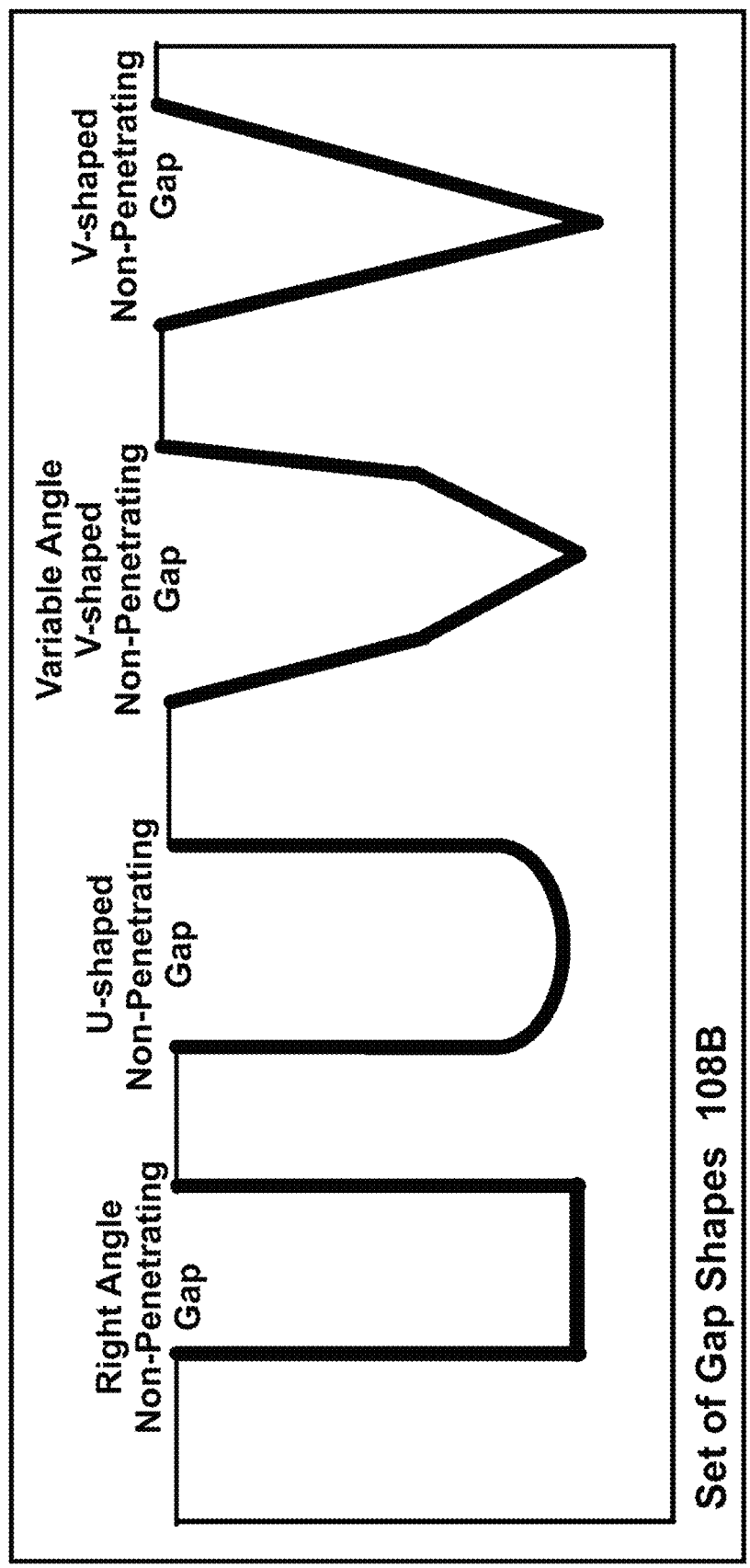
FIG. 8B is a side cross-section view of several optional semiconductor body gap formation geometries, which may be produced and/or used in accordance with some embodiments of the present invention, also including a coating layer.

Turning now to FIG. 7, there is shown a functional level illustration of a beam-based semiconductor separation system 107 in accordance with embodiments of the present invention; where a reactive substance is provided during beam separation and which reactive substance may react with portions of the semiconductor body exposed to the separator beam. This is only one possible option for gap filling in accordance with embodiments of the present invention. Every filler insertion or deposition known today or to be devised in the future may be applicable. FIG. 8A is a prospective view of a semiconductor substrate body 108A singulated in accordance with some embodiments of the present invention and including a gap filler in the form of a coating on the gap sidewalls. FIG. 8B is a side cross-section view of several optional semiconductor body gap formation geometries, shown as a set 108B of gap shapes, which could be produced and/or used in accordance with embodiments of the present invention also including a coating layer. The gap filling material may only coat the walls of the gap, may completely fill the gap, or fill the gap and over flow, thus creating a coating layer on the upper surface of the wafer.

FIGS. 9A through 9F includes three sets of top and side illustrations of a semiconductor substrate/wafer body, wherein each set illustrates a transition of semiconductor substrate/wafer body from an untoughened configuration into each of three separate toughened configurations in accordance with embodiments of the present invention. They show three options: (1) partial top separation/singulation, filling and coating; (2) top and bottom partial separation/singulation, filling and coating; and (3) complete separation/singulation, filling and coating. In case (2) the top and bottom grooving maps may be the same or different and the filler material used in the gaps on either side may be the same or different. For example, FIG. 9A shows a set 109A of wafers, in which: item 201 is a top view of a wafer before processing, and item 202 is its side view; item 203 is a top view of that wafer after partial singulation, and item 204 is its side view; and furthermore, FIG. 9B shows a set 109B of wafers, in which: item 211 is a top view of the partially singulated wafer (e.g., after incorporating a toughening agent into kerfs; the coating on the top layer is optional), wherein item 212 is a side view thereof, and wherein item 213 is a view of A-A section thereof. FIG. 9C shows a set 109C of wafers, in which: item 221 is a top view of a wafer before processing, and item 222 is its side view; item 223 is a top view of that wafer after top and bottom partial singulation, and item 224 is its side view; and furthermore, FIG. 9D shows a set 109D of wafers, in which: item 231 is a top view of the partially singulated wafer (e.g., after incorporating a toughening agent into top and bottom kerfs; the coating on the top layer is optional), wherein item 232 is a side view thereof, and wherein item 233 is a view of A-A section thereof. FIG. 9E shows a set 10E of wafers, in which: item 241 is a top view of a wafer before processing, and item 242 is its side view; item 243 is a top view of that wafer after full singulation, and item 244 is its side view; and furthermore, FIG. 9F shows a set 109F of wafers, in which: item 251 is a top view of the fully singulated wafer (e.g., after incorporating a toughening agent into kerfs; the coating on the top layer is optional), wherein item 252 is a side view thereof, and wherein item 253 is a view of A-A section thereof.

Figure 10A:
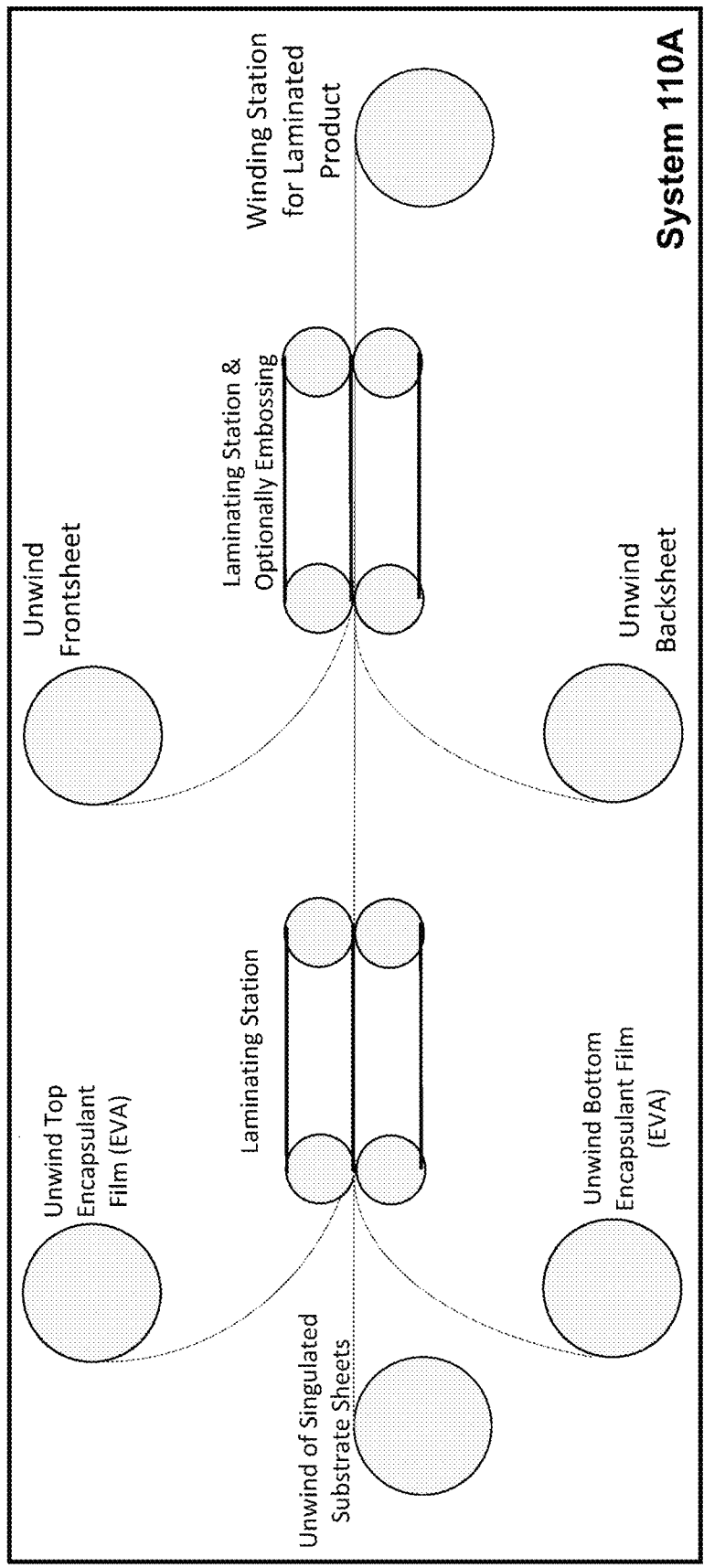
FIG. 10A is a functional block level illustration of a photovoltaic (PV) related embodiment of the present invention, wherein separated/singulated substrates, optionally on support sheets, are encapsulated within top and bottom EVA films and then within top and bottom polymer sheets, optionally with forming (e.g., embossing, etching, machining) of optics on the top sheet.

Turning now to FIG. 10A, there is shown a functional block level illustration of a system 110A for producing a Photovoltaic (PV) related embodiment of the present invention wherein separated/singulated/grooved substrates, optionally on support sheets, are encapsulated within top and bottom EVA films (as an example of an encapsulating material) and then within top and bottom polymer sheets. Materials other than polymer sheets may be used. The polymer sheets are optionally formed (embossed, etched, machined, ablated) with concentrating optics on the top sheet. FIG. 10B is a sideview illustration of a clear polymer embossing assembly 110B to provide micro or mini lenses on a top sheet covering a toughened PV cell in accordance with embodiments of the present invention. FIG. 10C is a sideview illustration of an array 110C of micro PV cells toughened, encapsulated and covered with a micro-lens embossed top sheet in accordance with embodiments of the present invention. Illustration 10C demonstrates an embodiment where asymmetric concentratic micro-lenses may be used in correspondence to angle of solar radiation.

In some embodiments, the manufacturing process may include operations of cleaning or brushing or washing or washing-away, or otherwise removing or discarding of, particles or residue material(s) that resulted from the removal treatment (e.g., due to dicing, grooving, cutting, or the like). Such particles or residue, and/or the material(s) that was or were removed in order to create gaps or craters or tunnels, may be washed away or washed out, or brushed away or brushed out, or may be blown away via air blasts, or may be shaken away by shaking or vibrating, or may be cleaned away or removed or discarded by applying a laser beam or a laser-based particle removal process (e.g., optionally utilizing a different type of laser than the laser utilized for grooving or cutting), or by temporarily dipping the materials in a bath or container of liquid(s) for cleaning purposes (such as ultrasonic bath), or may otherwise be removed or discarded.

For demonstrative purposes, some portions of the discussion above or herein, and/or some of the drawings, may relate to (or may demonstrate) a single type of pattern or a single type of patterning that is performed with regard to an entire wafer or an entire set or array of PV cells or other semiconductor device(s); however, these are only non-limited examples, and some embodiments may utilize or may features two or more different patterns within (or applied to) a single wafer or a single array of PV cells or other semiconductor devices. For example, a first region of a wafer may be manufactured to have gaps or grooves or craters in accordance with a first pattern (e.g., a crisscross pattern, or a pattern of horizontal lines intersecting with vertical lines), whereas a second region of that same wafer may feature gaps or grooves or craters in accordance with a second, different, pattern (e.g., a zigzag pattern; or a pattern of curved lines; or a pattern of horizontal lines that intersect with diagonal lines). Similarly, a first region may comprise gaps or grooves or craters at a first density (e.g., N gaps or N grooves or N craters per square centimeter), whereas a second, co-located region or nearby region or neighboring region may feature gaps or grooves or craters at a second density (e.g., 2N or 3N or 5N gaps or grooves or craters per square centimeter). Similarly, the density of lines or other geometrical shapes that are formed by such gaps or grooves or craters, may differ between or among different regions of the same wafer or array of PV cells. This is not merely a design feature, but rather, a functional feature; for example, a single surface or wafer or device or final product, may thereby be adapted to have different levels of rigidity or rigidness or flexibility or elasticity or toughness in different regions, to achieve particular functional goals. For example, a first region or component of the final product may be manufactured with a greater number or density of gaps or craters, or a first particular pattern thereof, to enable a greater level of mechanical flexibility at that region; whereas a second region or component of the final product may have a smaller number or density of gaps or craters, or a second particular pattern thereof, to enable a greater level of mechanical rigidity of said second region or a reduced level of mechanical flexibility there.

In some embodiments, gaps or grooves or craters or pockets or recesses or basins or islands may be arranged or created in a pattern other than crisscross, or other than horizontal lines that intersect at 90 degrees with vertical lines. For example, some embodiments may utilize a pattern of gaps or grooves or craters, in which a first set of generally parallel lines intersect at a particular angel (e.g., not a right angle) with a second set of generally parallel lines; or intersect with a set of curved lines; or the like.

In some embodiments, a manufactured wafer or PV cells array, or other semiconductor device, may comprise multiple layers such that a top layer thereof expands when it is being curved or bent, whereas a bottom layer thereof shrinks or contracts when it is curved or bent; or vice versa. Accordingly, the grooving, cutting, gap creation, and patterning in the manufacturing process, may be configured in advance to accommodate such mechanical expansion or mechanical contraction of layer(s); and may optionally utilize different patterns in different regions, and/or different density of gaps or grooves in different regions, and/or different types or shapes of gaps or grooves or craters or tunnels at different regions, to ensure that such expansion or contraction are enabled.

One or more laser processes, or laser-based processes or operations, that are described above and/or herein, may be performed at one or more different stages of the manufacturing process. For example, laser treatment or cutting or grooving may be performed as an initial operation or as a first operation or as a preparation operation in the manufacturing process; and/or as an operation performed during the manufacturing process itself; and/or as part of post-processing or post-manufacturing operations; and/or as part of cleaning operations or as part of residue removal operations; or by applying the laser, selectively, to one or more layer(s) and not to other layers, or selectively to one or more particular encapsulant layers or encapsulant materials (or to all of them), and/or for the manufacturing of connectors or electrical connectors, or as an operation that precedes or accompanies or follows one or more other operations (e.g., soldering, low temperature soldering, SMT soldering or mounting, hot-air soldering, reflow soldering using a reflow oven or a reflow machine, soft soldering which uses tin-lead alloy as filler metal, or the like). In some embodiments, laser treatment may be applied selectively only to one or more layer(s) and not to other layer(s), and/or to only particular regions. In some embodiments, the laser treatment may operated selectively on an inner layer or on a bottom layer, while passing through yet not necessarily treating or affecting one or more layer(s) above the treated layer(s), for example, selectively laser-treating only the silicon layer and not other layers above it and/or below it.

In some embodiments, a single encapsulant layer may be utilized, at or near the bottom part of the manufactured module. In other embodiments, a single encapsulant layer may be utilized, at or near the top part of the manufactured module. In other embodiments, two or more encapsulant layers may be utilized, at two (or more) different regions or portions of the manufactured module; such as, one encapsulant layer at or near the bottom part of the manufactured module, and another encapsulant layer at or near the top part of the manufactured module. Such encapsulant layers may include or may be, for example, thermoplastic polyolefin (TPO) encapsulants, Polyolefin elastomer (POE), or other suitable materials.

In some embodiments, one or more layers of fiberglass or glass-fiber may be used or added or connected, or may be an integral part of the manufactured module. For example, a single fiberglass or glass-fiber layer may be utilized, at or near the bottom part of the manufactured module. In other embodiments, a single fiberglass or glass-fiber layer may be utilized, at or near the top part of the manufactured module. In other embodiments, two or more fiberglass or glass-fiber layers may be utilized, at two (or more) different regions or portions of the manufactured module; such as, one fiberglass or glass-fiber layer at or near the bottom part of the manufactured module, and another fiberglass or glass-fiber layer at or near the top part of the manufactured module. The fiber glass or glass-fiber components may be embedded in epoxy and/or polyester and/or POE or other stretchable/compressible polymer and/or other thermosetting or thermoplastic matrices or arrays or materials.

In some embodiments, one or more layers of carbon-fiber may be used or added or connected, or may be an integral part of the manufactured module. For example, a single carbon-fiber layer may be utilized, at or near the bottom part of the manufactured module. In other embodiments, a single carbon-fiber may be utilized, at or near the top part of the manufactured module. In other embodiments, two or more carbon-fiber layers may be utilized, at two (or more) different regions or portions of the manufactured module; such as, one carbon-fiber layer at or near the bottom part of the manufactured module, and another carbon-fiber layer at or near the top part of the manufactured module. The carbon species and/or carbon-fiber components may be embedded in epoxy and/or polyester and/or POE or other stretchable/compressible polymer and/or other thermosetting or thermoplastic matrices.

In some embodiments, the above-mentioned operations, or some of them, may be performed as (or in addition to) a pre-molding process, and/or may be performed as (or in addition to) a post-molding process. In some embodiments, the manufacturing of the module or the array of PV cells may be performed as part of (or in conjunction with) a particular molding process, in which a particular non-planar three-dimensional shape (e.g., a roof of a car) is utilized to create a mold, with PV cells being placed thereon.

In some embodiments, the manufacturing process may comprise doping and/or pre-doping and/or post-doping, of one or more layer(s) or components or regions, and particularly of the silicon layer. For example, a p-type PV cell may be manufactured, utilizing a positively charge (p-type) silicon base. In a demonstrative example, a wafer is doped with boron; the top of the wafer is then negatively doped (n-type) with phosphorus, thereby helping to form the p-n junction that enables the flow of electricity in the PV cell. In other embodiments, an n-type PV cell may be manufactured, with the side that is n-doped acting as the basis of the PV cell; optionally providing higher efficiency, or being more immune to Light Induced Degradation (LID). In some embodiments, the doping may be performed before the cutting or grooving or crater creation or gap creation. In other embodiments, the doping may be performed after the cutting or grooving or crater creation or gap creation.

In some embodiments, automatic manufacturing using rolls, with optional roll-to-roll automation, may be used. In other embodiments, utilization of such rolls may be optional; and the manufacturing process may avoid using rolls or rolled materials, at all or partially, and instead may utilize planar materials, planar layers, discrete components that are set and/or placed and/or mounted and/or connected and/or glued and/or soldered, and then the process is repeated for additional wafers or modules or arrays which are then inter-connected, and/or by using other suitable processes. In some embodiments, the process may be divided into parts, which are conducted in a-continuous mode, non-continuous mode, semi continuous mode (e.g. step-and-repeat), and/or in a batch mode. Each of these types of processes may be implemented to include between 0% and 100% of the overall process.

In some embodiments, stringing and tabbing of PV cells or PV modules may be performed by a tabber and stringer machine, or other suitable welding machine, which may automatically or semi-automatically join or connect PV cells to each other; optionally using a flat ribbon to form the required strings for the PV module, while reducing to minimum the mechanical and/or thermal stress. In some embodiments, connections between PV cells or PV modules may be performed in one or more suitable ways, for example, using welding, soldering, utilizing hot air and/or infra-red (IR) radiation or light, gluing, bonding, adhesive stickers, or the like. In some embodiments, one or more layers of hot or heated adhesive or glue or bonding material(s) may be applied, on top of the top layer and/or under the bottom layer and/or in particular regions or areas (e.g., selectively, at particular regions that are estimated or are planned to subsequently be curved or bent). Optionally, fiber glass or glass-fiber or carbon-fiber layer(s) may be added or used; as well as one or more glass layers or other transparent layer(s), which may contribute to toughening the module or to providing additional support or rigidity to particular regions thereof.

In some embodiments, optionally, a manufactured wafer or PV cells array or PV module may have reduced-size properties during some of the production operations, such as two or three or more of discrete wafers or discrete PV cell arrays are then soldered or connected together in series. For example, instead of manufacturing a single wafer or a single PV cells module having a total length of 120 millimeters, three smaller wafers or modules (each one having a length of 40 millimeters) may be produced separately, or six smaller wafers or modules (each one having a length of 20 millimeters) may be produced separately; and such discrete wafers or modules may then be connected in series, to thereby produce a module that supports or that provides a greater electrical voltage and a lower electrical current. In other embodiments, such discrete wafers or modules may be connected in parallel to each other, rather than in series; or, may be connected firstly in series and then multiple modules may be connected to each other in parallel; in order to achieve desired targets of voltage or current. In some embodiments, shingling connections may be used between or among adjacent wafers or modules, or singled cells or shingled modules may be connected to each other; whereas, in some embodiments, seamless soldering may be used, or other suitable types of mechanical connection and/or electrical connection of cells or cell-arrays or wafers or PV modules.

Some embodiments may be used for manufacturing PV cells or PV modules, or an array or matrix or PV cells or PV micro-cells, that are suitable for utilize on top of roofs, walls, roofs of buildings, roofs of vehicles; or as a roof shingle; or as a wall or side-wall or side-panel of a building or other construction object; or that are suitable for being part of, or being on top of, a car or truck or vehicle, a golf cart or a "club cart", a high-speed or a low-speed electric vehicle, a work vehicle, a tractor, a lift, a crane, a scooter, a mobility scooter, an electric scooter, a motorcycle, a motorbike, a wheelchair, an autonomous vehicle, a self-driving or self-operating vehicle, a remotely-controlled vehicle, an airplane, an aircraft, a drone, an Unmanned Aerial Vehicle (UAV), a self-flying or self-operating drone or UAV or aircraft, a remotely-controlled drone or UAV or aircraft, a satellite, a spaceship, a space shuttle, a train, a wagon or a car of a train, a ship or a boat or other watercraft, or other suitable devices.

Some embodiments of the present invention operate to replace conventional PV cells or conventional PV modules, which are typically easily breakable or which may comprise an easily breakable wafer, with novel and inventive PV cells and PV modules that have reduce breakability properties; for example, by introducing patterned cutting or grooving or gaps or craters in the product (e.g., particularly in the silicon layer, but may also be the silicon layer as well as a top-sheet or a further protecting layer such as PET, ETFE, PVDF, other topsheet materials, glass or fiber glass that is cut to the same dimension of the silicon layer under it, or the like), thereby creating an array or matrix or other arrangement of smaller PV cells which are more resistant to mechanical pressures and/or are less breakable upon application of force or pressure. An electrically-conducting back-sheet or mesh or other connection layer, or other tabbing technique or connecting technique for joining PV cells, may ensure that the electrical conductors are not disrupted and are not disturbed, located (for example) at the bottom layer of the PV module.

In accordance with the present invention, craters or gaps or recesses or pockets or cavities or tunnels or grooves or basins, which are created in accordance with a pre-defined pattern in or at the wafer or substrate to segment it into an array or matrix or batch or arrangement of inter-connected micro PV cells, are formed particularly by a laser beam or by laser cutting or by laser etching or other laser-based process; and are not formed via Deep Reactive Ion Etching (DRIE), and are not formed via a DRIE based corrugation technique. The Applicants have realized that the specific utilization of laser-based or beam-based processes to introduce and form such craters, and that the utilization of such laser-formed craters or recesses, may result in improved or enhanced performance and/or properties of the final product, relative to the utilization of DRIE-based craters or corrugation-based craters. The Applicants have also realized that in some embodiments, utilization and formation of laser-based or beam-based craters or recesses or grooves or basins or pockets may be preferred (e.g., relative to corrugation based methods, or DRIE based methods), as it may allow a faster production process and/or may allow creation of more accurate three-dimensional structures or two-dimensional patterns with increased precision. However, it is clarified that some embodiments of the present invention may utilize non laser-based methods, such as DRIE based methods or corrugation or chemical processes, to form such craters; and such methods may be used, in some embodiments, instead of using the laser-based or beam-based methods, or even in addition to them (e.g., before or after them). Similarly, dicing techniques, as well as various cutting techniques or mechanical grooving processes, may be used in some embodiments, instead of or in addition to the above-mentioned processes or some of them.

Some embodiments of the present invention particularly utilize a wafer or a substrate that has a sub-200 micron thickness, such as, a wafer thickness or a substrate thickness that is smaller than 200 microns, or a wafer thickness or a substrate thickness that is smaller than 190 microns, a wafer thickness or a substrate thickness that is smaller than 180 microns, a wafer thickness or a substrate thickness that is smaller than 170 microns, a wafer thickness or a substrate thickness that is smaller than 160 microns, a wafer thickness or a substrate thickness that is smaller than 150 microns, a wafer thickness or a substrate thickness that is smaller than 140 microns; or a wafer thickness or a substrate thickness that is 150 or 160 or 170 or 180 microns. The Applicants have realized that the specific utilization of such thickness values may contribute, in some embodiments, to improved or enhanced performance and/or properties of the final product. However, it is clarified that other embodiments of the present invention may utilize or may include wafers having other suitable thickness values or ranges-of-values; for example, a wafer having thickness of 200 or 220 or 240 or 250 microns, or a wafer having a sub-250 micron thickness, or a wafer having a sub-300 microns thickness, or a wafer having a sub-400 microns thickness, or a wafer having a sub-500 microns thickness; although, in some embodiments, utilization of thinner wafer(s) may be preferred in order to reduce the weight and/or dimension and/or form-factor of the final product, and/or in order to reduce costs, and/or in order to reduce the amount of material that needs to be removed or treated or discarded in order to reach a particular implementation of the final product.

In accordance with some embodiments of the present invention, division or segmentation of the wafer or substrate is performed in two or more directions, or along two or more axes, or along two or more lines, or along (or in accordance with) two or more patterns or routes (which may not necessarily be linear or straight; or which may be curved, or may have other suitable shape). Furthermore, the division or the segmentation need not necessarily be perpendicular to the direction of the electrical contacts; and/or need not be only perpendicular to said direction; but rather, may be slanted or angled or diagonal relative to the general direction of the electrical contacts or relative to a plane in which the electrical contacts are located. The Applicants have realized that such multiple-dimension or multiple-direction segmentation, and/or such particular non-perpendicular direction(s) of segmentation or division, are not merely a design choice; but rather, they may contribute, in some embodiments, to improved or enhanced performance and/or properties of the final product.

In some embodiments of the present invention, the recesses or craters or pockets or basins that are formed in the wafer, are non-elongated; such that the resulting produce has an array or a group of "islands" or "discrete islands", rather than having "strips" or "elongated strips". In some embodiments, the top area of each micro PV-cell may have a horizontal axis and a vertical axis, such that the ratio between them is, for example, not more than 1.25, or not more than 1.50, or not more than 1.75, or not more than 2, or not more than 3, or not more than 5. The Applicants have realized that utilization of such ratio is not merely a design choice; but rather, it may contribute, in some embodiments, to improved or enhanced performance and/or properties of the final product.

In accordance with some embodiments of the present invention, the electrical contacts of the micro PV-cells, or the electrical contacts that are laid beneath the wafer or at the bottom portion thereof, are not exposed by the laser-based or beam-based formation of craters or recesses or basins or pockets; rather, in some embodiments, such formation only partially (and not fully) penetrates downwardly but still leaves non-penetrated silicon at the bottom, and does not expose the electrical contacts. The Applicants have realized that utilization of such partial and non-entire penetration may contribute, in some embodiments, to improved or enhanced performance and/or properties of the final product.

Embodiments of the present invention may be utilized with a variety of schemes or patterns of electrical contacts, which may be, for example, inter-digitated back contacts (IBC), non-interdigitated pattern or scheme of contacts, a contact scheme utilizing multiple parallel lines, grid contacts or grid-like contacts, a backsheet or a wafer having or comprising an array or a pattern of exposed dots for electrical contacting, or the like.

Embodiments of the present invention may be utilized in conjunction with a single wafer; or in conjunction with a wafer or a panel that is comprised or composed of several PV cells. Additionally or alternatively, some embodiments may be utilized on conjunction with a continuous roll-to-roll process, or other scaled-up production methods or processes.

In some embodiments, an apparatus comprises a segmented PhotoVoltaic (PV) cell array, comprised of a plurality of micro PV cells. The PV cell array comprises one of: (I) a single wafer that is segmented via a plurality of craters, (II) a portion of a single wafer that is segmented via a plurality of craters, (III) a set of two or more inter-connected wafers that are segmented via a plurality of craters. Said wafer is a wafer selected from the group consisting of: (i) a composite metallized wafer having an underlying metallization layer, wherein each crater penetrates an entirety of the non-metalized layers of said wafer but does not penetrate said underlying metallization layer of the wafer; (ii) a semiconductor wafer, wherein each crater penetrates into not more than 99 percent of an entire depth of said semiconductor wafer. Each crater creates a physical recess separation between two neighboring micro PV cells, which are still inter-connected to each other but only across some and not all of their height. Said micro PV cells are connected to each other, mechanically and electrically.

In some embodiments, each micro PV cell has a top surface area that is smaller than one square centimeter; wherein segmentation of said single wafer, and wherein inclusion of craters among said micro PV cells, inhibits or reduces mechanical breakage of said PV cell array.

In some embodiments, at least one of said craters is a U-shaped crater; wherein segmentation of said single wafer, and wherein inclusion of craters among said micro PV cells, inhibits or reduces mechanical breakage of said PV cell array.

In some embodiments, at least one of said craters is a V-shaped crater; wherein segmentation of said single wafer, and wherein inclusion of craters among said micro PV cells, inhibits or reduces mechanical breakage of said PV cell array.

In some embodiments, at least one of said craters is generally V-shaped, but has at least a first inner sidewall that is slanted at a first slanting angle, and has a second inner sidewall that is slanted at a second, different, slanting angle; wherein segmentation of said single wafer, and wherein inclusion of craters among said micro PV cells, inhibits or reduces mechanical breakage of said PV cell array.

In some embodiments, said segmented PV cell array, due to segmentation of said single wafer and due to inclusion of said craters among said micro PV cells, is tougher and is less breakable relative to a non-segmented PV cell unit having the same overall area.

In some embodiments, said micro PV cells and the craters that separate them, are arranged in a crisscross pattern of (i) a first set of straight parallel lines, that intersect perpendicularly with (ii) a second set of straight parallel lines; wherein said pattern contributes to reducing mechanical breakability of said PV cell array.

In some embodiments, said micro PV cells and the craters that separate them, are arranged in a pattern of (i) a first set of straight parallel lines, that intersect diagonally and non-perpendicularly with (ii) a second set of straight parallel lines; wherein said pattern contributes to reducing mechanical breakability of said PV cell array.

In some embodiments, said micro PV cells and the craters that separate them, are arranged in a pre-defined pattern which comprises at least one non-straight line; wherein said pattern contributes to reducing mechanical breakability of said PV cell array.

In some embodiments, said craters are completely filled with a filler material, from a lowest point of each said crater, upwardly to and being flush with a top surface of said single wafer.

In some embodiments, said craters are only partially filled, and not completely filled, with a filler material, from a lowest point of each said crater, upwardly towards but not reaching a top surface of said single wafer.

In some embodiments, inner walls of said craters are coated with an inner coating material, which coats the inner walls of said craters but does not entirely fill said craters.

In some embodiments, said filler material has pre-defined compressible properties that provide a particular level of flexibility to said PV cell array.

In some embodiments, craters of a first region of said PV cell array is filled, partially or entirely, with a first filler material, which provides a first level of flexibility to said first region of the PV cell array; wherein craters of a second region of said PV cell array is filled, partially or entirely, with a second, different, filler material, which provides a second, different, level of flexibility to said second region of the PV cell array.

In some embodiments, a first region of said PV cell array features a first pre-defined spatial pattern of PV micro-cells and craters, which provides a first level of flexibility to said first region of the PV cell array; wherein a second region of said PV cell array features a second pre-defined spatial pattern of PV micro-cells and craters, which provides a second, different, level of flexibility to said second region of the PV cell array.

In some embodiments, a first region of said PV cell array has a first particular density of craters per unit-of-area, which provides a first level of flexibility to said first region of the PV cell array; wherein a second region of said PV cell array has a second, different, particular density of craters per unit-of-area, which provides a second, different, level of flexibility to said second region of the PV cell array.

In some embodiments, each crater has a particular depth, which is at least 10 percent of the thickness of said single wafer; wherein said particular depth of each crater contributes to reduction of mechanical breakability of said PV cell array.

In some embodiments, each crater has a particular depth, which is at least 25 percent of the thickness of said single wafer; wherein said particular depth of each crater contributes to reduction of mechanical breakability of said PV cell array.

In some embodiments, each crater has a particular depth, which is at least 50 percent of the thickness of said single wafer; wherein said particular depth of each crater contributes to reduction of mechanical breakability of said PV cell array.

In some embodiments, each crater has a particular width, which is in a range of 10 to 50 percent of the thickness of said single wafer; wherein said particular width of each crater contributes to reduction of mechanical breakability of said PV cell array.

In some embodiments, each crater has a particular width, which is in a range of 10 to 25 percent of the thickness of said single wafer; wherein said particular width of each crater contributes to reduction of mechanical breakability of said PV cell array.

In some embodiments, said craters are top-side craters that are formed downwardly relative to a top surface of said single wafer, and that do not reach a bottom surface of said single wafer; wherein said PV cell array further comprises additional craters, which are bottom-side craters, which extend upwardly from the bottom surface of said single wafer towards but not reaching the top surface of said single wafer; wherein said top-side craters and said bottom-side craters, contribute to reduction of mechanical breakability of said PV cell array.

In some embodiments, each top-side crater has a first crater-shape; wherein each bottom-side crater has a second, different, crater-shape; wherein inclusion in the same PV cell array, of (i) said top-side craters having the first crater-shape and (ii) said bottom-side craters having the second crater-shape, contributes to reduction of mechanical breakability of said PV cell array.

In some embodiments, each top-side crater stores, partially or entirely, a first filler material; wherein each bottom-side crater stores, partially or entirely, a second, different, filler material; wherein inclusion in the same PV cell array, of (i) said top-side craters having the first filler material and (ii) said bottom-side craters having the second filler material, contributes to reduction of mechanical breakability of said PV cell array.

In some embodiments, said top-side craters are arranged in a first spatial pattern; wherein said bottom-side craters are arranged in a second, different, spatial pattern; wherein inclusion in the same PV cell array, of (i) said top-side craters arranged in the first spatial pattern and (ii) said bottom-side craters arranged in the second spatial pattern, contributes to reduction of mechanical breakability of said PV cell array.

In some embodiments, said top-side craters are arranged in a first density of craters per unit-of-area; wherein said bottom-side craters are arranged in a second, different, density of craters per unit-of-area; wherein inclusion in the same PV cell array, of (i) said top-side craters arranged in the first density and (ii) said bottom-side craters arranged in the second density, contributes to reduction of mechanical breakability of said PV cell array.

In some embodiments, a vertical thickness of each micro PV cell is smaller than one millimeter.

In some embodiments, a vertical thickness of each micro PV cell is smaller than 0.3 millimeter.

In some embodiments, at least some of the micro PV cells in said PV cell array, have at least one external side-wall that is slanted non-perpendicularly relative to a top surface of said single wafer; wherein inclusion of slanted side-walls of at least some of the micro PV cells, contributes to reduction of mechanical breakability of said PV cell array.

In some embodiments, at least some of the micro PV cells in said PV cell array, have at least one external side-wall that is curved; wherein inclusion of curved side-walls of at least some of the micro PV cells, contributes to reduction of mechanical breakability of said PV cell array.

In some embodiments, the micro PV cells of said PV cell array are covered with a transparent protective top-sheet.

In some embodiments, the micro PV cells of said PV cell array are covered with a transparent top-sheet having optical concentrators that concentrate light towards particular active regions of the micro PV cells.

In some embodiments, the micro PV cells of said PV cell array are mechanically inter-connected to each other via a bendable support sheet; wherein inclusion of said bendable support sheet contributes to (i) reduction of mechanical breakability of said PV cell array, and (ii) increase of mechanical flexibility of said PV cell array.

In some embodiments, each micro PV cell comprises a positive electrode and a negative electrode to output electric current generated by each such micro PV cell; wherein an electric conductor mesh connects, electrically, said micro PV cells and generates an aggregated electric output.

In some embodiments, said craters are laser-cut grooves that are formed in particular places of said wafer.

In some embodiments, said craters comprise corrugation-formed craters.

In some embodiments, said craters comprise beam-based craters formed via a beam of light or radiation or laser.

In some embodiments, said craters comprise DRIE-based craters that are formed via Deep Reactive Ion Etching (DRIE).

In some embodiments, said craters comprise craters that are formed via dicing or cutting.

In some embodiments, said craters comprise craters that are formed via dicing or cutting, wherein said dicing or cutting is performed along at least two different directions.

In some embodiments, said craters comprise craters that are formed via dicing or cutting; wherein said dicing or cutting is performed along at least two different directions, which include at least one dimension that is non-perpendicular to a plane that holds electrical contacts of said micro PV-cells.

In some embodiments, said craters comprise craters that are formed via dicing or cutting; wherein said dicing or cutting is performed along at least two different directions, which include at least one curved or non-straight direction.

In some embodiments, each micro PV-cell is a non-elongated micro PV-cell; wherein a ratio between (i) a horizontal length of a top area of each micro PV-cell, and (ii) a vertical length of the top area of each micro PV-cell, is not more than two-to-one.

In some embodiments, said apparatus is a non-planar solar panel.

In some embodiments, said apparatus is a roof of a vehicle.

In some embodiments, said apparatus is a roof of a building.

In some embodiments, said apparatus is a roof shingle.

In some embodiments, said apparatus is a roof or a side-panel of a device selected from the group consisting of: a drone, an aircraft, a watercraft, a spaceship, a satellite.

In some embodiments, an apparatus includes a segmented PhotoVoltaic (PV) cell array, comprised of a plurality of micro PV cells; wherein the PV cell array comprises one of: (I) a single wafer that is segmented via a plurality of craters, (II) a portion of a single wafer that is segmented via a plurality of craters, (III) a set of two or more inter-connected wafers that are segmented via a plurality of craters; wherein said wafer is a wafer selected from the group consisting of: (i) a composite metallized wafer having an underlying metallization layer, wherein each crater penetrates an entirety of the non-metalized layers of said wafer but does not penetrate said underlying metallization layer of the wafer; (ii) a non-metallized semiconductor wafer, wherein each crater penetrates into 100 percent of the depth of said semiconductor wafer. Each crater creates a physical recess separation between two neighboring micro PV cells, which are still inter-connected to each other but only across some and not all of their height. The micro PV cells are connected to each other, mechanically and electrically.

Some embodiments provide a flexible and/or rollable and/or foldable Photovoltaic (PV) cell or PV device, having enhanced or improved properties of mechanical impact absorption, and having resilience or increased resilience or durability or increased durability against mechanical shocks, bending, folding, rolling, mechanical impacts, or other mechanical forces; and having the ability to better withstand such mechanical shocks or impact or forces without breaking and/or without becoming damaged and/or without damaging its operational functionality.

In some embodiments, the PV cell or PV device comprises: a semiconductor body that is comprised at least partially (or, that is comprised entirely and exclusively) of a semiconductor material (e.g., semiconductor substrate, semiconductor wafer), with a form-factor that includes a top surface, a bottom surface, and at least one sidewall.

In some embodiments, the semiconductor body, and/or the semiconductor substrate, and/or the wafer or semiconductor wafer, in which gaps or craters or non-transcending gaps are formed to dissipate and/or absorb mechanical shocks and impacts, is free-standing or freestanding, is carrier-less and is not supported by any carrier or film or foil or metal film or metal foil or elastic film or elastic foil.

In some embodiments, the semiconductor body, and/or the semiconductor substrate, and/or the wafer or semiconductor wafer, in which gaps or craters or non-transcending gaps are formed to dissipate and/or absorb mechanical shocks and impacts, does not require (and is not connected to, and is not mounted on, and is not mounted beneath, and is not attached to) a carrier or a carrier layer or a metal layer or a film or a foil or an elastic foil or an elastic layer or a flexible layer or a flexible foil or a rollable foil or a rollable layer or a foldable layer or a foldable film or a foldable foil; but rather, the integrated gaps or craters or non-transcending gaps that are included in the semiconductor wafer or substrate or body operate to dissipate and/or absorb mechanical shocks and impact, and operate to provide to the PV cell or PV device the resilience and non-breaking durability against mechanical shocks and impacts, and operate to provide to the PV cell or PV device an ability to bend or to flex or to be flexibly bent or to fold or to roll or to be flexible and/or foldable and/or rollable, only by virtue of such gaps or craters or non-transcending gaps in the semiconductor body or wafer or substrate itself, and without the need to mount or place or connect or attach or glue individual PV cells or micro-cells onto (or beneath) a flexible foil or flexible film or other carrier or support layer.

In some embodiments, the semiconductor body, and/or the semiconductor substrate, and/or the wafer or semiconductor wafer, in which gaps or craters or non-transcending gaps are formed to dissipate and/or absorb mechanical shocks and impacts, does not require (and is not connected to, and is not mounted on, and is not mounted beneath, and is not attached to) a non-substrate layer and/or a non-substrate support layer and/or a non-substrate carrier layer and/or a non-substrate film or a non-substrate foil and/or a non-substrate flexible layer and/or a non-substrate metal layer and/or a non-substrate fully-conductive layer and/or a non-substrate rigid layer and/or a non-substrate flexible-and-rigid or rigid-flex layer and/or a non-substrate insulator layer.

In some embodiments, the semiconductor body, and/or the semiconductor substrate, and/or the wafer or semiconductor wafer, in which gaps or craters or non-transcending gaps are formed to dissipate and/or absorb mechanical shocks and impacts, does not require (and is not connected to, and is not mounted on, and is not mounted beneath, and is not attached to) a non-wafer layer and/or a non-wafer support layer and/or a non-wafer carrier layer and/or a non-substrate film or a non-wafer foil and/or a non-substrate flexible layer and/or a non-wafer metal layer and/or a non-wafer fully-conductive layer and/or a non-wafer rigid layer and/or a non-wafer flexible-and-rigid or rigid-flex layer and/or a non-wafer insulator layer.

In some embodiments, the semiconductor body, and/or the semiconductor substrate, and/or the wafer or semiconductor wafer, in which gaps or craters or non-transcending gaps are formed to dissipate and/or absorb mechanical shocks and impacts, does not require (and is not connected to, and is not mounted on, and is not mounted beneath, and is not attached to) a non-semiconductor layer and/or a non-semiconductor support layer and/or a non-semiconductor carrier layer and/or a non-semiconductor film or a non-semiconductor foil and/or a non-semiconductor flexible layer and/or a non-semiconductor metal layer and/or a non-semiconductor fully-conductive layer and/or a non-semiconductor rigid layer and/or a non-semiconductor flexible-and-rigid or rigid-flex layer and/or a non-semiconductor insulator layer.

In some embodiments, the semiconductor body, and/or the semiconductor substrate, and/or the wafer or semiconductor wafer, integrally includes a set of non-transcending gaps or "blind gaps", which penetrate only partially and not entirely into the wafer or substrate or semiconductor body, and which do not reach and do not exit or penetrate through both sides or both surfaces of the wafer or substrate or semiconductor body; and which exist and penetrate only in, or from, one side of the wafer or substrate or semiconductor body, either its top side or its bottom side but not both, or, either its top surface or bottom surface but not both; and this specific structure, realized the Applicants, provides the resilience against and/or the absorption of and/or the dissipation of mechanical shocks and impacts, and/or provides some or all of the capability to be flexible and/or rollable and/or flexible, and/or to modularly assume a non-planar structure or a curved structure or a convex structure or a concave structure.

In some embodiments, portions of semiconductor material (or semiconductor body, or semiconductor wafer) that are on opposite sides of a each such non-transcending gap or "blind gap" or crater, or that are immediately neighboring or bordering each such non-transcending gap or "blind gap" or crater, or that are immediately adjacent to each such non-transcending gap or "blind gap" or crater, become at least partially movable and/or flexible and/or rollable and/or foldable, relative to one another and/or relative to the general surface of the PV cell or the PV device; while a thin layer of the semiconductor body or semiconductor substrate or wafer remains intact and has no gaps and no craters and no holes and no "blind gaps" therein, located beneath those non-transcending gaps; and sch think layer is sufficiently thin to flex or to roll or to fold or to at least partially change its three-dimensional structure from an entirely-planar surface to a non-planar surface or a partially-curved structure; and due to physical displacement or physical movement of the semiconductor body (or wafer, or substrate) that is neighboring each such non-transcending gap, they dissipate and/or absorb and/or withstand mechanical stresses and/or shocks and/or impacts and/or forces that may be applied (intentionally, or unintentionally) to that PV cell or to that PV device or to that semiconductor body or wafer or substrate; without breaking, or without breaking apart, or without creating broken pieces or singulated pieces or entirely-separate pieces; and those non-transcending gaps or craters or "blind gaps" within the semiconductor body or substrate or wafer operate as crack propagation inhibitor or crack prevention mechanisms or crack withstanding mechanism.

In some embodiments, the non-transcending gaps or craters or "blind gaps", penetrate into not more than 99 percent of the entire thickness of the semiconductor substrate or body or wafer; and leave the remaining thickness intact and non-penetrated and non-singulated and non-separated, to maintain the entire structure of a single unified semiconductor substrate (or wafer or body) which is still a single non-singulated/non-separated/non-separable unit or PV device (rather than being a collection of discrete/separate micro PV cells that are then connected via an additional flexible layer or support film or support foil).

In some embodiments, the non-transcending gaps or craters or "blind gaps", penetrate into not more than 98 percent of the entire thickness of the semiconductor substrate or body or wafer; or penetrate into not more than 97 percent of the entire thickness of the semiconductor substrate or body or wafer; or penetrate into not more than 96 percent of the entire thickness of the semiconductor substrate or body or wafer; or penetrate into not more than 95 percent of the entire thickness of the semiconductor substrate or body or wafer; or penetrate into not more than 90 percent of the entire thickness of the semiconductor substrate or body or wafer; or penetrate into not more than 85 percent of the entire thickness of the semiconductor substrate or body or wafer; or penetrate into not more than 80 percent of the entire thickness of the semiconductor substrate or body or wafer; or penetrate into not more than 75 percent of the entire thickness of the semiconductor substrate or body or wafer; or penetrate into not more than 66 percent of the entire thickness of the semiconductor substrate or body or wafer; or penetrate into not more than 50 percent of the entire thickness of the semiconductor substrate or body or wafer. In some embodiments, the non-transcending gaps or "blind gaps" or craters as described above, leave the remaining thickness intact and non-penetrated and non-singulated and non-separated, The Applicants have realized that for some implementation purposes of some types of PV devices or PV cells, the above-mentioned particular range of penetration depth may be particularly suitable for providing the mechanical shock absorption and/or the mechanical forces dissipation and/or the mechanical resilience and/or the crack inhibition mechanism and/or to provide the capability for the entire PV cell or the entire PV structure to become foldable and/or rollable and/or flexible without breaking and/or without cracking and/or without being functionally damaged or functionally degraded.

In some embodiments, the non-transcending gaps or craters or "blind gaps", penetrate into at least 50 percent but not more than 99 percent of the entire thickness of the semiconductor substrate or body or wafer; or penetrate into at least 66 percent but not more than 99 percent of the entire thickness of the semiconductor substrate or body or wafer; or penetrate into at least 75 percent but not more than 99 percent of the entire thickness of the semiconductor substrate or body or wafer; or penetrate into at least 80 percent but not more than 99 percent of the entire thickness of the semiconductor substrate or body or wafer; or penetrate into at least 85 percent but not more than 99 percent of the entire thickness of the semiconductor substrate or body or wafer; or penetrate into at least 90 percent but not more than 99 percent of the entire thickness of the semiconductor substrate or body or wafer; or penetrate into at least 95 percent but not more than 99 percent of the entire thickness of the semiconductor substrate or body or wafer.

In some embodiments, the non-transcending gaps or craters or "blind gaps", penetrate into at least 50 percent but not more than 95 percent of the entire thickness of the semiconductor substrate or body or wafer; or penetrate into at least 66 percent but not more than 95 percent of the entire thickness of the semiconductor substrate or body or wafer; or penetrate into at least 75 percent but not more than 95 percent of the entire thickness of the semiconductor substrate or body or wafer; or penetrate into at least 80 percent but not more than 95 percent of the entire thickness of the semiconductor substrate or body or wafer; or penetrate into at least 85 percent but not more than 95 percent of the entire thickness of the semiconductor substrate or body or wafer; or penetrate into at least 90 percent but not more than 95 percent of the entire thickness of the semiconductor substrate or body or wafer.

In some embodiments, the non-transcending gaps or craters or "blind gaps", penetrate into at least 50 percent but not more than 90 percent of the entire thickness of the semiconductor substrate or body or wafer; or penetrate into at least 66 percent but not more than 90 percent of the entire thickness of the semiconductor substrate or body or wafer; or penetrate into at least 75 percent but not more than 90 percent of the entire thickness of the semiconductor substrate or body or wafer; or penetrate into at least 80 percent but not more than 90 percent of the entire thickness of the semiconductor substrate or body or wafer; or penetrate into at least 85 percent but not more than 90 percent of the entire thickness of the semiconductor substrate or body or wafer.

The Applicants have realized that for some implementation purposes of some types of PV devices or PV cells, the above-mentioned particular values or ranges-of-values of penetration depth or penetration thickness, may be particularly suitable for providing the mechanical shock absorption and/or the mechanical forces dissipation and/or the mechanical resilience and/or the crack inhibition mechanism and/or to provide the capability for the entire PV cell or the entire PV structure to become foldable and/or rollable and/or flexible without breaking and/or without cracking and/or without being functionally damaged or functionally degraded.

In some embodiments, the resulting PV cell or PV device is flexible and/or rollable and/or foldable and/or bendable, and is freestanding and is non-supported and/or carrier-less; and has enhanced or improved properties of mechanical impact absorption due to having those set of gaps or "blind gaps" or craters or non-transcending gaps in the semiconductor material or substrate or body or wafer.

In some embodiments, the flexible and/or rollable and/or foldable and/or bendable PV cell is comprised of a single semiconductor substrate or a single semiconductor wafer or a single semiconductor body or a single semiconductor layer, which is segmented into neighboring segments or neighboring areas or neighboring regions by those set of non-transcending gaps or "blind gaps" or craters, which are placed only at one side of the semiconductor body (or wafer, or substrate); and which do not penetrate all the way through it to the other side or to the other surface, and do not "peek" or appear on the other side of the semiconductor body or substrate or wafer; and which do not fully divide and do not fully separate and do not fully singulate and do not fully create a full-depth barrier or any all-the-way-gap between any two neighboring portions or regions of the semiconductor body or substrate or wafer.

In some embodiments, at least some of those craters or gaps or "blind gaps" or non-transcending gaps, that are only at one side of the semiconductor body or wafer or substrate, contain or are filled with (entirely, or fully, or at least partially) a gap filler material; having force absorption properties and/or mechanical forces absorption properties and/or material toughening properties, which provides mechanical shock absorption and/or dissipation, and which is formed of a material that provides chemical durability and/or thermal durability and/or and mechanical durability. Such filler material(s) may include one or more of, or a combination or a mixture of two or more of: polyolefin elastomer (POE), and/or thermoplastic olefin (TPO), and/or ethylene vinyl acetate (EVA), and/or thermoplastic urethane (TPU), and/or one or more flexible or semi-flexible thermoplastics and/or elastomers and/or polymers with shock absorbing properties or impact absorbing properties or other suitable fillers or additives.

In some embodiments, the set of non-transcending gaps within said semiconductor body or wafer or substrate extend in a pattern forming a PV cell having segments or regions or areas of said semiconductor body or wafer or substrate, that are not fully isolated from each other, and that do not have a full barrier or a full space or a fully separating cavity between them.

In some embodiments, each segment or region or area of the semiconductor body or wafer or substrate, that is neighboring to or is bordering with a gap or crater or "blind gap" or non-transcending gap, includes at least two electrode contacts that are connected to a different side of a PN junction within its respective segment (or area, or region) of the semiconductor body or wafer or substrate or PV cell or PV device. In some embodiments, each electrode contact is electrically connected to a different side of a PN junction within its respective segment of the semiconductor body.

In some embodiments, each segment or region or area of the PV cell or the PV device or semiconductor body or wafer or substrate, that is neighboring (or is surrounded by) two or three or four or more such gaps or "blind gaps" or craters, has a top-side surface which is a polygon selected from the group consisting of: (a) a square; (b) a rectangle; (c) a decagon; (d) a hexagon; (e) a heptagon; and (f) an octagon. Other suitable structures may be used. In some embodiments, optionally, each side of said polygon has a length in the range of 0.1 to 3 millimeters, or 0.1 to 5 millimeters, or 0.1 to 6 millimeters, or 0.1 to 10 millimeters, or 0.5 to 10 millimeters, or 1 to 10 millimeters, or 1 to 6 millimeters, or 0.5 to 5 millimeters, or other suitable size or dimensions.

In some embodiments, the bottom surface of each one of those segments or regions or areas, of the semiconductor body or wafer, has the same shape yet has different side lengths as the top surface thereof (e.g., such that each surface is formed as the same polygon but at different sizes or side-length; for example, a smaller top-side rectangular surface, and a larger bottom-side rectangular surface).

In some embodiments, a thickness of each segment or region or area of the semiconductor body or wafer or substrate, from the top surface to the bottom surface, is in a range of 0.01 to 5 millimeters, or in a range of 0.01 to 6 millimeters, or in a range of 0.01 to 10 millimeters, or in a range of 0.01 to 3 millimeters, or in a range of 0.05 to 10 millimeters, or in a range of 0.05 to 5 millimeters, or in a range of 0.1 to 10 millimeters, or in a range of 0.01 to 5 millimeters, or in a range of 0.1 to 6 millimeters, or in other suitable range of values.

In some embodiments, at least one sidewall of at least one such segment or region or area of the semiconductor body or wafer or substrate (or PV cell, or PV device) is at a slope relative to the top surface, and/or has a curved surface.

In some embodiments, sidewalls of at least one segment or region or area of the semiconductor body or wafer or substrate, that are neighboring those craters or gaps or "blind gaps" or non-transcending gaps, are coated with a material that is different from the material from which those segments or regions or areas (of the semiconductor body or wafer or substrate) are formed.

In some embodiments, the sidewalls of at least one such segment or region or area, of the semiconductor body or wafer or substrate, are coated with a passivation material or a passivation coating; for example, to increase PV efficiency, and/or to reduce or prevent recombination, and/or to promote charge-carrier selectivity, and/or to prevent or reduce non-desired recombination of photogenerated electron-hole pairs, and/or to achieve other benefits.

In some embodiments, at least a part of a sidewall of at least one such segment or region or area, of the semiconductor body or wafer or substrate, is coated with an electrically insulative material or coating.

In some embodiments, at least a part of a sidewall of at least one such segment or region or area, of the semiconductor body or wafer or substrate, is coated with a compound that is produced by reacting the PV cell body material (or the semiconductor substrate or wafer) with a substance selected from the group consisting of: (a) oxygen, (b) ammonia, (c) nitrogen, (d) hydrogen, (e) argon, (f) a compound of two or more of said materials, (g) a mixture of two or more of said materials.

In some embodiments, each of the electrode contacts is connected to a separate flexible conductor, which interconnects corresponding electrode contacts on separate segments (or regions, or areas) of the semiconductor body or substrate or wafer or PV cell or PV device.

In some embodiments, the PV cell or PV device may further include a clear polymer laminate or lamination layer, located on a surface of said one side of each such segment or region or area of the semiconductor body or substrate or wafer or PV cell or PV device; and/or a clear top sheet and/or encapsulant having optical concentrators located above those segments or areas or regions of the semiconductor body or substrate or wafer that perform the generation of energy using the PV effect, and such concentrators may improve or increase the energy generation. In some embodiments, the optical concentrators are formed in said clear top sheet by embossing, chemical etching, micro-machining, laser ablation and/or other means, during or after said clear polymer laminate is affixed to said PV cell or PV device. In some embodiments, the optical concentrators are structured to direct sunlight or ambient light from an optimized inclination angle to an active area of a respective segment (or area, or region) of the semiconductor body or wafer or substrate or PV cell or PV device, by redirecting or steering or focusing or otherwise directing light headed towards one or more non-active parts (or portions, or areas, or side-walls, or regions) of the same or nearby segment (or region, or area) of the semiconductor body or wafer or substrate or PV cell or PV device.

In some embodiments, each segment or region or area of the semiconductor body or wafer or substrate (or PV cell, or PV device) comprises at least: a first electrode contact located under each such segment or area of region the semiconductor body or wafer or substrate; a second electrode contact located above each such segment or area or region of the semiconductor body or wafer or substrate, wherein each electrode contact is electrically connected to a different side of a PN junction within its respective segment (or area, or region) of the semiconductor body or wafer or substrate.

Some embodiments provide a single PV cell or a single PV device or a single PV article, that is comprised of a single semiconductor substrate or a single semiconductor wafer or a single semiconductor body; which is monolithic, e.g., is currently, and has been, a single item or a single article or a single component that was formed and remained a single component; and is not formed as a collection or two or more separate units or as a collection of two or more singulated or entirely-separated or entirely-discrete or entirely-gapped units that were arranged or placed together in proximity to each other yet onto a metal foil or onto a metal film or onto a flexible or elastic foil or film.

In some embodiments, the single PV cell or single PV device or single PV article is not a collection and is not an arrangement and is not an assembly of multiple discrete PV cells or of multiple discrete PV micro-cells, that each one of them has its own discrete and fully separated semiconductor substrate and/or its own discrete and fully separated semiconductor wafer and/or its own discrete and fully separated semiconductor body, and that have been merely placed to assembled or arranged together (or mounted together, or connected together) onto or beneath a flexible foil or a flexible film; but rather, the single PV cell or single PV device or single PV article has a single unified semiconductor substrate or semiconductor body or semiconductor wafer that is common to, and is shared by, all the regions or areas or portions of that single PV cell which includes therein (in that unified single semiconductor substrate or wafer or body) those craters or gaps or "blind gaps" or non-transcending gaps that penetrate only from one side (and not from both sides), which do not reach all the way through and do not reach all the way to the other side of the unified single semiconductor substrate or wafer or body.

In accordance with some embodiments, the flexible PV cell or PV device may be, or may include, a mono-crystalline PV cell or solar panel or solar device, a poly-crystalline PV cell or solar panel or solar device, a flexible PV cell or PV device that is an Interdigitated Back Contact (IBC) solar cell having said semiconductor wafer with said set of non-transcending gaps, and/or other suitable type of PV cell or PV device.

Some portions of the discussion above and/or herein may relate to regions or segments or areas, of the semiconductor body or substrate or wafer (or PV cell, or PV device); yet those "segments" are still touching each other and/or inherently connected to each other and/or non-separated from each other, as those "segments" are still connected by at least a thin portion or a thin bottom-side surface of the semiconductor substrate (or wafer, or body), which still holds and includes at least 1 (or at least 2, or at least 3, or at least 5, or at least 10, or at least 15, or at least 20, or at least 25, or at least 33; but not more than 50, or not more than 40) percent of the entire depth or the entire thickness (or the maximum thickness or depth) of the semiconductor substrate or body or wafer; as those "segments" are still connected at their base through such thin layer, and those "segments" have between them (or among them) the non-transcending gaps or the "blind gaps" or the craters that thus separate those "segments" but that do not fully divide or fully break or fully isolate any two such neighboring "segments" from each other.

Some embodiments provide a method of producing or manufacturing a flexible and/or rollable and/or bendable Photovoltaic (PV) cell or PV device, having enhanced properties of mechanical impact absorption and/or shock absorption and/or mechanical force dissipation and/or resilience to mechanical shocks. The method may include, producing or obtaining or receiving a semiconductor body or substrate or wafer, comprised at least partially of a semiconductor material or substrate or wafer with a form-factor that includes a top surface, a bottom surface, and at least one sidewall. The method further includes: producing or making a set of non-transcending gaps within said semiconductor body of said semiconductor material, by cutting or grooving or dicing or etching or scratching or cutting-out or laser-cutting or laser-etching or other suitable operations; wherein portions of semiconductor material on opposite sides of a respective non-transcending gap become movable relative to one another while a thin layer of said semiconductor body of said semiconductor material remains beneath said non-transcending gaps and is sufficiently thin to flex, and due to physical displacement dissipate mechanical stresses and absorb mechanical impacts applied to said semiconductor body; such that the method comprises producing said set of non-transcending gaps within said semiconductor body which acts or operates as crack propagation inhibitor and provides mechanical shock resilience to the PV cell; and such that the method produces said PV cell which is flexible and rollable, and is freestanding and carrier-less and non-supported, and has enhanced properties of mechanical impact absorption and/or mechanical shock dissipation and/or mechanical resilience, due to having said set of non-transcending gaps in the semiconductor material; wherein said flexible and rollable PV cell is comprised of a single semiconductor substrate which is segmented into segments by said set of non-transcending gaps which are placed only at one side of the semiconductor body, and wherein the method comprises placing or grooving or drilling or making or causing said set of non-transcending gaps only at one side (e.g., the top side, or the sun-facing or light-facing side, or the sunlight-absorbing side or the light-absorbing side) of the semiconductor body or substrate or wafer; and the method does not include, or the method excludes or avoids, production of similar to other gaps or craters on the other side or within the other side; and the method does not include, or the method excludes or avoids, singulating or dividing or breaking or entirely separating a single semiconductor substrate or wafer or body into two (or more)

pieces or discrete singulated regions that are entirely separated from each via an entire space that follows along the entire depth (or height) of the semiconductor substrate or wafer or wafer. The method may further include: placing or filling or coating or injecting or adding or depositing, a gap filler material having force absorption properties and/or material toughening properties, into those non-transcending gaps, and thus providing mechanical shock absorption, wherein said gap filler material is formed of a material that provides chemical durability and/or thermal durability and/or mechanical durability.

In some embodiments, the non-transcending gaps or the "blind gaps" or craters or slits or grooves, are introduced and are formed only at a first side or at a first surface of the semiconductor substrate or body or wafer, and are not formed at both of the opposite surfaces (or sides) thereof.

In some embodiments, the non-transcending gaps or the "blind gaps" or craters or slits or grooves, are introduced and are formed only at a first side or at a first surface of the semiconductor substrate or body or wafer, that is intended to face the sunlight or the light, or that is the active side of the PV device or PV cell, or that is intended to be the active side of the PV device or PV cell, or that is intended to be the electricity-generating side or surface that would generated electricity based on incoming sunlight or light or based on the PV effect; and they are not formed at the other (e.g., opposite, non-active) side or surface (e.g., the side that is not intended to be facing the sunlight or the light, or the side that is not intended to be producing electricity based on the PV effect).

In other embodiments, the non-transcending gaps or the "blind gaps" or craters or slits or grooves, are not introduced and are not formed at the side or surface of the semiconductor substrate or body or wafer, that is intended to face the sunlight or the light, or that is the active side of the PV device or PV cell, or that is intended to be the active side of the PV device or PV cell, or that is intended to be the electricity-generating side or surface that would generated electricity based on incoming sunlight or light or based on the PV effect; but rather, those non-transcending gaps or the "blind gaps" or craters or slits or grooves are formed at the other (e.g., opposite, non-active) side or surface, which is the side that is not intended to be facing the sunlight or the light, or the side that is not intended to be producing electricity based on the PV effect. Some implementations with this structure may advantageously provide the mechanical shock absorption and the mechanical forces dissipation capability, yet may also provide or maintain or achieve an increased level of PV-based electricity production since the gaps do not reduce the area of the light-exposed side or the light-facing side of the PV device.

In still other embodiments, the non-transcending gaps or the "blind gaps" or craters or slits or grooves, are introduced and are formed at both sides or at both surfaces of the semiconductor substrate or body or wafer; yet with an offset among the gaps of the first side and the gaps of the second side, in a zig-zag pattern of those gaps which zig-zag across the two sides of the semiconductor wafer or substrate or body; for example, a first gap located at the top surface on the left; then, a second gap located at the bottom surface to the right side of the first gap and not overlapping at all with the first gap; then, a third gap located at the top surface to the right side of the second gap and not overlapping at all with the second gap; then, a fourth gap located at the bottom surface to the right side of the third gap and not overlapping at all with the third gap; and so forth. In such structure, for example, any single point or any single location or any single region of the remaining semiconductor wafer or substrate or wafer, may have a gap or a crater or a "blind gap" only on one of its two sides, but not on both of its sides.

In yet other embodiments, the non-transcending gaps or the "blind gaps" or craters or slits or grooves, are introduced and are formed at both sides or at both surfaces of the semiconductor substrate or body or wafer; not necessarily with an offset among the gaps of the first side and the gaps of the second side, and not necessarily in a zig-zag pattern; but rather, by implementing any other suitable structure or pattern that still provides the mechanical shock resilience, and while also maintaining a sufficiently-thin layer of semiconductor substrate or body or wafer that is not removed and that is resilient to mechanical shocks and mechanical forces due to the craters or gaps that surround it.

Some embodiments include a flexible and/or rollable and/or foldable and/or bendable photovoltaic (PV) cell, having enhanced properties of mechanical impact absorption, the PV cell comprising: a semiconductor wafer that is freestanding and carrier-less, having a thickness, and having a first surface, and a having second surface that is opposite to said first surface; a set of non-transcending gaps, within said semiconductor wafer, wherein each non-transcending gap penetrates from the first surface of said semiconductor wafer towards the second surface of said semiconductor wafer but reaches to a depth of between 80 to 99 percent (or, between 85 to 99 percent; or, between 88 to 99 percent; or, between 90 to 99 percent; or, between 92 to 99 percent; or, between 95 to 99 percent) of the thickness of the semiconductor wafer, and does not reach said second surface; wherein each non-transcending gap does not entirely penetrate through an entirety of the thickness of said semiconductor wafer, wherein said semiconductor wafer maintains at least 1 percent of the thickness of the semiconductor wafer as an intact and non-penetrated thin layer of semiconductor wafer that remains intact and non-penetrated by said non-transcending gaps, wherein said intact and non-penetrated thin layer of semiconductor wafer absorbs and dissipates mechanical forces.

In some embodiments, each non-transcending gap is entirely filled with one or more filler materials that absorb mechanical shocks.

In some embodiments, between 50 percent and 99 percent of a volume of each non-transcending gap, is filled with one or more filler materials that absorb mechanical shocks.

In some embodiments, between 1 percent and 50 percent of a volume of each non-transcending gap, is filled with one or more filler materials that absorb mechanical shocks.

In some embodiments, said flexible PV cell is an integrated part of a vehicular roof or a vehicular body part. In some embodiments, said flexible PV cell is an integrated part of: a marine vessel roof, or a marine vessel body part. In some embodiments, said flexible PV cell is an integrated part of a floating solar device. In some embodiments, said flexible PV cell is an integrated part of a device selected from the group consisting of: a drone, an aircraft, an aircraft body part, a satellite, a spaceship, a spacecraft, a military device, a military vehicle, a tank, an Armored Personnel Carrier (APC), a military aircraft, a military marine vessel. In some embodiments, said flexible PV cell is an integrated part of a building solar roof or a PV-capable shingle. In some embodiments, said flexible PV cell is an integrated part of: a helmet, or a wearable product, or a solar device that provides power to portable devices of hikers.

In some embodiments, said first surface is at a first side of the flexible PV cell that faces a light source and that generates electricity from light using a photovoltaic effect;

wherein said second surface is at a second, opposite, side of the flexible PV cell which does not face the light source and which does not generate electricity from light; wherein each non-transcending gap penetrates from said first side towards, but not reaching, said second side; wherein each non-transcending gap reaches to a depth of between 80 to 99 percent of the distance between said first surface and said second surface.

In some embodiments, said first surface is at a first side of the flexible PV cell that does not face a light source and which does not generate electricity from light; wherein said second surface is at a second, opposite, side of the flexible PV cell which faces a light source and which generates electricity from light using a photovoltaic effect; wherein each non-transcending gap penetrates from said first side towards, but not reaching, said second side; wherein each non-transcending gap reaches to a depth of between 80 to 99 percent of the distance between said first surface and said second surface.

In some embodiments, said flexible PV cell is an Interdigitated Back Contact (IBC) solar cell having said semiconductor wafer with said set of non-transcending gaps.

In some embodiments, said flexible PV cell is integrated using a process selected from: an injection molding process, a compression molding process, an autoclave process, a wet layup process, a roto-molding process, a blow-molding process, a Resin Transfer Molding (RTM) process, a thermoforming process, a Sheet Molding Process (SMC), a Prepreg Compression Molding (PCM) process, a vacuum forming process, a reactive injection molding process, a calendering process, a batch lamination process, a semi-continuous lamination process, a continuous lamination process, a roll-to-roll lamination process, a double-belt lamination process.

In some embodiments, a method comprises: manufacturing a flexible and/or rollable and/or foldable and/or bendable photovoltaic (PV) cell having enhanced properties of mechanical impact absorption, by performing: (a) producing a semiconductor wafer that is freestanding and carrier-less, having a thickness, and having a first surface, and having a second surface that is opposite to said first surface; (b) producing a set of non-transcending gaps, within said semiconductor wafer, by making each non-transcending gap penetrate from the first surface of said semiconductor wafer towards the second surface of said semiconductor wafer, reaching to a depth of between 80 to 99 percent of the thickness of the semiconductor wafer, and not reaching said second surface; and by preventing each non-transcending gap from entirely penetrating through an entirety of the thickness of said semiconductor wafer, and by maintaining at least 1 percent of the thickness of the semiconductor wafer as an intact and non-penetrated thin layer of semiconductor wafer that remains intact and non-penetrated by said non-transcending gaps; wherein said intact and non-penetrated thin layer of semiconductor wafer absorbs and dissipates mechanical forces.

In some embodiments, the method comprises: entirely filling each of the non-transcending gaps, with one or more filler materials that absorb mechanical shocks.

In some embodiments, the method comprises: partially filling, at least 50 percent of a volume of each of the non-transcending gaps, with one or more filler materials that absorb mechanical shocks.

In some embodiments, the method comprises: partially filling, not more than 50 percent of a volume of each of the non-transcending gaps, with one or more filler materials that absorb mechanical shocks.

In some embodiments, the method comprises: entirely filling each of the non-transcending gaps, with one or more filler materials that provide thermal durability to said semiconductor wafer.

In some embodiments, the method comprises: partially filling, at least 50 percent of a volume of each of the non-transcending gaps, with one or more filler materials that provide thermal durability to said semiconductor wafer.

In some embodiments, the method comprises: partially filling, not more than 50 percent of a volume of each of the non-transcending gaps, with one or more filler materials provide thermal durability to said semiconductor wafer.

The terms "plurality" and "a plurality", as used herein, include, for example, "multiple" or "two or more". For example, "a plurality of items" includes two or more items.

References to "one embodiment", "an embodiment", "demonstrative embodiment", "various embodiments", "some embodiments", and/or similar terms, may indicate that the embodiment(s) so described may optionally include a particular feature, structure, or characteristic, but not every embodiment necessarily includes the particular feature, structure, or characteristic. Furthermore, repeated use of the phrase "in one embodiment" does not necessarily refer to the same embodiment, although it may. Similarly, repeated use of the phrase "in some embodiments" does not necessarily refer to the same set or group of embodiments, although it may.

As used herein, and unless otherwise specified, the utilization of ordinal adjectives such as "first", "second", "third", "fourth", and so forth, to describe an item or an object, merely indicates that different instances of such like items or objects are being referred to; and does not intend to imply as if the items or objects so described must be in a particular given sequence, either temporally, spatially, in ranking, or in any other ordering manner.

Functions, operations, components and/or features described herein with reference to one or more embodiments of the present invention, may be combined with, or may be utilized in combination with, one or more other functions, operations, components and/or features described herein with reference to one or more other embodiments of the present invention. The present invention may thus comprise any possible or suitable combinations, re-arrangements, assembly, re-assembly, or other utilization of some or all of the modules or functions or components that are described herein, even if they are discussed in different locations or different chapters of the above discussion, or even if they are shown across different drawings or multiple drawings.

While certain features of some demonstrative embodiments of the present invention have been illustrated and described herein, various modifications, substitutions, changes, and equivalents may occur to those skilled in the art. Accordingly, the claims are intended to cover all such modifications, substitutions, changes, and equivalents.

What is claimed is:

1. A flexible photovoltaic (PV) cell having enhanced properties of mechanical impact absorption, the PV cell comprising:
    a semiconductor wafer that is freestanding and carrier-less,
    having a thickness, and having a first surface, and a having second surface that is opposite to said first surface;
    a set of non-transcending gaps, within said semiconductor wafer,
    wherein each non-transcending gap penetrates from the first surface of said semiconductor wafer towards the second surface of said semiconductor wafer but reaches to a depth of between 80 to 99 percent of the thickness of the semiconductor wafer, and does not reach said second surface;

wherein each non-transcending gap does not entirely penetrate through an entirety of the thickness of said semiconductor wafer, wherein said semiconductor wafer maintains at least 1 percent of the thickness of the semiconductor wafer as an intact and non-penetrated thin layer of semiconductor wafer that remains intact and non-penetrated by said non-transcending gaps, wherein said intact and non-penetrated thin layer of semiconductor wafer absorbs and dissipates mechanical forces, wherein each non-transcending gap is entirely filled with an elastomer that absorbs mechanical shocks and dissipates mechanical forces.

2. The flexible PV cell of claim 1,
wherein said flexible PV cell is an integrated part of a floating solar device.

3. The flexible PV cell of claim 1,
wherein said first surface is at a first side of the flexible PV cell that does not face a light source and which does not generate electricity from light;
wherein said second surface is at a second, opposite, side of the flexible PV cell which faces a light source and which generates electricity from light using a photovoltaic effect;
wherein each non-transcending gap penetrates from said first side towards, but not reaching, said second side;
wherein each non-transcending gap reaches to a depth of between 80 to 99 percent of the distance between said first surface and said second surface.

4. The flexible PV cell of claim 1,
wherein said flexible PV cell is integrated using a process selected from:
an injection molding process,
a compression molding process,
an autoclave process,
a wet layup process,
a roto-molding process,
a blow-molding process,
a Resin Transfer Molding (RTM) process,
a thermoforming process,
a Sheet Molding Process (SMC),
a Prepreg Compression Molding (PCM) process,
a vacuum forming process,
a reactive injection molding process,
a calendering process,
a batch lamination process,
a semi-continuous lamination process,
a continuous lamination process,
a roll-to-roll lamination process,
a double-belt lamination process.

5. A method comprising:
manufacturing a flexible photovoltaic (PV) cell having enhanced properties of mechanical impact absorption, by performing:
(a) producing a semiconductor wafer that is freestanding and carrier-less,
having a thickness, and having a first surface, and having a second surface that is opposite to said first surface;
(b) producing a set of non-transcending gaps, within said semiconductor wafer,
by making each non-transcending gap penetrate from the first surface of said semiconductor wafer towards the second surface of said semiconductor wafer, reaching to a depth of between 80 to 99 percent of the thickness of the semiconductor wafer, and not reaching said second surface;
and by preventing each non-transcending gap from entirely penetrating through an entirety of the thickness of said semiconductor wafer,
and by maintaining at least 1 percent of the thickness of the semiconductor wafer as an intact and non-penetrated thin layer of semiconductor wafer that remains intact and non-penetrated by said non-transcending gaps,
wherein said intact and non-penetrated thin layer of semiconductor wafer absorbs and dissipates mechanical forces,
entirely filling each non-transcending gap with an elastomer that further absorbs mechanical shocks and dissipates mechanical forces.

6. The method of claim 5, further comprising:
(c) entirely filling each of the non-transcending gaps, with one or more filler materials that provide thermal durability to said semiconductor wafer.

7. The method of claim 5,
wherein said manufacturing comprises manufacturing said flexible photovoltaic (PV) cell which is an integrated part of a floating solar device.

8. The method of claim 5,
wherein said flexible PV cell is integrated using a process selected from:
an injection molding process,
a compression molding process,
an autoclave process,
a wet layup process,
a roto-molding process,
a blow-molding process,
a Resin Transfer Molding (RTM) process,
a thermoforming process,
a Sheet Molding Process (SMC),
a Prepreg Compression Molding (PCM) process,
a vacuum forming process,
a reactive injection molding process,
a calendering process,
a batch lamination process,
a semi-continuous lamination process,
a continuous lamination process,
a roll-to-roll lamination process,
a double-belt lamination process.

9. Method of claim 5,
wherein said first surface is at a first side of the flexible PV cell that does not face a light source and which does not generate electricity from light;
wherein said second surface is at a second, opposite, side of the flexible PV cell which faces a light source and which generates electricity from light using a photovoltaic effect;
wherein each non-transcending gap penetrates from said first side towards, but not reaching, said second side;
wherein each non-transcending gap reaches to a depth of between 80 to 99 percent of the distance between said first surface and said second surface.

10. The flexible PV cell of claim 1,
wherein said elastomer, that entirely fills said non-transcending gap, and that absorbs mechanical shocks and dissipates mechanical forces, comprises Ethylene-Vinyl Acetate (EVA).

11. The flexible PV cell of claim 1,
wherein said elastomer, that entirely fills said non-transcending gap, and that absorbs mechanical shocks and dissipates mechanical forces, comprises High-Impact Polystyrene (HIPS).

12. The flexible PV cell of claim 1,
wherein said elastomer, that entirely fills said non-transcending gap, and that absorbs mechanical shocks and dissipates mechanical forces, comprises a block copolymer of polystyrene-polybutadiene.

13. The flexible PV cell of claim 1,
wherein said elastomer, that entirely fills said non-transcending gap, and that absorbs mechanical shocks and dissipates mechanical forces, comprises a block copolymer of polystyrene-polyisoprene.

14. The flexible PV cell of claim 1,
wherein said elastomer, that entirely fills said non-transcending gap, and that absorbs mechanical shocks and dissipates mechanical forces, comprises polybutadiene neoprene.

15. The flexible PV cell of claim 1,
wherein said elastomer, that entirely fills said non-transcending gap, and that absorbs mechanical shocks and dissipates mechanical forces, comprises polyol.

16. The flexible PV cell of claim 1,
wherein said elastomer, that entirely fills said non-transcending gap, and that absorbs mechanical shocks and dissipates mechanical forces, improves a capability of the flexible PV cell to assume a non-planar structure.

17. The flexible PV cell of claim 1,
wherein a Specific Weight of an entirety of the flexible PV cell is smaller than one,
wherein the flexible PV cell autonomously floats on water.

18. The flexible PV cell of claim 1,
wherein the flexible PV cell is part of an article selected from the group consisting of:
a roof, a roof shingle, a wall, a vehicle, an aircraft, a drone, a boat.

* * * * *